United States Patent
Sakaguchi et al.

(10) Patent No.: US 10,370,573 B2
(45) Date of Patent: Aug. 6, 2019

(54) EASILY DEFORMABLE AGGREGATE AND METHOD FOR MANUFACTURING SAME, THERMALLY CONDUCTIVE RESIN COMPOSITION, THERMALLY CONDUCTIVE MEMBER AND METHOD FOR MANUFACTURING SAME, AND THERMALLY CONDUCTIVE ADHESIVE SHEET

(71) Applicant: TOYO INK SC HOLDINGS CO., LTD., Tokyo (JP)

(72) Inventors: Kaori Sakaguchi, Tokyo (JP); Taiki Sakamoto, Tokyo (JP); Atsushi Nakazato, Tokyo (JP); Takanori Itoh, Tokyo (JP); Takahiro Matsuzawa, Tokyo (JP); Daisuke Kishi, Tokyo (JP)

(73) Assignee: TOYO INK SC HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/403,122

(22) PCT Filed: May 17, 2013

(86) PCT No.: PCT/JP2013/003143
§ 371 (c)(1),
(2) Date: Nov. 21, 2014

(87) PCT Pub. No.: WO2013/175744
PCT Pub. Date: Nov. 28, 2013

(65) Prior Publication Data
US 2015/0110985 A1   Apr. 23, 2015

(30) Foreign Application Priority Data

May 21, 2012 (JP) .................. 2012-115821
Jun. 29, 2012 (JP) .................. 2012-146424

(Continued)

(51) Int. Cl.
*C09K 5/14* (2006.01)
*H01L 23/373* (2006.01)
(Continued)

(52) U.S. Cl.
CPC .............. *C09K 5/14* (2013.01); *C01B 21/064* (2013.01); *C01B 21/072* (2013.01); *C09J 7/00* (2013.01);
(Continued)

(58) Field of Classification Search
CPC ...... C08K 3/0041; C09K 5/14; H01L 23/3737
See application file for complete search history.

(56) References Cited

U.S. PATENT DOCUMENTS 5,213,868 A * 5/1993 Liberty ................. H01L 23/367
257/712
5,510,174 A * 4/1996 Litman .................... C08K 3/38
428/343

(Continued)

FOREIGN PATENT DOCUMENTS

JP   H06162855   6/1994
JP   H0959426    3/1997
(Continued)

*Primary Examiner* — Victor S Chang
(74) *Attorney, Agent, or Firm* — Seyfarth Shaw LLP

(57) ABSTRACT

An object of the present invention is to provide a thermal conductivity-giving material capable of giving substantially the same level of a thermal conductivity as that of the conventional material by using a smaller amount thereof than that conventionally used or giving a higher thermal conductivity than that of the conventional material by using substantially the same amount thereof as that conventionally used. The aforementioned problem can be solved by an easily deformable aggregate (D) comprising 100 pts·mass of thermally conductive particles (A) having an average primary particle diameter of 0.1 to 10 μm, and 0.1 to 30 pts·mass of an organic binding agent (B), in which the easily (Continued)

deformable aggregate (D) has an average particle diameter of 2 to 100 μm, and an average compressive force required for a 10% compressive deformation rate is 5 mN or lower.

5 Claims, 3 Drawing Sheets

(30) Foreign Application Priority Data

| Jul. 13, 2012 | (JP) | 2012-157086 |
|---|---|---|
| Feb. 26, 2013 | (JP) | 2013-036098 |
| Apr. 8, 2013 | (JP) | 2013-080059 |

(51) Int. Cl.

| *C01B 21/064* | (2006.01) |
|---|---|
| *C01B 21/072* | (2006.01) |
| *C09J 7/00* | (2018.01) |
| *C09J 9/00* | (2006.01) |
| *C09J 11/04* | (2006.01) |
| *C08K 9/08* | (2006.01) |
| *C08K 7/18* | (2006.01) |

(52) U.S. Cl.
CPC ............... *C09J 9/00* (2013.01); *C09J 11/04* (2013.01); *H01L 23/3737* (2013.01); *C08K 7/18* (2013.01); *C08K 9/08* (2013.01); *C09J 2205/102* (2013.01); *H01L 23/373* (2013.01); *H01L 23/3731* (2013.01); *H01L 2924/0002* (2013.01); *Y10T 428/1405* (2015.01); *Y10T 428/2982* (2015.01)

(56) References Cited

U.S. PATENT DOCUMENTS

| 2001/0026863 | A1 | 10/2001 | Hirano et al. |
| 2005/0224985 | A1* | 10/2005 | Japp .............. H01L 23/145 257/762 |
| 2008/0102266 | A1 | 5/2008 | Nakatsuka et al. |

FOREIGN PATENT DOCUMENTS

| JP | 2000-239542 | 9/2000 | |
| JP | 2004-217861 | 8/2004 | |
| JP | 2006-206393 | 8/2006 | |
| JP | 2006-256940 | 9/2006 | |
| JP | 2006-335957 | 12/2006 | |
| JP | 2006-342192 | 12/2006 | |
| JP | 2007-039306 | 2/2007 | |
| JP | 2007-332224 | 12/2007 | |
| JP | 2008-510878 | 4/2008 | |
| JP | 2009-249226 | 10/2009 | |
| JP | 2010-084072 | 4/2010 | |
| JP | 2010-157563 | 7/2010 | |
| WO | WO 00/44823 | 8/2000 | |
| WO | WO 2005052218 A1 * | 6/2005 | ........... C04B 35/532 |
| WO | WO 2006/023860 | 3/2006 | |

* cited by examiner

EASILY DEFORMABLE AGGREGATE AND METHOD FOR MANUFACTURING SAME, THERMALLY CONDUCTIVE RESIN COMPOSITION, THERMALLY CONDUCTIVE MEMBER AND METHOD FOR MANUFACTURING SAME, AND THERMALLY CONDUCTIVE ADHESIVE SHEET

This application is a U.S. National Stage of PCT/JP2013/003143, filed May 17, 2013, which claims priority to Japanese Patent Application No. 2012-115821, filed May 21, 2012, and Japanese Patent Application No. 2012-146424, filed Jun. 29, 2012, and Japanese Patent Application No. 2012-157086, filed Jul. 13, 2012, and Japanese Patent Application No. 2013-036098, filed Feb. 26, 2013, and Japanese Patent Application No. 2013-080059, filed Apr. 8, 2013, the disclosures of each of which are incorporated herein by reference in its entirety.

TECHNICAL FIELD

The present invention relates to an easily deformable aggregate having a thermal conductivity and a method for manufacturing the same, a thermally conductive resin composition including the easily deformable aggregate, a thermally conductive member manufactured by using the thermally conductive resin composition and a method for manufacturing the same, and a thermally conductive adhesive sheet.

BACKGROUND ART

In recent years, there have been remarkable developments in the electronics field. In particular, in electronic apparatuses, reduction in size, reduction in weight, increase in density, and increase in output have been advanced. As a result, the demands for these properties and performance have been increasingly growing. It has been desired to increase the high electrical-insulation reliability of electronic circuits and reduce electronic circuits in size in order to increase the density thereof. Further, it has been strongly desired to improve the heat radiation property of electronic apparatuses in order to prevent the degradation thereof caused by increased heat generated in the electronic apparatuses resulting from the increase in output thereof.

In the electronics field, polymeric materials are suitably used as electrically-insulating materials. Therefore, it has been desired to improve the thermal conductivity of such polymeric materials in order to improve the heat radiation property of electronic apparatuses. Although there is a limit to how much the thermal conductivity (heat radiation property) of polymeric materials can be improved, the thermal conductivity (heat radiation property) can be improved further by mixing thermally conductive particles in the polymeric materials. Such materials can be used for adhesive sheets having a thermal conductivity or thermally conductive members and the like such as pressure-sensitive adhesive sheets and the like.

For example, Patent Literature 1 discloses a resin for molding that contains a nano-composite polyamide resin in which a layered silicate is uniformly dispersed, and a thermally conductive inorganic filler. Examples of the thermally conductive inorganic filler include alumina, magnesium oxides, silica, zinc oxides, boron nitrides, silicon carbides, and silicon nitrides.

It has been desired to improve the thermal conductivity of a thermally conductive inorganic filler so that a thermal conductivity is given to a molded object by using a smaller amount of the thermally conductive inorganic filler than that has been conventionally used.

Patent Literature 2 discloses a method for obtaining spherical composite particles having an average particle diameter of 3 to 85 μm and having an improved thermal conductivity by granulating and sintering highly thermally conductive particles having an average particle diameter of 10 μm or smaller.

Specifically, Patent Literature 2 proposes a method for obtaining spherical composite particles in which thermally conductive particles such as alumina, an aluminum nitride, or crystalline silica are coated with a silane coupling agent or a thermosetting resin, and then the coated thermally conductive particles are sintered at a temperature close to the melting point of the thermally conductive particles, i.e., a temperature equal to or higher than 800° C. and preferably at 1000 to 2,800° C. (see paragraphs [0009], [0021]-[0022] and [0028]-[0032]).

It is mentioned in Patent Literature 2 that the composite particles are sintered in order to increase the cohesive force of the composite particles. However, since the thermally conductive particles are sintered at a temperature close to the melting point of the thermally conductive particles after the granulating process, the binder used in the granulating process disappears. Consequently, the cohesive force of the composite particles is not high after the sintering. In other words, the composite particles are fragile and cannot maintain their granulated state after the sintering, and are easily disintegrated.

If the thermally conductive particles are sintered at a temperature sufficiently higher than the melting point, the thermally conductive particles are fused and integrated with each other and composite particles having a high cohesive force can be obtained. However, as a result of the fusion and integration, they become massive and hard particles.

Patent Literature 3 discloses a powder composite that includes an inorganic powder such as alumina, a magnesium oxide, a boron nitride, or an aluminum nitride, and a thermosetting resin composite, and is processed into a powder, a granulated powder, or granules. However, since the particle size of the used inorganic powder is large and the thermosetting resin composite is used, the resin is hardened in the aggregates. Therefore, a hard powder composite having strong bonding is obtained.

Patent Literature 4 discloses a method for producing an aluminum nitride in which a composite particle powder that is obtained by coating the surface of an alumina particle powder with a surface modification agent and making a carbon powder adhere to that surface is heated and sintered at 1350 to 1750° C. under a nitrogen atmosphere (see [Patent Claims], and paragraphs [0034], [0042] and [0046]-[0049]).

Patent Literature 5 discloses a sintered spherical aluminum nitride powder having an average particle diameter of 10 to 500 μm and a porosity of 0.3% or higher. Specifically, Patent Literature 5 discloses a method for producing a sintered spherical aluminum nitride powder in which a slurry including an aluminum nitride powder including a powder having a primary particle diameter of 0.1 to 0.8 μm in a concentration of 10 mass % or greater based on the total mass, and a sintering assisting agent such as a lithium oxide or a calcium oxide is sprayed and dried, and then sintered at 1,400 to 1,800° C. (see Claims 1 and 4, and paragraph [0035]).

Similarly to Patent Literature 2, since the powder is sintered at a high temperature and the sintering assisting agent or the like is strongly bonded with the aluminum nitride in Patent Literatures 4 and 5, aggregates of hard aluminum nitride particles, or sintered and integrated hard and massive aluminum nitride particles are obtained.

Patent Literature 6 discloses secondary aggregates obtained by agglomerating primary particles of a scale-like boron nitride in an isotropic manner.

Specifically, Patent Literature 6 discloses a method for obtaining secondary aggregates having a porosity of 50% or smaller and an average pore diameter of 0.05 to 3 μm in which scale-like boron nitride is pre-sintered around 1800° C. and then granules consisting of primary particles that are obtained by pulverizing the pre-sintered boron nitride are sintered at 2000° C. (see paragraphs [0014], [0026] and [0027]).

Patent Literature 7 discloses spherical boron nitride aggregates obtained by agglomerating irregularly-shaped non-spherical boron nitride particles.

Patent Literature 8 discloses a silicon nitride-based sintered body.

Patent Literature 9 discloses a sintered spherical zinc oxide particle powder.

Patent Literature 10 discloses a thermally conductive composite material obtained by combining boron nitride particles and carbon fibers.

However, as the demands for heat radiation have grown, conventional thermally conductive particles or their granulated body cannot meet such demands any longer.

Therefore, it has been desired to develop a thermal conductivity-giving material capable of giving substantially the same level of a thermal conductivity as that of the conventional material by using a smaller amount thereof than that conventionally used or giving a higher thermal conductivity than that of the conventional material by using substantially the same amount thereof as that conventionally used.

Meanwhile, as for the thermally conductive member using thermally conductive particles, Patent Literatures 11 and 12, for example, disclose thermally conductive adhesive sheets using inorganic particles. To increase the thermal conductivity of such thermally conductive members, it is effective to raise the filling rate of the particles. However, the amount of the polymer material decreases as the amount of the particles increases. Therefore, the film-forming property and the base-material following property deteriorate. When a thermally conductive member is used as an adhesive sheet, in particular, the amount of the adhesive component decreases as the filling rate increases. Therefore, the adhesiveness deteriorates.

Patent Literatures 13 and 14 disclose methods for controlling the orientation of particles by applying a magnetic field or an electric field to the thermally conductive member in order to form contacts (thermal conduction paths) among particles while keeping the filling rate of the particles at a low level. However, these methods are not practical in consideration of the industrialization.

Patent Literature 15 discloses a method for developing a high thermal conductivity with a low filling amount by disposing secondary particles adjacent to each other in a coating and thereby forming tertiary aggregates. In this literature, a silane coupling agent is used as a binding agent for the granulation. Although the operability of the granulated body is improved by drying the secondary particles at 150° C. for four hours or longer and thereby carrying out a coupling reaction, the softness of the particles decreases. Consequently, both the thermal conductivity and the adhesive strength are unsatisfactory.

As described above, it is very difficult to achieve the high thermal conductivity, the excellent film-forming property, and the base-material following property of the obtained film in the conventional thermally conductive particles or the thermally conductive resin composites using their secondary particles (aggregates).

Further, as for those used for adhesive sheets, it is also very difficult to achieve the high thermal conductivity, the excellent film-forming property, and the base-material following property and the adhesiveness of the obtained film in the conventional thermally conductive particles or the thermally conductive resin composites using their secondary particles (aggregates).

CITATION LIST

Patent Literature

Patent Literature 1: Japanese Unexamined Patent Application Publication No. 2006-342192
Patent Literature 2: Japanese Unexamined Patent Application Publication No. H9-59425
Patent Literature 3: Japanese Unexamined Patent Application Publication No. 2000-239542
Patent Literature 4: Japanese Unexamined Patent Application Publication No. 2006-256940
Patent Literature 5: Japanese Unexamined Patent Application Publication No. 2006-206393
Patent Literature 6: Japanese Unexamined Patent Application Publication No. 2010-157563
Patent Literature 7: Published Japanese Translation of PCT International Publication for Patent Application, No. 2008-510878
Patent Literature 8: Japanese Unexamined Patent Application Publication No. 2007-039306
Patent Literature 9: Japanese Unexamined Patent Application Publication No. 2009-249226
Patent Literature 10: International Patent Publication No. WO00/44823
Patent Literature 11: Japanese Unexamined Patent Application Publication No. H6-162855
Patent Literature 12: Japanese Unexamined Patent Application Publication No. 2004-217861
Patent Literature 13: Japanese Unexamined Patent Application Publication No. 2006-335957
Patent Literature 14: Japanese Unexamined Patent Application Publication No. 2007-332224
Patent Literature 15: Japanese Unexamined Patent Application Publication No. 2010-84072

SUMMARY OF INVENTION

Technical Problem

An object of the present invention is to provide a thermal conductivity-giving material capable of giving substantially the same level of a thermal conductivity as that of the conventional material by using a smaller amount thereof than that conventionally used or giving a higher thermal conductivity than that of the conventional material by using substantially the same amount thereof as that conventionally used.

Further, another object of the present invention is to provide a thermally conductive resin composite having a high thermal conductivity and an excellent film-forming property, and having an excellent base-material following property when the film is formed on the base-material.

Further, another object of the present invention is to provide a thermally conductive member having a high thermal conductivity.

Solution to Problem

The present invention relates to an aggregate that is obtained by agglomerating spherical thermally-conductive particles with an organic binding agent, and is easily deformed in response to a pressure but less likely to be disintegrated.

That is, the present invention relates to an easily deformable aggregate (D) that includes 100 pts·mass of thermally conductive particles (A) having an average primary particle diameter of 0.1 to 10 μm, and 0.1 to 30 pts·mass of an organic binding agent (B), in which the easily deformable aggregate (D) has an average particle diameter of 2 to 100 μm, and an average compressive force required for a 10% compressive deformation rate is 5 mN or lower.

Further, the present invention relates to a thermally conductive resin composite (G) containing 20 to 90 vol % of the above-described easily deformable aggregate (D), 10 to 80 vol % of a binder resin (E), and a solvent (F) that dissolves the binder resin (E).

Further, the present invention relates to a thermally conductive member (H) including a thermal conduction layer formed by removing the solvent (F) from the above-described thermally conductive resin composite (G).

Further, the present invention relates to a thermally conductive member (I) formed by applying a pressure on the above-described thermally conductive member (H).

Advantageous Effects of Invention

An easily deformable aggregate according to the present invention is a thermal conductivity-giving material capable of giving substantially the same level of a thermal conductivity as that of the conventional material by using a smaller amount thereof than that conventionally used or giving a higher thermal conductivity than that of the conventional material by using substantially the same amount thereof as that conventionally used.

DESCRIPTION OF EMBODIMENTS

"Easily Deformable Aggregate (D)"

An easily deformable aggregate (D) according to the present invention includes 100 pts·mass of thermally conductive particles (A) having an average primary particle diameter of 0.1 to 10 μm, and 0.1 to 30 pts·mass of an organic binding agent (B), in which the easily deformable aggregate (D) has an average particle diameter of 2 to 100 μm, and an average compressive force required for a 10% compressive deformation rate is 5 mN or lower.

The term "easily deformable" in the present application means that an average compressive force that is required for a 10% compressive deformation rate is equal to or smaller than 5 mN.

The phrase "average compressive force required for a 10% compressive deformation rate" means an average value of a load that is required for deforming particles by 10% as measured in a compression test. This value can be measured by using, for example, a micro compression tester (MCT-210 manufactured by Shimadzu Corporation).

Specifically, it can be measured as explained below.

A very small amount of a sample to be measured is magnified and observed by a microscope and one particle is arbitrarily chosen. This particle to be measured is moved below a pressurizing element. Then, a load is applied to the pressurizing element so that the particle to be measured is compressed and deformed. The tester includes a detector for measuring the compressive deformation of the particle to be measured above the pressurizing element. The compressive deformation of the particle to be measured is measured by the detector and its deformation rate is obtained. Then, the compressive force required to compress and deform the particle to be measured by 10% (hereinafter also referred to as "10% compressive deformation force") is obtained. The "10% compressive deformation force" is obtained for other arbitrarily-chosen particles to be measured in a similar manner. Then, the average value of the "10% compressive deformation forces" for ten particles to be measured is defined as an "average compressive force required for a 10% compressive deformation rate".

Note that easily deformable aggregates (D) according to the present invention are a substance in which a plurality of small thermally conductive particles (A) are agglomerated as described later. However, each aggregate is counted as one particle in the compressive deformation rate measurement.

Figure 2:
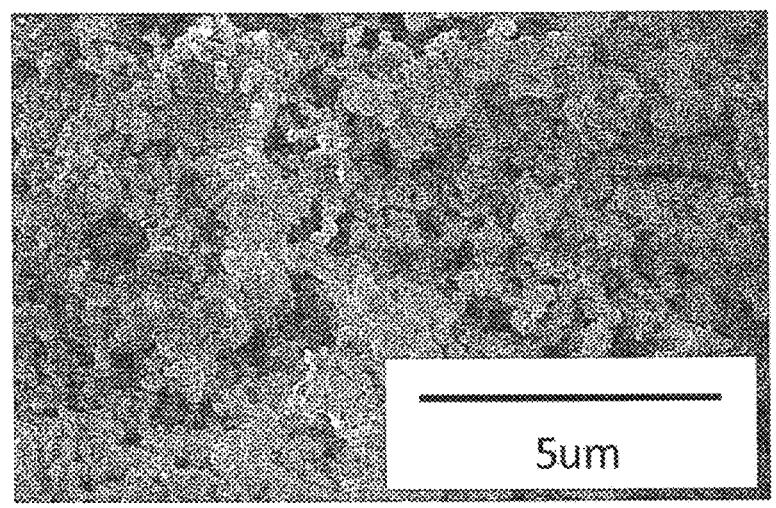
FIG. 2 is an example of an SEM photograph of thermally conductive particles (A) having an average primary particle diameter of 1 μm.
Figure 4:
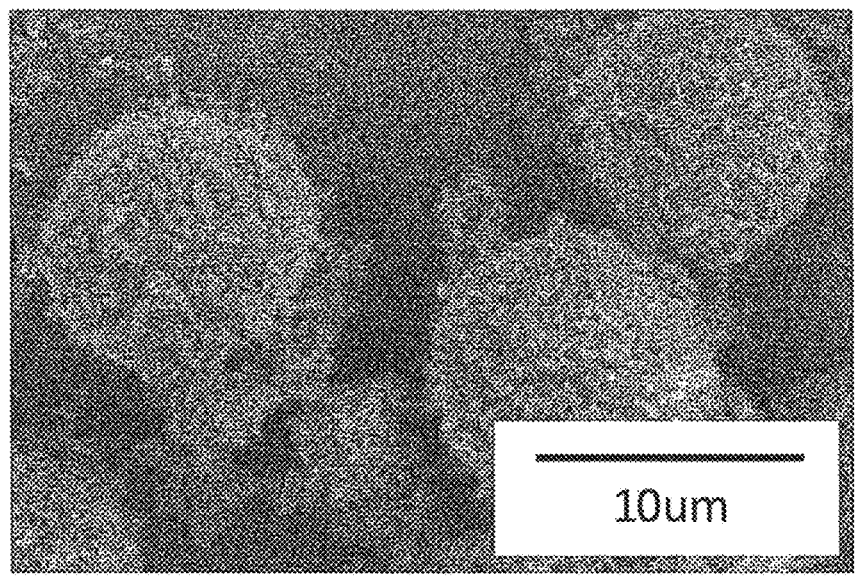
FIG. 4 is an example of an SEM photograph of thermally conductive particles (A) having an average primary particle diameter of 10 μm.

FIG. 2 is an example of an SEM photograph of thermally conductive particles (A) having an average primary particle diameter of 1 m. FIG. 4 is an example of an SEM photograph of thermally conductive particles (A) having an average primary particle diameter of 10 μm.

Figure 1:
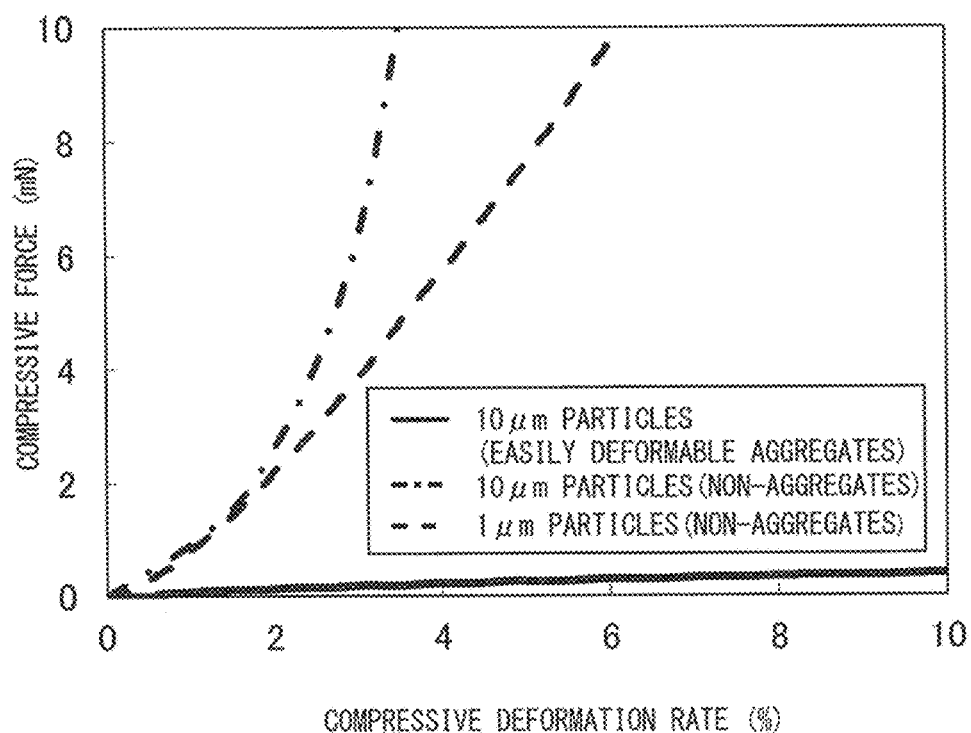
FIG. 1 is a graph showing a relation between compressive deformation rates and compressive forces of thermally conductive particles (A) having an average primary particle diameter of 1 μm, thermally conductive particles (A) having an average primary particle diameter of 10 μm, or easily deformable aggregates (D) having an average particle diameter of 10 μm obtained by agglomerating thermally conductive particles (A) having an average primary particle diameter of 1 μm by using an organic binding agent (B)

FIG. 1 is a graph showing relations between compressive deformation rates and compressive forces for non-agglomerated thermally conductive particles (A) shown in the SEM photographs of FIGS. 2 and 4, and easily deformable aggregates (D) having an average particle diameter of 10 μm obtained by agglomerating the thermally conductive particles (A) shown in the SEM photograph of FIG. 2. The size of the easily deformable aggregates (D) is roughly the same as that of the thermally conductive particles (A) shown in FIG. 4.

As shown in FIG. 1, the non-agglomerated thermally conductive particles (A) require a large force for a slight deformation. In contrast to this, when the thermally conductive particles (A) shown in FIG. 2 are agglomerated to roughly the same size as that of the thermally conductive particles (A) shown in FIG. 4, the agglomerated thermally conductive particles can be deformed by a much smaller force as shown in FIG. 1.

That is, the easily deformable aggregates (D) according to the present invention are "easily deformable".

Figure 3A:
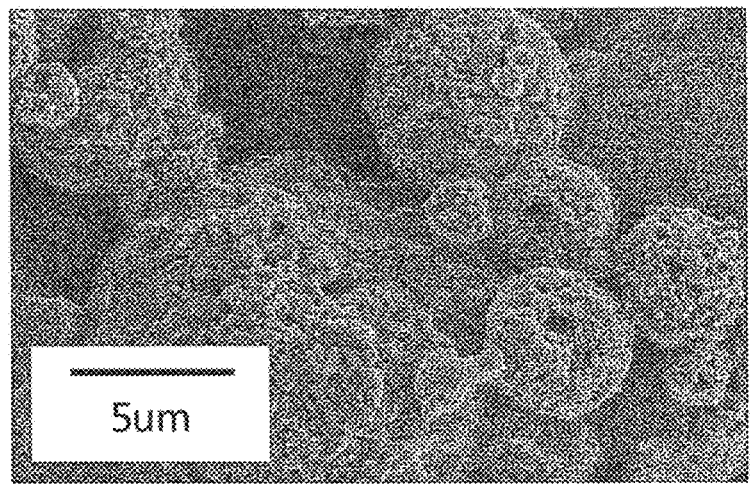
FIG. 3a is an example of an SEM plane photograph of a thermosetting sheet containing easily deformable aggregates (D) having an average particle diameter of 10 μm obtained by agglomerating thermally conductive particles (A) having an average primary particle diameter of 1 μm by using an organic binding agent (B)
Figure 3B:
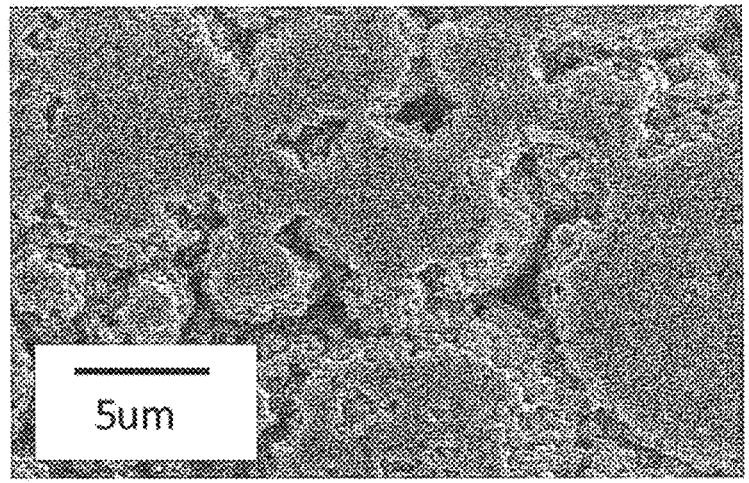
FIG. 3b is an example of an SEM plane photograph of a cured substance obtained by thermally curing the thermosetting sheet shown in FIG. 3a under pressure.

FIG. 3a is an example of an SEM plane photograph of a thermosetting sheet (thermally conductive member (H)) including easily deformable aggregates (D) having an average particle diameter of 10 μm obtained by agglomerating thermally conductive particles (A) having an average primary particle diameter of 1 μm by using an organic binding agent (B). FIG. 3b is an example of an SEM plane photograph of a cured substance obtained by thermally curing the thermosetting sheet shown in FIG. 3a under pressure, and FIG. 3c is an SEM cross-section photograph of the same cured substance.

Figure 3C:
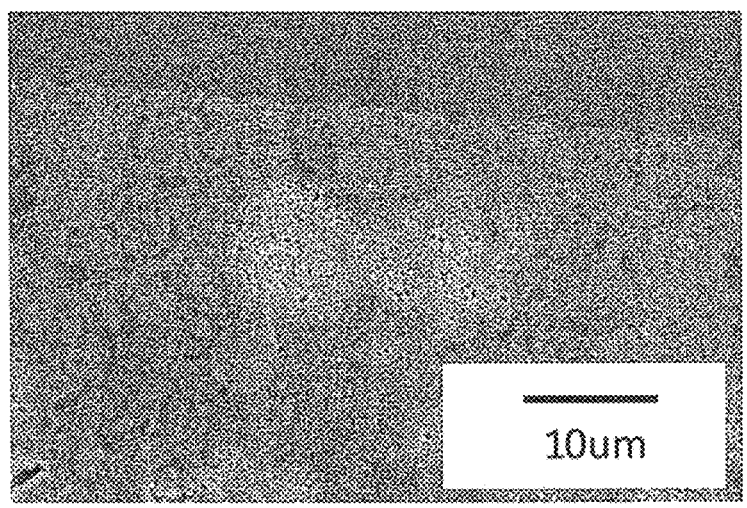
FIG. 3c is an example of an SEM cross-section photograph of a cured substance obtained by thermally curing a thermosetting sheet shown in FIG. 3a under pressure.

It can also be confirmed from FIGS. 3a to 3c that the easily deformable aggregates (D) according to the present invention are "easily deformable".

Note that the reason why the easily deformable aggregates (D) according to the present invention have an excellent thermal conductivity because of the fact that the easily deformable aggregates (D) are "easily deformable" will be described later.

(Thermally Conductive Particle (A))

The thermally conductive particles (A) are not restricted to any particular particles, provided that the particles have a thermal conductivity.

Examples of thermally conductive particles (A) include:
metal oxides such as an aluminum oxide, a calcium oxide, and a magnesium oxide;
metal nitrides such as an aluminum nitride and a boron nitride;
metal hydroxides such as an aluminum hydroxide and a magnesium hydroxide;
metal carbonates such as a calcium carbonate and a magnesium carbonate;
metal silicates such as a calcium silicate;
hydrated metal compounds;
crystalline silica, amorphous silica, a silicon carbide, and composites thereof;
metals such as gold and silver; and
carbon materials such as carbon black and graphene.

Only one of these substances may be used, or two or more of these substances may be used together.

When these substances are used for electric materials of electric circuits and the like, the thermally conductive particles (A) preferably have an electrical-insulation property. Therefore, metal oxides and metal nitrides are preferred materials. Among them, an aluminum oxide, an aluminum nitride, and a boron nitride are particularly preferable in view of the thermal conductivity.

When the obtained easily deformable aggregates (D) are used for electric materials and the like, an aluminum oxide, which is less likely to be hydrolyzed, is particularly preferable as the thermally conductive particles (A).

Further, when easily deformable aggregates (D) are obtained by using a metal nitride such as an aluminum nitride that is treated in advance to improve its hydrolysis-resistant property as the thermally conductive particles (A), the obtained easily deformable aggregates (D) can be used for electric materials and the like.

The shape of the thermally conductive particles (A) is not restricted to any particular shapes. Examples of the shape of the thermally conductive particles (A) include a spherical shape, an oblate spherical shape, a plate-shaped shape, a polygon, a scale-like shape, and an indefinite shape.

Thermally conductive particles (A) having two or more different shapes may be used together.

The thermally conductive particles (A) preferably have a spherical shape in view of the smaller (or fewer) voids in the obtained easily deformable aggregates (D) and the deformability thereof.

By using spherical particles, easily deformable aggregates (D) having small voids therein can be obtained. The voids in the easily deformable aggregates (D) deteriorate their thermal conductivity. Therefore, it is important to prevent the formation of voids as much as possible in order to improve the thermal conductivity.

Further, when the thermally conductive particles (A) have a spherical shape, the friction coefficient among particles of the thermally conductive particles (A) in the aggregates is small. As a result, when an external force is applied to the aggregates, the positional relations among the thermally conductive particles (A) in the aggregates are easily changed. Therefore, the aggregates can be easily deformed without being disintegrated.

When particles having the same composition and the same average primary particle diameter are compared with each other, it is seen that there is a tendency that aggregates having relatively larger (or more) voids, relatively larger friction among the particles forming the aggregates, and relatively smaller deformability are generated when non-spherical particles such as plate-shaped particles or needle-shaped particles are used in comparison to when spherical particles are used.

Note that the property "spherical" in the present application can be expressed by using, for example, the "roundness". Note that when an arbitrary number of particles are chosen in a photograph that is obtained by shooting particles by an SEM or the like, and the size of the particles is represented by S and the circumferential length thereof is represented by L, the "roundness" can be expressed by using the below-shown expression.

(Roundness)=$4\pi S/L^2$

For the measurement of the roundness, various image processing software programs or apparatuses installed with image processing software programs can be used. In the present application, particles having an average roundness of 0.9 to 1 when the average roundness is measured by using a flow-type particle image analyzer FPIA-1000 manufactured by Toa Iyou Denshi K. K. are defined as "spherical particles". The average roundness is preferably 0.96 to 1.

The thermally conductive particles (A) used to generate easily deformable aggregates (D) have an average primary particle diameter of 0.1 to 10 μm and preferably have an average primary particle diameter of 0.3 to 10 µm. When one type of thermally conductive particles (A) having substantially a uniform size is used, thermally conductive particles (A) having an average primary particle diameter of 0.3 to 5 µm are preferably used. Alternatively, a plurality of types of thermally conductive particles (A) having different sizes can be used. In this case, it is preferable to use relatively small thermally conductive particles and relatively large thermally conductive particles in a combined fashion in order to reduce the voidage (or void rate) in the aggregates.

When the average primary particle diameter is too small, the number of contact points among the primary particles in the aggregates increase. As a result, the contact resistance increases and the thermal conductivity tends to decrease. On the other hand, when the average primary particle diameter is too large, the obtained aggregates are easily disintegrated even when they are formed. Therefore, the aggregates cannot be easily formed.

The "average primary particle diameter" of the thermally conductive particles (A) in the present invention is a value measured by a particle size distribution meter (e.g., Mastersizer 2000 manufactured by Malvern Instruments).

Further, the condition that easily deformable aggregates (D) according to the present invention are "less likely to be disintegrated" can be evaluated, for example, based on a fact that when easily deformable aggregates (D) are put into a glass sample tube so that their voidage becomes 70% and then the glass sample tube is shook for two hours by a shaker, the average particle diameter of the easily deformable aggregates (D) after the vibration is equal to or higher than 80% of that of the easily deformable aggregates (D) before the vibration.

(Organic Binding Agent (B))

The organic binding agent (B) in the present invention functions as a "binder" that binds the thermally conductive particles (A) to each other.

The organic binding agent (B) is not restricted to any particular substances and its molecular weight is not questioned, provided that the substance can function as a "binder".

Examples of the organic binding agent (B) include surfactants, polyether resins, polyurethane resins, (unsaturated) polyester resins, alkyd resins, butyral resins, acetal resins, polyamide resins, (meta)acryl resins, styrene/(meta)acryl resins, polystyrene resins, nitrocellulose, benzyl cellulose, cellulose (tri)acetate, casein, shellac, gelatin, gilsonite, rosin, rosin ester, polyvinyl alcohol, polyvinyl pyrrolidone, polyacrylamide, hydroxyethyl cellulose, hydroxypropyl cellulose, methylcellulose, ethyl cellulose, hydroxy ethyl methylcellulose, hydroxypropyl methylcellulose, carboxymethyl cellulose, carboxymethyl ethyl cellulose, carboxymethyl nitrocellulose, ethylene/vinyl alcohol resins, styrene/maleic anhydride resins, polybutadiene resins, polyvinyl chloride resins, polyvinylidene chloride resins, polyvinylidene fluoride resins, polyvinyl acetate resins, ethylene/vinyl acetate resins, vinyl chloride/vinyl acetate resins, vinyl chloride/vinyl acetate/maleic acid resins, fluorocarbon resins, silicon resins, epoxy resins, phenoxy resins, phenol resins, maleic acid resins, urea resins, melamine resins, benzoguanamine resins, ketone resins, petroleum resins, chlorinated polyolefin resins, denatured chlorinated polyolefin resins, and chlorinated polyurethane resins.

One or more than one type of substances can be used as the organic binding agent (B).

Since the organic binding agent (B) affects the deformability of the obtained easily deformable aggregates (D), the organic binding agent (B) is preferably non-curable.

The term "non-curable" means that the organic binding agent (B) is not self-crosslinked at 25° C.

It is preferable that no component that functions as a curing agent be used for the organic binding agent (B).

When the later-described thermally conductive member (I) is an adhesive sheet, a water-soluble resin is preferably used as the organic binding agent (B). Examples of the water-soluble resin include polyvinyl alcohol and polyvinyl pyrrolidone.

Depending on the use, a water-insoluble resin can be used as the organic binding agent (B). Examples of the water-insoluble resin include phenoxy resins and petroleum resins.

Easily deformable aggregates (D) according to the present invention contain 0.1 to 30 pts·mass and preferably 1 to 10 pts·mass of the organic binding agent (B) based on 100 pts·mass of the thermally conductive particles (A).

When the amount of the organic binding agent (B) is smaller than 0.1 pts·mass, the organic binding agent (B) cannot bind the thermally conductive particles (A) sufficiently and a sufficient strength required for maintaining the agglomerated form cannot be obtained. Therefore, it is undesirable. When the amount of the organic binding agent (B) is larger than 30 pts·mass, the effect for binding the thermally conductive particles (A) with each other increases. However, an unnecessarily large amount of the organic binding agent (B) gets into gaps in the thermally conductive particles (A), thus raising a possibility that the thermal conductivity is impaired. Therefore, it is also undesirable.

The average particle diameter of the easily deformable aggregates (D) according to the present invention is preferably 2 to 100 µm and more preferably 5 to 50 µm. When the average particle diameter of the easily deformable aggregates (D) is smaller than 2 µm, the number of thermally conductive particles (A) forming each easily deformable aggregate (D) decreases. Therefore, the effect as aggregates decrease and the deformability also become poorer. Therefore, it is undesirable. When the average particle diameter of the easily deformable aggregates (D) is larger than 100 µm, the mass of the easily deformable aggregates (D) per unit volume increases. As a result, when the obtained easily deformable aggregates (D) are used as dispersion, there is a possibility that the easily deformable aggregates (D) precipitate. Therefore, it is also undesirable.

The "average particle diameter" of the easily deformable aggregates (D) in the present invention is a value measured by a particle size distribution meter (e.g., Mastersizer 2000 manufactured by Malvern Instruments).

There are no particular restrictions on the specific surface of the easily deformable aggregates (D). However, the specific surface is preferably no greater than 10 $m^2/g$ and preferably no greater than 5 $m^2/g$. When the specific surface is greater than 10 $m^2/g$, the later-described binder resin (E) adheres to the particle surfaces or the inside of the aggregates and the film-forming property and/or the adhesive force tend to decrease. Therefore, it is undesirable.

The "specific surface" is a value measured by a BET specific surface meter (e.g., BELSORP-mini manufactured by BEL Japan, Inc.).

The organic binding agent (B) can include a nitrogen atom. In this case, a nitrogen atom in the organic binding agent (B) has a non-covalent bond interaction with the skeleton of the later-described binder resin (E) and hence the cohesive force of the later-described thermally conductive members (H) and (I) improves. As a result, when they are used as adhesive sheets, for example, the adhesive force improves.

The organic binding agent (B) including a nitrogen atom is not restricted to any particular substances. Examples of organic binding agent (B) including a nitrogen atom include, among the above-described various resins listed as the organic binding agent (B), resins that include one or more than one type of functional groups containing a nitrogen atom.

The organic binding agent (B) including a functional group containing a nitrogen atom may be a resin that is synthesized by using a monomer including a functional group containing a nitrogen atom, or may be a resin that is obtained by denaturing part of a resin including no functional group containing a nitrogen atom and thereby adding a functional group containing a nitrogen atom to the resin.

Examples of the functional group containing a nitrogen atom include a urethane group, a thiourethane group, a urea group, a thiourea group, an amide group, a thioamide group, an imide group, an amino group, an imino group, a cyano group, a hydrazino group, a hydrazono group, a hydrazo group, an azino group, a diazenyl group, an azo group, an ammonio group, an iminio group, a diazonio group, a diazo group, an azido group, and an isocyanate group.

Among them, a urethane group, an amide group, and an amino group are preferred because the amount of contained nitrogen atoms can be easily controlled.

When the later-described thermally conductive member is an adhesive sheet, a water-soluble resin is preferably used as the organic binding agent (B). Examples of the water-soluble resin containing a nitrogen atom include polyethylene imine, polyallyl amine, polyacrylamide, and a polyvinyl pyrrolidone.

Depending on the use, a water-insoluble resin can be used as the organic binding agent (B). Examples of the water-insoluble resin containing a nitrogen atom include water-insoluble urethane resins and water-insoluble amide resins.

The organic binding agent (B) can include a reactive functional group.

In this case, the reactive functional group in the organic binding agent (B) reacts with the functional group of the later-described binder resin (E). As a result, the crosslinked structures of the later-described thermally conductive members (H) and (I) are developed, thus leading to an improvement in the heat resistance.

The term "reactive" in this specification means that the later-described thermally conductive members (H) and (I) including the easily deformable aggregates (D) according to the present invention are heated and thereby form crosslinked structures with the functional group of the later-described binder resin (E). Note that the heating process is preferably carried out at the same time as when the later-described thermally conductive members (H) and (I) are pressurized and the easily deformable aggregates (D) are thereby deformed, or after the easily deformable aggregates (D) are deformed. For example, it is undesirable to include a functional group that becomes reactive at an unheated temperature such as at 25° C. i.e., becomes a reactive before the aggregates are compressed and deformed because the deformability of the easily deformable aggregates (D) is impaired.

The organic binding agent (B) including a reactive functional group(s) is not restricted to any particular substances. Examples of organic binding agent (B) including a reactive functional group include, among the above-described various resins listed as the organic binding agent (B), resins that include one or more than one type of reactive functional groups.

The organic binding agent (B) including a reactive functional group may be a resin that is synthesized by using a monomer including a reactive functional group, or may be a resin that is obtained by denaturing part of a resin including no reactive functional group and thereby adding a reactive functional group to the resin.

Examples of the reactive functional group include an epoxy group, a carboxyl group, an acetoacetyl group, an amino group, an isocyanate group, a hydroxyl group, and a thiol group.

In view of the heat resistance, the reactive functional group of the organic binding agent (B) is preferably an epoxy group, an acetoacetyl group, an amino group, a hydroxyl group, or a carboxyl group. Further, the functional group of the binder resin (E) is preferably an epoxy group, a carboxyl group, a hydroxyl group, or an acetoacetyl group.

When the later-described thermally conductive member (I) is an adhesive sheet, a water-soluble resin is preferably used as the organic binding agent (B). Examples of the water-soluble resin including a reactive functional group include polyvinyl alcohol, carboxymethyl cellulose, and polyallyl amine.

(Thermally Conductive Fiber (P))

The easily deformable aggregates (D) can include thermally conductive fibers (P). In this case, the thermal conductivity of the easily deformable aggregates (D) can be improved.

The thermally conductive fibers (P) are not restricted to any particular fibrous substances, provided that the fibrous substance has an excellent thermal conductivity. Preferably, at least the surface of the thermally conductive fibers (P) is metallic.

Examples of the thermally conductive fibers (P) include metallic (nano-) wires, metallic (nano-) tubes, and metallic meshes containing a metal such as copper, platinum, gold, silver, and nickel.

The term "fibrous material" in this specification means fibrous materials in which the average fiber length relative to the average fiber diameter (aspect ratio) is equal to or greater than five.

For example, the thermally conductive fibers have a diameter of 0.3 to 50,000 nm and a length of 1 to 5,000 μm.

Examples of the metallic fiber synthesizing method include a mold method (Japanese Unexamined Patent Application Publication No. 2004-269987), an electron beam irradiation method (Japanese Unexamined Patent Application Publication No. 2002-67000), and a chemical reduction method (Japanese Unexamined Patent Application Publication No. 2007-146279 and Chemical Physics Letters 380 (2003) 146-169).

Other examples of the thermally conductive fibers (P) include:

(nano-) wires, (nano-) tubes, and (nano-) fibers containing a silicon, a metal oxide, a metal nitride, or carbon as the main ingredient; and sheet-like fibrils made of graphite or graphene.

The terms "nano-wires, nano-tubes, and nano-fibers" in this specification mean those whose average fiber diameter is less than 1 μm.

Other examples of the thermally conductive fibers (P) include materials obtained by coating non-thermally conductive fibers with a material containing a metal (such as copper, platinum, gold, silver, and nickel), silicon, a metal oxide, a metal nitride, or carbon as the main ingredient. Examples of the coating method include an electric-field plating method, an electroless plating method, a hot-dip galvanizing method, and a vacuum deposition method.

Among the above-described examples of the thermally conductive fibers (P), (nano-) wires containing a metal as the main ingredient are preferred in view of the easy deformability. Further, metallic (nano-) wires containing silver as the main ingredient (silver (nano-) wires) are particularly preferred in view of the oxidation resistance.

The amount of the thermally conductive fibers (P) used to obtain the easily deformable aggregates (D) is preferably 0.01 to 50 pts·mass and more preferably 0.1 to 10 pts·mass based on 100 pts·mass of the thermally conductive particles (A). When the amount is greater than 50 pts·mass, the amount of the thermally conductive fibers (P) that are not contained in the easily deformable aggregates (D) could increase.

The easily deformable aggregates (D) can include a fibrous carbon material (J) as the thermally conductive fibers (P) (except for carbon particles having an average primary particle diameter of 0.1 to 10 μm). In this case, the thermal conductivity of the easily deformable aggregates (D) can be improved.

The fibrous carbon material (J) functions to facilitate the thermal conduction among the thermally conductive particles (A).

Preferably, spherical thermally-conductive particles (A) and/or thermally conductive particles (A) having a small particle diameter are used so that the voids in the easily deformable aggregates (D) can be reduced. Further, the fibrous carbon material (J) may be used together with the thermally conductive particles (A) to facilitate the thermal conduction among the thermally conductive particles (A). As a result, the thermal conductivity is improved even further.

The fibrous carbon material (J) preferably has a smaller size than that of the used thermally conductive particles (A).

Examples of the fibrous carbon material (J) include carbon fibers, graphite fibers, vapor deposition carbon fibers, carbon nano-fibers, and carbon nano-tubes. One or more than one type of these materials can be used.

The use of the fibrous carbon material (J) is preferred because it enables efficient formation of thermal conduction paths among the thermally conductive particles (A).

The average fiber diameter of the carbon material (J) is preferably 5 to 30 nm and the average fiber length thereof is preferably 0.1 to 20 μm.

Easily deformable aggregates (D) according to the present invention preferably contain 0.5 to 10 pts·mass and more preferably 1 to 5 pts·mass of the fibrous carbon material (J) based on 100 pts·mass of the thermally conductive particles (A). When the amount of the fibrous carbon material (J) is within the aforementioned range, thermal conduction paths can be formed while maintaining the electrical-insulation property.

Figure 5:
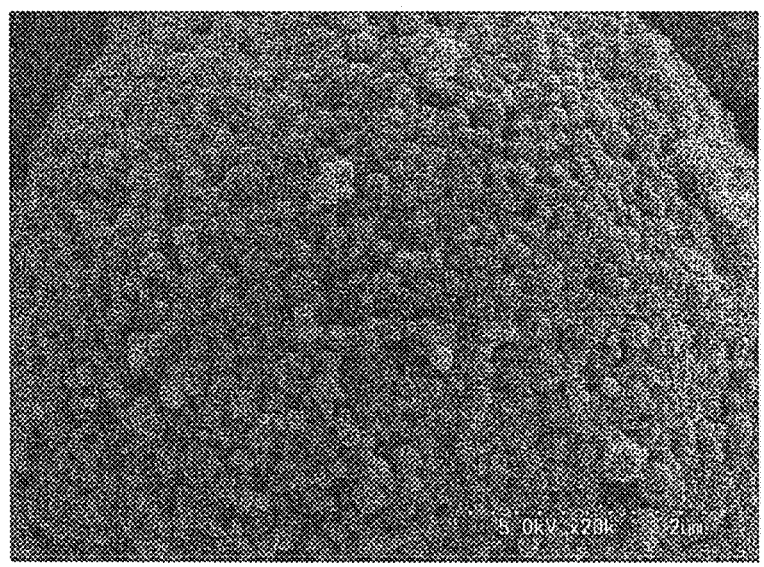
FIG. 5 is an example of an SEM photograph of easily deformable aggregates (D) having an average particle diameter of 10 μm obtained by agglomerating thermally conductive particles (A) having an average primary particle diameter of 1 μm and a carbon material (J) by using an organic binding agent (B).

FIG. 5 is an example of an SEM photograph of easily deformable aggregates (D) having an average particle diameter of 10 μm obtained by agglomerating thermally conductive particles (A) having an average primary particle diameter of 1 μm and a fibrous carbon material (J) by using an organic binding agent (B).

For the easily deformable aggregates (D), both spherical particles including no carbon material and a carbon material having an arbitrary shape other than the fibrous shape can be used at the same time as the thermally conductive particles (A). In this case, the thermal conductivity of the easily deformable aggregates (D) can be improved.

The carbon material having an arbitrary shape other than the fibrous shape functions to facilitate the thermal conduction among the spherical particles including no carbon material.

Preferably, spherical thermally-conductive particles (A) and/or thermally conductive particles (A) having a small particle diameter are used so that the voids in the easily deformable aggregates (D) can be reduced. Further, as the thermally conductive particles (A), the carbon material may be used together with the thermally conductive particles (A) including no carbon material to facilitate the thermal conduction among the thermally conductive particles (A) including no carbon material. As a result, the thermal conductivity is improved even further.

The carbon material having an arbitrary shape other than the fibrous shape preferably has a smaller size than that of the spherical particles including no carbon material.

Examples of the carbon material having a shape other than the fibrous shape include graphite, carbon black, fullerene, and graphene. One or more than one type of these materials can be used.

In particular, a carbon material having a plate-shaped shape is preferred because it enables efficient formation of thermal conduction paths among the spherical particles including no carbon material.

The average aspect ratio of the plate-shaped carbon material is preferably 10 to 1,000 and the average thickness thereof is preferably 0.1 to 500 nm.

Easily deformable aggregates (D) according to the present invention may include arbitrary components other than the aforementioned components as required.

(Manufacturing Method)

Easily deformable aggregates (D) according to the present invention can be obtained by, for example, a method (1) in which a slurry containing thermally conductive particles (A), an organic binding agent (B), an arbitrary component that is added as required, and a solvent (C) that dissolves or disperses these components is obtained, and then the solvent (C) is removed from the slurry.

Easily deformable aggregates (D) according to the present invention can also be obtained by a method (2) in which the aforementioned components except for the solvent (C) (thermally conductive particles (A), an organic binding agent (B), an arbitrary component that is added as required) are simply mixed.

Easily deformable aggregates (D) according to the present invention can also be obtained by a method (3) in which a liquid (a solution or a dispersion liquid) containing thermally conductive particles (A), an organic binding agent (B), an arbitrary component that is added as required, and a solvent (C) that dissolves or disperses these components is sprayed, and the solvent (C) is removed after the liquid is sprayed or while the liquid is being sprayed.

The above-described method (I) is preferred in order to obtain easily deformable aggregates (D) having more uniform composition.

The solvent (C) disperses the thermally conductive particles (A) and dissolves the organic binding agent (B). When thermally conductive fibers (P) and/or a carbon material are used, the solvent (C) disperses these substances.

The solvent (C) is not restricted to any particular substances, provided that the substance can dissolve the organic binding agent (B). The solvent (C) may be selected as desired according to the type of the organic binding agent (B).

Examples of the solvent (C) include ester-based solvents, ketone-based solvents, glycol ether-based solvents, aliphatic solvent, aromatic solvents, alcohol-based solvents, ether-based solvents, and water.

One or more than one type of these substances can be used for the solvent (C).

The solvent (C) preferably has a low boiling point in view of the easiness of the removal. Preferably, its boiling point is no higher than 110° C. For example, water, ethanol, methanol, and ethyl acetate are preferred.

The amount of the used solvent (C) is preferably small in view of the easiness of the removal. However, the amount of the used solvent (C) can be changed as desired according to the solubility of the organic binding agent (B) or the apparatus for drying the solvent.

The method for removing the solvent (C) from the slurry is not restricted to any particular methods. Further, commercially available apparatuses can be used for the removing method. For example, one of spray drying, stirring drying, ventilation drying, and the like can be chosen. Among them, the spray drying is preferably used because it can produce relatively round easily deformable aggregates (D) having a uniform particle diameter with high productivity, have a high drying speed, and produce easily deformable aggregates (D) that can be deformed more easily. In this case, the solvent (C) may be volatilized and removed while spraying the slurry in the form of mist. The spraying condition and the volatizing condition can be chosen as desired.

[Thermally Conductive Resin Composition (G), Thermally Conductive Members (H) and (I)]

A thermally conductive resin composition (G) according to the present invention contains 20 to 90 vol % of the above-described easily deformable aggregates (D) according to the present invention, 10 to 80 vol % of a binder resin (E), and a solvent (F) that dissolves the binder resin (E).

A thermally conductive member (H) can be obtained by applying the thermally conductive resin composition (G) on a base material and thereby forming a coating, and removing the solvent (F) from this coating and thereby forming a thermally conductive layer.

Further, a thermally conductive member (highly thermally conductive member) (I) having a higher thermal conductivity than that of the thermally conductive member (H) can be obtained by applying a pressure on the thermally conductive member (H) and thereby deforming the easily deformable aggregates (D) contained therein.

For example, it is possible to obtain a thermally conductive sheet having a higher thermal conductivity as the thermally conductive member (I) by first obtaining a thermally conductive sheet as the thermally conductive member (H) by using the thermally conductive resin composition (G), and then sandwiching the obtained thermally conductive sheet between an article from which heat should be radiated and a heat radiating member and applying a pressure on the sandwiched body. This thermally conductive sheet can efficiently transfer heat generated in the article from which heat should be radiated to the heat radiating member.

An adhesive or pressure-sensitive adhesive thermally-conductive sheet can be obtained as the thermally conductive member (H). In this case, the article from which heat should be radiated and the heat radiating member can be bonded to the thermally conductive sheet when the pressure is applied.

A sheet-like thermally-conductive member (I) or the like can also be directly obtained by applying a pressure and heat to the thermally conductive resin composition (G) and thereby deforming the easily deformable aggregates (D) contained in therein.

A thermally conductive member (I) can also be directly obtained by applying a pressure on the easily deformable aggregates (D) itself and thereby deforming the easily deformable aggregates (D). In this case, the organic binding agent (B), which partly constitutes the easily deformable aggregates (D), serves as the binder resin (E) as well as the organic binding agent (B).

For example, easily deformable aggregates (D) can be sandwiched between an article from which heat should be radiated and a heat radiating member. Then, a pressure is applied on the sandwiched body and the easily deformable aggregates (D) are thereby deformed. As a result, heat generated in the article from which heat should be radiated can be efficiently transferred to the heat radiating member.

Examples of the article from which heat should be radiated include:

various electronic components such as IC chips, hybrid packages, multi-modules, power transistors, and LED (Light-Emitting Diode) substrates; and articles which are used for construction materials, vehicles, airplanes, ships, and so on, and tend to accumulate heat, and from which heat should be externally removed to prevent their performance degradation.

To achieve a high thermal conductivity, it is important to form as many thermal conduction paths as possible in the direction in which the heat is desired to be transferred.

In the easily deformable aggregates (D) according to the present invention, since the thermally conductive particles (A) are agglomerated, the distances among the particles are short and thermal conduction paths are already formed, thus enabling efficient thermal conduction.

In addition, since the easily deformable aggregates (D) according to the present invention are "easily deformable", they can achieve a high thermal conductivity. That is, when an external force is applied to the easily deformable aggregates (D), the adhesion among the thermally conductive particles (A) in the easily deformable aggregates (D) improves without the easily deformable aggregates (D) being disintegrated. Therefore, the already-formed thermal conduction paths can be reinforced. At the same time, since the positions of the thermally conductive particles (A) forming the easily deformable aggregates (D) can be easily changed, the easily deformable aggregates (D) conform to the shape of the interface between the article from which heat should be radiated and the heat radiating member. As a result, the size of the contact areas between the thermally conductive particles (A) and the article from which heat should be radiated and/or between the thermally conductive particles (A) and the heat radiating member increases, thus making it possible to dramatically increase the heat inflow areas and/or heat propagation paths.

The present invention is further explained in detail with reference to the drawings.

FIG. 3a is an example of an SEM plane photograph of a thermosetting sheet including easily deformable aggregates (D) having an average particle diameter of 10 μm obtained by agglomerating thermally conductive particles (A) having an average primary particle diameter of 1 μm shown in FIG. 2 by using an organic binding agent (B). FIGS. 3b and 3c are examples of an SEM plane photograph and an SEM cross-sectional photograph, respectively, of a cured substance obtained by thermally curing the thermosetting sheet shown in FIG. 3a under pressure. It can be seen that by applying a pressure on the thermosetting sheet, the thermally conductive particles (A) in the easily deformable aggregates (D) are adhered with each other more closely, and a number of thermally conductive particles (A) are present on the surface of the cured substance and conform to the shape of the interface.

In contrast to this, non-agglomerated thermally-conductive particles (A) having roughly the same size as that of the easily deformable aggregates (D) shown in FIG. 3a, like those shown in FIG. 4, are not easily deformable. Therefore, the above-described change is hardly observed between before and after the pressurization of the thermosetting sheet.

As described above, since the easily deformable aggregates (D) according to the present invention are "easily deformable", they have an excellent thermal conductivity. That is, the easily deformable aggregates (D) according to the present invention are able to give substantially the same level of a thermal conductivity as that of the conventional material by using a smaller amount thereof than that has been conventionally used or give a higher thermal conductivity than that of the conventional material by using substantially the same amount thereof as that has been conventionally used.

The thermal conductivity (W/m·K) can be obtained by the below-shown expression in which a thermal diffusivity (mm$^2$/s) indicating the speed at which heat is transferred through a sample to be measured is multiplied by a specific heat capacity (J/(g·K)) and a density (g/cm$^3$) of the sample.

Thermal conductivity(W/m·K)=Thermal diffusivity (mm$^2$/s)×Specific heat capacity (J/(g·K))×Density(g/cm$^3$)

For the measurement of the thermal diffusivity, a cyclic heating method, a hot disc method, a temperature wave analyzing method, or a flash method, for example, can be chosen according to the shape and the like of the sample to be measured. The data shown in this specification were obtained by measuring thermal diffusivities by a flash method using a xenon flash analyzer LFA447 NanoFlash (manufactured by NETZSCH).

Examples of the binder rein (E) used to obtain the thermally conductive resin composite include polyurethane resins, polyester resins, polyester urethane resins, alkyd resins, butyral resins, acetal resins, polyamide resins, acrylic resins, styrene-acryl resins, styrene resins, nitrocellulose, benzyl cellulose, cellulose (tri) acetate, casein, shellac, gilsonite, gelatin, styrene-maleic anhydride resins, polybutadiene resins, polyvinyl chloride resins, polyvinylidene chloride resins, polyvinylidene fluoride resins, polyvinyl acetate resins, ethylene vinyl acetate resins, vinyl chloride/vinyl acetate copolymer resins, vinyl chloride/vinyl acetate/maleic acid copolymer resins, fluorocarbon resins, silicon resins, epoxy resins, phenoxy resins, phenol resins, maleic acid resins, urea resins, melamine resins, benzoguanamine resins, ketone resins, petroleum resins, rosin, rosin ester, polyvinyl alcohol, polyvinyl pyrrolidone, polyacrylamide, hydroxyethyl cellulose, hydroxypropylcellulose, methylcellulose, ethyl cellulose, hydroxy ethyl methylcellulose, hydroxypropyl methylcellulose, carboxymethyl cellulose, carboxymethyl ethyl cellulose, carboxymethyl nitrocellulose, ethylene/vinyl alcohol resins, polyolefin resins, chlorinated polyolefin resins, denatured chlorinated polyolefin resins, and chlorinated polyurethane resins.

One or more than one type of substances can be used as the binder resin (E).

Among them, urethane-based resins are preferably used in view of the softness. Further, epoxy-based resins are preferably used in view of the electrical-insulation property, the heat resistance property, and the like when they are used for electronic components.

Note that the organic binding agent (B), which partly constitutes the easily deformable aggregates (D), is preferably non-curable in order to ensure the easy deformability. In contrast to this, as for the binder resin (E), those that are cured by themselves or cured by a reaction with an appropriate curing agent can be used.

When the organic binding agent (B) includes a reactive functional group, a binder resin (E) having a functional group that reacts with the reactive functional group of the organic binding agent (B) is preferred.

Examples of the functional group possessed the binder resin (E) include an epoxy group, a carboxyl group, an acetoacetyl group, an ester group, an amino group, an isocyanate group, a hydroxyl group, and a thiol group. The binder resin (E) can include one or more than one type of reactive functional groups.

The thermally conductive resin composition (G) includes the easily deformable aggregates (D), the binder resin (E), and the solvent (F). The solvent (F) is used to uniformly disperse the easily deformable aggregates (D) and the binder resin (E) in the thermally conductive resin composition (G).

As for the easily deformable aggregates (D), one type of easily deformable aggregates (D) may be solely used. Alternatively, a plurality of types of easily deformable aggregates (D) having different average particle diameters, including thermally conductive particles (A) of different types or different average primary particle diameters, or including organic binding agents (B) of different types or different quantities may be used together.

As for the solvent (F), it is important to appropriately choose a solvent that can dissolve the binder resin (E) but does not dissolve the organic binding agent (B), which partly constitutes the easily deformable aggregates (D). If a solvent (F) that could dissolve the organic binding agent (B) is used, the agglomerated state of the easily deformable aggregates (D) cannot be maintained when the thermally conductive resin composition (G) is obtained.

For example, when a water-soluble resin such as polyvinyl alcohol or polyvinyl pyrrolidone is chosen as the organic binding agent (B), a non-aqueous solvent such as toluene or xylene may be chosen as the solvent (F) to obtain the thermally conductive resin composition (G).

When a water-insoluble resin such as a phenoxy resin or a petroleum resin is chosen as the organic binding agent (B), an aqueous solvent such as water or alcohol may be chose as the solvent (F) to obtain the thermally conductive resin composition (G).

Note that the term "insoluble" in this specification means that when 1 g of an organic binding agent (B) is put into 100 g of a solvent (F) and the solvent is stirred at 25° C. for 24 hours, precipitation is visually observed.

Note that the content (i.e., amount) of the easily deformable aggregates (D) can be chosen as desired according to the desired thermal conductivity and the use. To achieve a high thermal conductivity, the content of the easily deformable aggregates (D) is preferably 20 to 90 vol % and more preferably 30 to 80 vol % based on the solid content of the thermally conductive resin composition (G).

When the content of the easily deformable aggregates (D) is less than 20 vol %, the effect obtained by adding the easily deformable aggregates (D) is small and hence a satisfactory thermal conductivity cannot be obtained. On the other hand, when the content of the easily deformable aggregates (D) is larger than 90 vol %, the content of the binder resin (E) is relatively reduced. Therefore, there is a possibility that the formed thermally conductive members (H) and (I) are fragile and/or voids are formed in the thermally conductive member (I). Further, there is a possibility that the thermal conductivity gradually deteriorates over a long time while the thermally conductive member (I) is used.

The term "vol %" in this specification indicates a theoretical value calculated based on the mass ratios of the thermally conductive particles (A), the organic binding agent (B), an arbitrary component(s) that is mixed as required, and the binder resin (E) to the solid content of the thermally conductive resin composition (G), and the specific gravity of each component.

Non-agglomerated thermally conductive particles can also be used for the thermally conductive resin composition (G) at the same time. By using non-agglomerated thermally conductive particles as well as the agglomerated thermally conductive particles, the voids among the easily deformable aggregates (D) can be filled therewith. Further, when voids are formed among the thermally conductive particles (A) when the easily deformable aggregates (D) are deformed, those voids can also be filled with the non-agglomerated thermally conductive particles. As a result, it is expected that the thermal conductivity is improved even further.

Examples of the thermally conductive particles that can be used together with the thermally conductive particles (A) include those that are listed above as the examples of the thermally conductive particles (A).

A fire retardant and/or a filler may also be added to the thermally conductive resin composition (G) as required.

Examples of the fire retardant include aluminum hydroxide and magnesium hydroxide.

Other various additives can also be added to the thermally conductive resin composition (G) as required. Examples of the additives include a coupling agent for increasing the base-material adhesion, an ion scavenger for increasing the electrical-insulation reliability when moisture is absorbed, and a leveling agent.

When the organic binding agent (B) includes a reactive functional group and the binder resin (E) includes a functional group that reacts with the reactive functional group of the organic binding agent (B), a curing agent for increasing the heat resistance can be added in the thermally conductive resin composition (G). The heat resistance can be improved by making the organic binding agent (B) react not only with the binder resin (E) but also with the curing agent.

One or more than one type of substances can be used as the additive.

The thermally conductive resin composition (G) can be manufactured by stirring and mixing the easily deformable aggregates (D), the binder resin (E), the solvent (F), and another arbitrary component(s) that is added as required.

For the stirring and mixing process, an ordinary stirring method can be used. Examples of the stirring and mixing apparatuses include a disper, a scandex, a paint conditioner, a sand mill, a stone mill, a media-less disperser, triple rolls, and a bead mill.

It is preferable to carry out a defoaming process after the stirring and mixing process in order to remove air bubbles from the thermally conductive resin composition (G). Examples of the defoaming method include vacuum defoaming and ultrasound defoaming.

A method for manufacturing a thermally conductive member (H) according to the present invention includes:

a step of applying a thermally conductive resin composition (G) on a base material and thereby forming a coating; and a step of removing a solvent (F) from the coating and thereby forming a thermally conductive layer.

A method for manufacturing a thermally conductive member (I) according to the present invention includes:

a step of preparing a thermally conductive member (H); and a step of applying a pressure on the thermally conductive layer.

A thermally conductive sheet or the like can be manufactured as the thermally conductive member (H) or (I). The thermally conductive sheet is also referred to as "thermally conductive film".

Examples of the base material include:

plastic films such as polyester films, polyethylene films, polypropylene films, and polyimide films;

films obtained by performing a mold-release treatment for the aforementioned plastic films (hereinafter called "release film"); and metal elements or metal foils made of metals such aluminum, copper, stainless steel, and beryllium copper.

Examples of the coating method of the thermally conductive resin composition (G) on the base material include a knife coating, a die coating, a lip coating, a roll coating, a curtain coating, a bar coating, a gravure coating, a flexographic coating, a dip coating, a spray coating, and a spin coating.

The thickness of the thermally conductive layer may be determined as desired according to the use.

When the thermally conductive sheet is disposed between a heat source and a heat sink and used to release heat, the thickness of the thermally conductive layer is normally 10 to 200 µm and preferably 30 to 150 µm in view of the thermal conductivity and various physical properties. Further, when the thermally conductive layer is used for a housing such as a package in order to prevent the confinement of heat from a heat source, the thickness of the thermally conductive layer is equal to or greater 200 µm and, for some cases, around 1 mm in view of the strength and the like.

In the thermally conductive member (H), it is preferable that the contact resistance among the easily deformable aggregates (D) is as small as possible in order to improve its thermal conductivity.

By selecting easily deformable aggregates (D) having an appropriate size for the thickness of the thermally conductive member (H), the total contact resistance in the thermally conductive member (H) can be reduced.

Specifically, the ratio of the average particle diameter of the easily deformable aggregates (D) to the thickness of the thermally conductive member (H) is preferably no less than 20% and more preferably no less than 50%.

The ratio of the average particle diameter of the easily deformable aggregates (D) to the thickness of the thermally conductive member (H) may be equal to or greater than 100%. This case is more preferable because thermal conduction paths that completely penetrate the thermally conductive member (I) can be formed by sandwiching the thermally conductive member (H) between an article from which heat should be radiated and a heat radiating member, and then applying a pressure on the sandwiched body and thereby deforming the easily deformable aggregates (D).

When it is desired to obtain a thick thermally conductive member (H) according to the use, it is possible to efficiently form thermal conduction paths by stacking a plurality of thermally conductive members (H) for which the aforementioned ratio is equal to or greater than 20%.

A thermally conductive member (I) can be obtained by forming a thermally conductive member (H) by forming a thermally conductive layer on an arbitrary base material, and then placing another arbitrary base material over the obtained thermally conductive member (H) and applying a pressure on the stacked body while heating the stacked body.

A release film can be used as at least one of the aforementioned base materials. In this case, the release film can be removed.

When release films are used for both the base materials, a thermally conductive member (I) can be produced by removing both the release films and thereby isolating the thermally conductive layer.

The pressure applying process is not restricted to any particular processes. That is, publicly-known pressure applying apparatuses can be used.

The temperature in the pressure applying process can be determined as desired. However, when the thermally conductive member is used as a thermosetting adhesive sheet, the thermally conductive member is preferably hated to a temperature equal to or higher than the temperature at which the binder resin (E) is thermally cured.

If necessary, the pressure applying process may be performed under a reduced pressure.

The pressure in the pressure applying process can also be determined as desired, provided that the easily deformable aggregates (D) can be deformed by that pressure. However, the pressure in the pressure applying process is preferably equal to or greater than 1 MPa.

A highly thermally conductive molded object can also be obtained by directly molding a thermally conductive resin composition (G) containing no solvent (F) under pressure.

EXAMPLES

The present invention is explained hereinafter in a more specific manner by using examples. However, the scope of the present invention is not limited by the below-shown examples. Note that in the examples, the units "pts." and "%" represent "pts·mass" and "mass %", respectively. Further, "vol %" represents "volume %" and "Mw" represents "mass-average molecular weight".

The average primary particle diameter of the thermally conductive particles (A), the average particle diameter of the easily deformable aggregates (D), the roundness of the thermally conductive particles (A), the average compressive force required for a 10% compressive deformation rate of the easily deformable aggregates (D), the tolerance against disintegration (the maintaining rate of the average particle diameter after a shaking test) of the easily deformable aggregates (D), the shape of the carbon material, the thermal conductivities of the thermally conductive members (H) and (I), the adhesive force of the thermally conductive member (I) (adhesive sheet), and the heat resistance of the thermally conductive member (I) were obtained as described below.

<Average Primary Particle Diameter, Average Particle Diameter>

The average primary particle diameter and the average particle diameter were measured by using a particle size distribution meter Mastersizer 2000 manufactured by Malvern Instruments. Dry units were used. The air pressure was 2.5 bar. The feed speed was optimized according to the sample.

<Roundness>

The average roundness was measured by using a flow-type particle image analyzer FPIA-1000 manufactured by Toa Iyou Denshi K.K. About 5 mg of particles to be measured was dispersed in 10 ml of toluene and a dispersion liquid is thereby prepared. Ultrasound (20 kHz, 50 W) is emitted to the dispersion liquid for five minutes to adjust the concentration of the dispersion liquid to 5,000 to 20,000 particles/ul. By using this dispersion liquid, the roundnesses of a group of particles having an equivalent circle diameter were measured by the aforementioned apparatus. Then, their average roundness was calculated.

<Average Compressive Force Required for 10% Compressive Deformation Rate>

For ten particles that were randomly chosen in a measurement area, the loads required to deform the particles by 10% were measured by using a micro compression tester (MCT-210 manufactured by Shimadzu Corporation). Their average value was defined as the average compressive force required for a 10% compressive deformation rate.

<Tolerance Against Disintegration (Maintaining Rate of Average Particle Diameter after Shaking Test)>

Easily deformable aggregates (D) were put into a glass sample tube so that their voidage becomes 70% and then the glass sample tube was shook for two hours by a shaker. After that, the particle diameter distribution was measured. The ratio of the average particle diameter after this process to the average particle diameter before the process was calculated as the maintaining rate of the average particle diameter after the shaking test.

The easily deformable aggregates (D) were determined to be "less likely to be disintegrated" when the average particle diameter after the process was equal to or greater than 80% of the average particle diameter before the process.

<Shape of Carbon Material>

The average fiber diameter and the average fiber length of the fibrous carbon material (J) were measured by randomly selecting 30 carbon fibers on a magnified image (e.g., 20,000 to 100,000 times) obtained by a field emission scanning electron microscope.

The average aspect ratio Z of the scale-like carbon material was defined as a value expressed by an expression "$Z=X/t$", where X was the average particle diameter and t was the average thickness.

A diluted dispersion liquid containing a scale-like carbon material was applied on a flat substrate (e.g., cleavage surface of mica mineral) and its solvent was dried and removed. After that, on a magnified image obtained by an atomic force microscope, 30 scale-line carbon material pieces were randomly selected. Further, their average length in the longitudinal direction was defined as "average particle diameter X" and the average value measured in the height profile was defined as "average thickness t".

<Thermal Conductivity>

A 15 mm cube was cut out from a sample and gold was vapor-deposited on its surface. After the cube sample was coated with carbon by using a carbon spray, its thermal diffusivity in a 25° C. sample environment was measured by using a xenon flash analyzer LFA447 NanoFlash (manufactured by NETZSCH). The specific heat capacity was measured by using a high-sensitivity differential scanning calorimeter DSC220C manufactured by SII Nano Technology Inc. The density was calculated by using a water replacement method. The thermal conductivity was calculated from these parameters.

<Adhesive Force>

For a thermally conductive member (I) (adhesive sheet) (three-layered sample: Cu foil (40 μm thickness)/thermally conductive layer/aluminum plate (250 μm thickness)), an adhesive force was measured under the condition of 5 kgf and a pulling speed of 50 mm/minute by using TENSILON UCT-IT (manufactured by ORIENTEC).

<Heat Resistance>

A thermally conductive member (I) (adhesive sheet) (three-layered sample: Cu foil (40 μm thickness)/thermally conductive layer/aluminum plate (250 μm thickness)) was floated on 260° C. molten solder for three minutes in a state where the aluminum plate was in contact with the molten solder. After that, the external appearance of the sample was visually observed and the occurrences of foaming and unsticking/peeling were evaluated.

The "foaming" means a state in which air bubbles are formed in the interface between the thermally conductive layer and the Cu foil (40 pun).

The "unsticking/peeling" means a state in which the thermally conductive layer is lifted and peeled from the aluminum plate.

The below-shown evaluation criteria were used:
Excellent (∘∘): No change is observed in external appearance;
Good (∘): Small foaming is slightly observed;
Fair (Δ): Forming is observed; and
Improper (x): Occurrence of heavy foaming or unsticking/peeling is observed.

Abbreviations in the Tables are explained below:
$H_2O$: ion-exchanged water;
Tol: toluene; IPA: 2-propanol; and
MEK: methyl ethyl ketone.

Resin Synthesis Example 1

In a reaction vessel equipped with an agitator, a thermometer, a reflux condenser, a dropping device, and a nitrogen feeding tube, 401.9 pts·mass of polyester polyol obtained from terephthalic acid, adipic acid, and 3-methyl-1,5-pentanediol ("Kuraray Polyol P1011" manufactured by Kuraray Co., Ltd., Mn=1006), 12.7 pts·mass of dimethylol butanoic acid, 151.0 pts·mass of isophorone diisocyanate, and 40 pts·mass of toluene were put. After they were reacted with each other at 90° C. under a nitrogen atmosphere for three hours, 300 pts·mass of toluene was added. As a result, a urethane prepolymer solution including an isocyanate group was obtained.

Next, 815.1 pts·mass of the obtained urethane prepolymer solution including an isocyanate group was added in a mixture of 27.8 pts·mass of isophorone diamine, 3.2 pts·mass of di-n-butylamine, 342.0 pts·mass of 2-propanol, and 396.0 pts·mass of toluene. Then, they were reacted with each other at 70° C. for three hours and then diluted with 144.0 pts·mass of toluene and 72.0 pts·mass of 2-propanol. As a result, a solution of a polyurethane polyuria resin (E-1) having an Mw of 54,000 and an acid value of 8 mgKOH/g was obtained.

Resin Synthesis Example 2

In a four-neck flask equipped with an agitator, a thermometer, a reflux condenser, a dropping device, a feeding tube, and a nitrogen feeding tube, 292.1 pts·mass of polycarbonate diol (Kuraray Polyol C-2090 manufactured by Kuraray Co., Ltd.), 44.9 pts·mass of tetrahydro phthalic anhydride (Rikacid TH: manufactured by New Japan Chemical Co., Ltd.), and 350.0 pts·mass of toluene were put. The toluene was used as a solvent. They were heated to 60° C. while stirring them under a nitrogen gas stream, and thereby uniformly dissolved. Next, this flask was heated to 110° C. and its contents were reacted for three hours. After that, the flask was cooled to 40° C. and 62.9 pts·mass of a bisphenol A-type epoxy resin (YD-8125: manufactured by Tohto Chemical Industry CO., Ltd.) and 4.0 pts·mass of triphenyl phosphine were added. The triphenyl phosphine was added as a catalyst. The flask was heated to 110° C. and its contents were reacted for eight hours. After cooled to a room temperature, the resultant solution was adjusted by using toluene so that the solid content was 35%. As a result, a solution of a carboxyl group-containing denatured ester resin (E-2) having an Mw of 25,000 was obtained.

Resin Synthesis Example 3

In a four-neck flask equipped with an agitator, a reflux condenser tube, a nitrogen feeding tube, a thermometer, and a dropping funnel, 98.5 pts·mass of butyl acrylate, 1.5 pts·mass of acrylic acid, and 150.0 pts·mass of ethyl acetate were put. They were heated to 70° C. under nitrogen substitution. Then, polymerization was started by adding 0.15 pts·mass of azobisisobutyronitrile. Three hours after the start of the polymerization, 0.15 pts·mass of azobisisobutyronitrile was added three times at intervals of one hour. Then, the polymerization was carried out for two hours. After that, 150.0 pts·mass of ethyl acetate was added and the polymerization was thereby finished. As a result a solution of an acrylic resin (E-3) having a solid content of 25% and an Mw of 84,000 was obtained.

Example 1-1

Firstly, 100 pts·mass of alumina particles ("AO-502" manufactured by Admatechs Co., Ltd., average primary particle diameter: about 1 μm, average roundness: 0.99), a 4 mass % aqueous solution of polyvinyl alcohol ("Gobsenol NL-05" manufactured by Nippon Synthetic Chemical Industry Co., Ltd.): 125 pts·mass (solid content: 5 pts·mass), and ion-exchanged water: 25 pts·mass were stirred at 1,000 rpm for one hour by using a disper to obtain a slurry thereof.

This slurry was sprayed and dried under a 125° C. atmosphere by using a mini-spray drier ("B-290" manufactured by Nihon-Buchi K.K.). As a result, easily deformable aggregates (D1-1) having an average particle diameter of about 10 μm for which the average compressive force required for a 10% compressive deformation rate was about 0.6 mN and the maintaining rate of the average particle diameter after a shaking test was 97% were obtained.

Example 1-2

Easily deformable aggregates (D1-2) having an average particle diameter of about 20 μm for which the average compressive force required for a 10% compressive deformation rate was about 0.5 mN and the maintaining rate of the average particle diameter after a shaking test was 93% were obtained in a manner similar to that for Example 1-1 except that 100 pts·mass of alumina particles ("CB-P02" manufactured by Showa Denko K.K., average primary particle diameter: about 2 μm, average roundness: 0.98), the aforementioned 4 mass % aqueous solution of polyvinyl alcohol: 50 pts·mass (solid content: 2 pts·mass), and ion-exchanged water: 100 pts·mass were used.

Example 1-3

Easily deformable aggregates (D1-3) having an average particle diameter of about 50 μm for which the average compressive force required for a 10% compressive deformation rate was about 4 mN and the maintaining rate of the average particle diameter after a shaking test was 90% were obtained in a manner similar to that for Example 1-1 except that 100 pts. of alumina particles ("AO-509" manufactured by Admatechs Co., Ltd., average primary particle diameter: about 10 μm, average roundness: 0.99), the aforementioned 4 mass % aqueous solution of polyvinyl alcohol: 12.5 pts·mass (solid content: 0.5 pts·mass), and ion-exchanged water: 137.5 pts·mass were used.

Example 1-4

Easily deformable aggregates (D1-4) having an average particle diameter of about 30 μm for which the average compressive force required for a 10% compressive deformation rate was about 1 mN and the maintaining rate of the average particle diameter after a shaking test was 95% were obtained in a manner similar to that for Example 1-1 except that 70 pts·mass of alumina particles ("AO-502" manufactured by Admatechs Co., Ltd., average primary particle diameter: about 1 μm, average roundness: 0.99), 30 pts·mass of alumina particles ("AO-509" manufactured by Admatechs Co., Ltd., average primary particle diameter: about 10 pin, average roundness: 0.99), the aforementioned 4 mass % aqueous solution of polyvinyl alcohol: 50 pts·mass (solid content: 2 pts·mass), and ion-exchanged water: 100 pts·mass were used.

Example 1-5

Easily deformable aggregates (D1-5) having an average particle diameter of about 15 μm for which the average compressive force required for a 10% compressive deformation rate was about 1 mN and the maintaining rate of the average particle diameter after a shaking test was 97% were obtained in a manner similar to that for Example 1-1 except that 100 pts·mass of an aluminum nitride ("H-grade" manufactured by Tokuyama Corporation, average primary particle diameter: about 1 μm, average roundness: 0.97), the aforementioned 4 mass % aqueous solution of polyvinyl alcohol: 50 pts·mass (solid content: 2 pts·mass), and ion-exchanged water: 100 pts·mass were used.

Example 1-6

Easily deformable aggregates (D1-6) having an average particle diameter of about 40 μm for which the average compressive force required for a 10% compressive deformation rate was about 2 mN and the maintaining rate of the average particle diameter after a shaking test was 92% were obtained in a manner similar to that for Example 1-1 except that 100 pts·mass of alumina particles ("CB-P05" manufactured by Showa Denko K.K., average primary particle diameter: about 5 μm, average roundness: 0.99), a 20 mass % aqueous solution of polyvinyl pyrrolidone ("K-85W" manufactured by Nippon Shokubai Co., Ltd.): 25 pts·mass (solid content: 10 pts·mass), and ion-exchanged water: 125 pts·mass were used.

Example 1-7

Easily deformable aggregates (D1-7) having an average particle diameter of about 20 μm for which the average compressive force required for a 10% compressive deformation rate was about 0.7 mN and the maintaining rate of the average particle diameter after a shaking test was 98% were obtained in a manner similar to that for Example 1-1 except that the amount of the aforementioned 4 mass % aqueous solution of polyvinyl alcohol was 750 pts·mass (solid content: 30 pts·mass) and the amount of the ion-exchanged water was 150 pts·mass.

Example 1-8

Easily deformable aggregates (D1-8) having an average particle diameter of about 5 μm for which the average compressive force required for a 10% compressive deformation rate was about 0.2 mN and the maintaining rate of the average particle diameter after a shaking test was 98% were obtained in a manner similar to that for Example 1-1 except that 100 pts·mass of alumina particles ("ASFP-20" manufactured by Denki Kagaku Kogyo K.K., average primary particle diameter: about 0.3 μm, average roundness: 0.99), the aforementioned 4 mass % aqueous solution of polyvinyl alcohol: 50 pts·mass (solid content: 2 pts·mass), and ion-exchanged water: 100 pts·mass were used.

Example 1-9

Easily deformable aggregates (D1-9) having an average particle diameter of about 20 μm for which the average compressive force required for a 10% compressive deformation rate was about 0.7 mN and the maintaining rate of the average particle diameter after a shaking test was 93% were obtained in a manner similar to that for Example 1-2 except that: a 20 mass % toluene solution of a polyester resin (Vylon 200 manufactured by Toyobo Co., Ltd.): 10 pts·mass (solid content: 2 pts·mass) was used instead of the aforementioned 4 mass % aqueous solution of polyvinyl alcohol; 140 pts·mass of toluene was used instead of the ion-exchanged water, and the temperature of the splaying and drying process was changed from 125° C. to 140° C.

Example 1-10

Easily deformable aggregates (D1-10) having an average particle diameter of about 20 μm for which the average compressive force required for a 10% compressive deformation rate was about 0.5 mN and the maintaining rate of the average particle diameter after a shaking test was 93% were obtained in a manner similar to that for Example 1-2 except that: a 20 mass % toluene solution of a polyurethane resin (Vylon UR-1400 manufactured by Toyobo Co., Ltd.): 10 pts·mass (solid content: 2 pts·mass) was used instead of the aforementioned 4 mass % aqueous solution of polyvinyl alcohol; 140 pts·mass of toluene was used instead of the ion-exchanged water; and the temperature of the splaying and drying process was changed from 125° C. to 140° C.

Example 1-11

After a slurry was obtained in a manner similar to that for Example 1-2, the obtained slurry was dried while being stirred by using a high-speed mixer ("LFS-2" manufactured by Earthtechnica Co., Ltd.) and the moisture was thereby removed. As a result, easily deformable aggregates (D1-11) having an average particle diameter of about 100 μm for which the average compressive force required for a 10% compressive deformation rate was about 4 mN and the maintaining rate of the average particle diameter after a shaking test was 97% were obtained.

Example 1-12

Easily deformable aggregates (D1-12) having an average particle diameter of about 50 μm for which the average compressive force required for a 10% compressive deformation rate was about 0.4 mN and the maintaining rate of the average particle diameter after a shaking test was 92% were obtained in a manner similar to that for Example 1-1 except that 100 pts·mass of alumina particles ("CB-P02" manufactured by Showa Denko K.K., average primary particle diameter: about 2 μm, average roundness: 0.98), the aforementioned 4 mass % aqueous solution of polivinyl alcohol: 25 pts·mass (solid content: 1 pts·mass), and ion-exchanged water: 100 pts·mass were used.

Comparative Example 1-13

To obtain easily deformable aggregates, processes similar to those for Example 1-2 were carried out by using the aforementioned 4 mass % aqueous solution of polivinyl alcohol for the alumina particles except that alumina particles ("CB-A20S" manufactured by Showa Denko K.K., average primary particle diameter: about 20 μm, average roundness: 0.98, average compressive force required for 10% compressive deformation rate: about 220 mN) were used instead of the alumina particles "CB-P02". However, they were easily disintegrated and a generated substance (D'1-13), which did not have a form of aggregates, was obtained.

Comparative Example 1-14

To obtain easily deformable aggregates, processes similar to those for Example 1-1 were carried out except that no polivinyl alcohol was used and the amount of the ion-exchanged water was 150 pts·mass. However, they were easily disintegrated and a generated substance (D'1-14), which did not have a form of aggregates, was obtained.

Comparative Example 1-15

Easily deformable aggregates (D'1-15) having an average particle diameter of about 20 μm for which the average compressive force required for a 10% compressive deformation rate was about 0.8 mN and the maintaining rate of the average particle diameter after a shaking test was 97% were obtained in a manner similar to that for Example 1-1 except that the amount of the 4 mass % aqueous solution of polyvinyl alcohol was 1,250 pts·mass (solid content: 50 pts·mass) and the amount of the ion-exchanged water was 50 pts·mass.

Comparative Example 1-16

A slurry was obtained in a manner similar to that for Example 1-1 except that: the 4 mass % aqueous solution of polyvinyl alcohol was not used; a silane coupling agent ("KBM-04" manufactured by Shin-Etsu Chemical Co., Ltd.) and tetramethoxy silane (10 mass % solution): 20 pts·mass (solid content: 2 pts·mass) were used; and the amount of the ion-exchanged water was 130 pts·mass. Then, this slurry was sprayed, dried, and cured under a 125° C. atmosphere. As a result, easily deformable aggregates (D'1-16) having an average particle diameter of about 15 μm for which the average compressive force required for a 10% compressive deformation rate was about 42 mN and the maintaining rate of the average particle diameter after a shaking test was 75% were obtained.

Comparative Example 1-17

A slurry was obtained in a manner similar to that for Comparative Example 16. Then, after spraying and drying the aforementioned slurry under a 125° C. atmosphere, the resultant substance was sintered at 2,100° C., which was equal to or higher than the melting point of alumina. As a result, easily deformable aggregates (D'1-17) having an average particle diameter of about 15 μm for which the average compressive force required for a 10% compressive deformation rate was about 200 mN and the maintaining rate of the average particle diameter after a shaking test was 98% were obtained.

Comparative Example 1-18

A slurry was obtained in a manner similar to that for Example 1-3. To obtain easily deformable aggregates, this slurry was sprayed and dried under a 125° C. atmosphere and then heated to 800° C., which was equal to or higher than the decomposition temperature of the organic binding agent. However, they were easily disintegrated and a generated substance (D'1-18), which did not have a form of aggregates, was obtained.

Comparative Example 1-19

Easily deformable aggregates (D'1-19) having an average particle diameter of about 30 μm for which the average compressive force required for a 10% compressive deformation rate was about 15 mN and the maintaining rate of the average particle diameter after a shaking test was 50% were obtained by using the aforementioned 4 mass % aqueous solution of polivinyl alcohol for the alumina particles in a manner similar to that for Example 1-2 except that plate-shaped alumina ("Seraph 05025 manufactured by Kinsei Matec Co., Ltd., average roundness: 0.5) was used instead of the alumina particles "CB-P02".

Comparative Example 1-20

To obtain easily deformable aggregates, processes similar to those for Example 1-1 were carried out except that 100 pts·mass of alumina particles ("AL-33" manufactured by Sumitomo Chemical Co., Ltd., average primary particle diameter: about 12 μm, average roundness: 0.9), 2 pts·mass of an epoxy resin composition ("Epicoat 1010" manufactured by Japan Epoxy Resins Co., Ltd.), and toluene: 148 pts·mass were used. However, they were easily disintegrated and a generated substance (D'1-20), which did not have a form of aggregates, was obtained.

Tables 1-1 to 1-4 show the key manufacturing conditions and the evaluation results of Examples 1-1 to 1-12 and Comparative Examples 1-13 to 1-20.

As shown in Tables 1-1 to 1-4, the average primary particle diameter of the thermally conductive particles (A) needs to be equal to or less than 10 μm and the use of the organic binding agent (B) is necessary in order to generate aggregates. As can be seen from Comparative Examples 1-16 and 1-17, when the thermally conductive particles (A) are strongly bound with each other by using, for example, a silane coupling agent as the organic binding agent and/or performing the sintering at a temperature equal to or higher than the melting point of alumina, the easy deformability becomes poor.

Example 1-101

Firstly, 37.1 pts·mass of easily deformable aggregates (D1-1) obtained in Example 1-1 (average particle diameter 10 μm), 31.5 pts·mass of a 25% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H1-1) including a thermally conductive layer having a thickness of 50 μm was obtained. Its thermal conductivity was 3 (W/m·K).

Example 1-102

A release-treated sheet was placed over the thermally conductive layer of the thermally conductive member (H1-1) obtained in Example 1-101, and then the laminated body was pressed under a pressure of 2 MPa at 150° C. for one hour. As a result, a thermally conductive member (I1-2) that includes a thermally conductive layer having a thickness of 45 μm, contains easily deformable aggregates in 50 vol %, and has a thermal conductivity of 6.5 (W/m·K) was obtained.

Example 1-103

Firstly, 40.5 pts·mass of easily deformable aggregates (D1-2) obtained in Example 1-2 (average particle diameter 20 μm), 18.0 pts·mass of a 25% toluene/2-propanol solution of a polyurethane polyurea resin (E-1) obtained in Resin Synthesis Example 1, and 1.8 pts·mass of a 50% MEK solution of Epicoat 1031S (manufactured by Japan Epoxy Resins Co., Ltd.) were stirred by using a disper. The 50% MEK solution of Epicoat 1031S was used as a curing agent. Then, after its viscosity was adjusted by 8.3 pts·mass of isopropyl alcohol and 33.4 pts·mass of toluene, ultrasound defoaming was performed. As a result, a thermally conductive resin composition containing easily deformable aggregates in 70 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H1-3) that includes a thermally conductive layer having a thickness of 65 μm and has a thermal conductivity of 3 (W/m·K) was obtained. Further, a release-treated sheet was placed over the thermally conductive layer of the obtained thermally conductive member, and then the laminated body was pressed under a pressure of 2 MPa at 150° C. for one hour. As a result, a thermally conductive member (I1-3) that includes a thermally conductive layer having a thickness of 60 μm and has a thermal conductivity of 10 (W/m·K) was obtained.

Example 1-104

Firstly, 32.4 pts·mass of easily deformable aggregates (D1-3) obtained in Example 1-3 (average particle diameter 50 μm), 50.4 pts·mass of a 25% toluene/2-propanol solution of a polyurethane polyurea resin (E-1) obtained in Resin Synthesis Example 1, and 5.0 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 40 vol % was obtained.

By using the obtained thermally conductive resin composition, a thermally conductive member (H1-4) that includes a thermally conductive layer having a thickness of 65 μm and has a thermal conductivity of 2.5 (W/m·K) was obtained in a manner similar to that for Example 1-103. Further, a thermally conductive member (I1-4) that includes a thermally conductive layer having a thickness of 60 μm and has a thermal conductivity of 5.5 (W/m·K) was obtained in a similar manner.

Example 1-105

Firstly, 36.0 pts·mass of easily deformable aggregates (D1-4) obtained in Example 1-4 (average particle diameter 30 μm), 36.0 pts·mass of a 25% toluene solution of a carboxyl group-containing denatured ester resin (E-2) obtained in Resin Synthesis Example 2, and 1 pts·mass of Chemitight PZ (manufactured by Nippon Shokubai Co., Ltd.) were mixed and stirred by using a disper. The Chemitight PZ was used as a thermally-curing assistant agent. Then, after its viscosity was adjusted by 5.8 pts·mass of isopropyl alcohol and 23.2 pts·mass of toluene, ultrasound defoaming was performed. As a result, a thermally conductive resin composition containing easily deformable aggregates in 50 vol % was obtained.

By using the obtained thermally conductive resin composition, a thermally conductive member (H1-5) that includes a thermally conductive layer having a thickness of 50 μm and has a thermal conductivity of 2.8 (W/m·K) was obtained in a manner similar to that for Example 1-103. Further, a thermally conductive member (I1-5) that includes a thermally conductive layer having a thickness of 45 μm and has a thermal conductivity of 7 (W/m·K) was obtained in a similar manner.

Example 1-106

Firstly, 22.0 pts·mass of easily deformable aggregates (D1-5) obtained in Example 1-5 (average particle diameter 15 μm), 68.8 pts·mass of a 25% toluene solution of a carboxyl group-containing denatured ester resin (E-2) obtained in Resin Synthesis Example 2, and 1.72 pts·mass of Chemitight PZ (manufactured by Nippon Shokubai Co., Ltd.), which was used as a thermally-curing assistant agent, were mixed and stirred by using a disper. Then, after its viscosity was adjusted by 11.0 pts·mass of methyl ethyl ketone (MEK), ultrasound defoaming was performed. As a result, a thermally conductive resin composition containing easily deformable aggregates in 25 vol % was obtained.

By using the obtained thermally conductive resin composition, a thermally conductive member (H1-6) that includes a thermally conductive layer having a thickness of 50 μm and has a thermal conductivity of 0.9 (W/m·K) was obtained in a manner similar to that for Example 1-103. Further, a thermally conductive member (I1-6) that includes a thermally conductive layer having a thickness of 45 μm and has a thermal conductivity of 1.5 (W/m·K) was obtained in a similar manner.

Example 1-107

Firstly, 42.3 pts·mass of easily deformable aggregates (D1-7) obtained in Example 1-7 (average particle diameter 20 μm), 10.8 pts·mass of a 25% toluene solution of a carboxyl group-containing denatured ester resin (E-2) obtained in Resin Synthesis Example 2, and 0.3 pts·mass of Chemitight PZ (manufactured by Nippon Shokubai Co., Ltd.), which was used as a thermally-curing assistant agent, were mixed and stirred by using a disper. Then, after its viscosity was adjusted by 9.5 pts·mass of isopropyl alcohol and 37.8 pts·mass of toluene, ultrasound defoaming was performed. As a result, a thermally conductive resin composition containing easily deformable aggregates in 80 vol % was obtained.

By using the obtained thermally conductive resin composition, a thermally conductive member (H1-7) that includes a thermally conductive layer having a thickness of 50 μm and has a thermal conductivity of 3 (W/m·K) was obtained in a manner similar to that for Example 1-103. Further, a thermally conductive member (I1-7) that includes a thermally conductive layer having a thickness of 45 μm and has a thermal conductivity of 12 (W/m·K) was obtained in a similar manner.

Example 1-108

Firstly, 36.0 pts·mass of easily deformable aggregates (D1-8) obtained in Example 1-8 (average particle diameter 5 μm), 36.0 pts·mass of a 25% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 50 vol % was obtained.

By using the obtained thermally conductive resin composition, a thermally conductive member (H1-8) that includes a thermally conductive layer having a thickness of 45 μm and has a thermal conductivity of 2.3 (W/m·K) was obtained in a manner similar to that for Example 1-103. Further, a thermally conductive member (I1-8) that includes a thermally conductive layer having a thickness of 40 μm and has a thermal conductivity of 5 (W/m·K) was obtained in a similar manner.

Example 1-109

Firstly, 38.3 pts·mass of easily deformable aggregates (D1-9) obtained in Example 1-109 (average particle diameter 20 μm) and 13.8 pts·mass of an aqueous emulsion resin (Polysol AX-590 manufactured by Showa Denko K.K., solid content 49%) were mixed and stirred by using a disper. Then, after its viscosity was adjusted by 48.0 pts·mass of water, ultrasound defoaming was performed. As a result, a thermally conductive resin composition containing easily deformable aggregates in 60 vol % was obtained.

By using the obtained thermally conductive resin composition, a thermally conductive member (H1-9) that includes a thermally conductive layer having a thickness of 50 μm and has a thermal conductivity of 1.2 (W/m·K) was obtained in a manner similar to that for Example 1-3. Further, a thermally conductive member (I1-9) that includes a thermally conductive layer having a thickness of 45 μm and has a thermal conductivity of 2.9 (W/m·K) was obtained in a similar manner.

Example 1-110

Firstly, 36.0 pts·mass of easily deformable aggregates (D1-10) obtained in Example 1-10 (average particle diameter 20 μm) and 16.4 pts·mass of an aqueous emulsion resin (Polysol AD-11 manufactured by Showa Denko K.K., solid content 55%) were mixed and stirred by using a disper. Then, after its viscosity was adjusted by 47.6 pts·mass of water, ultrasound defoaming was performed. As a result, a thermally conductive resin composition containing easily deformable aggregates in 50 vol % was obtained.

By using the obtained thermally conductive resin composition, a thermally conductive member (H1-10) that includes a thermally conductive layer having a thickness of 50 μm and has a thermal conductivity of 1 (W/m·K) was obtained in a manner similar to that for Example 1-103. Further, a thermally conductive member (I1-10) that includes a thermally conductive layer having a thickness of 45 μm and has a thermal conductivity of 2.5 (W/m·K) was obtained in a similar manner.

Example 1-111

Firstly, 7.4 pts·mass of easily deformable aggregates (D1-1) obtained in Example 1-1 (average particle diameter 10 μm), 29.7 pts·mass of spherical alumina having an average primary particle diameter of 20 μm (CB-P20 manufactured by Showa Denko K.K.), 31.5 pts·mass of a 25% toluene solution of a carboxyl group-containing denatured ester resin (E-2) obtained in Resin Synthesis Example 2, and 3.2 pts·mass of a 50% MEK solution of a bisphenol A-type epoxy resin ("Epicoat 1001" manufactured by Japan Epoxy Resins Co., Ltd.), which was used as a curing agent, were stirred by using a disper. Then, after its viscosity was adjusted by 0.4 pts·mass of isopropyl alcohol and 1.6 pts·mass of toluene, ultrasound defoaming was performed. As a result, a thermally conductive resin composition containing easily deformable aggregates in 55 vol % was obtained.

By using the obtained thermally conductive resin composition, a thermally conductive member (H1-11) that includes a thermally conductive layer having a thickness of 45 μm and has a thermal conductivity of 2.8 (W/m·K) was obtained in a manner similar to that for Example 1-103. Further, a thermally conductive member (I1-11) that includes a thermally conductive layer having a thickness of 40 μm and has a thermal conductivity of 6.5 (W/m·K) was obtained in a similar manner.

Example 1-112

Firstly, 19.2 pts·mass of easily deformable aggregates (D1-2) obtained in Example 1-2 (average particle diameter 20 μm), 19.2 pts·mass of spherical alumina having an average primary particle diameter of 10 μm ("AO-509" manufactured by Admatechs Co., Ltd.), 26.1 pts·mass of a 25% toluene/2-propanol solution of a polyurethane polyurea resin (E-1) obtained in Resin Synthesis Example 1, and 2.6 pts·mass of Chemitight PZ (manufactured by Nippon Shokubai Co., Ltd.), which was used as a thermally-curing assistant agent, were stirred by using a disper. Then, after its viscosity was adjusted by 3.3 pts·mass of isopropyl alcohol and 13.2 pts·mass of toluene, ultrasound defoaming was performed. As a result, a thermally conductive resin composition containing easily deformable aggregates in 60 vol % was obtained.

By using the obtained thermally conductive resin composition, a thermally conductive member (H1-12) that includes a thermally conductive layer having a thickness of 45 μm and has a thermal conductivity of 2.9 (W/m·K) was obtained in a manner similar to that for Example 1-103. Further, a thermally conductive member (I1-12) that includes a thermally conductive layer having a thickness of 40 μm and has a thermal conductivity of 7.5 (W/m·K) was obtained in a similar manner.

Example 1-113

Firstly, 34.0 pts·mass of easily deformable aggregates (D1-2) obtained in Example 1-2 (average particle diameter 20 μm), 64.0 pts·mass of a 25% ethyl acetate solution of an acrylic resin (E-3) obtained in Resin Synthesis Example 3, and 0.8 pts·mass of an epoxy-based curing agent Tetrad-X (manufactured by Mitsubishi Gas Chemical Company, Inc.), which was used as a curing agent, were stirred by using a disper. Then, after its viscosity was adjusted by 2.8 pts·mass of toluene, ultrasound defoaming was performed. As a result, a thermally conductive resin composition containing easily deformable aggregates in 35 vol % was obtained.

The obtained thermally conductive composition was uniformly applied on a release-treated polyester film and dried thereon. As a result, an adhesive thermally conductive layer having a thickness of 50 μm was provided. Next, a pressure-sensitive adhesive sheet was obtained by laminating another release-treated polyester film on the pressure-sensitive adhesive layer side of the original release-treated polyester film. The thermal conductivity of this thermally conductive member (H1-13) was 2 (W/m·K).

Example 1-114

Firstly, 61.6 pts·mass of easily deformable aggregates (D1-6) obtained in Example 1-6 (average particle diameter 40 μm), 18.7 pts·mass of a polyester urethane resin Vylon UR6100 (manufactured by Toyobo Co., Ltd.), and 0.08 pts·mass of an epoxy-based curing agent Tetrad-X (manufactured by Mitsubishi Gas Chemical Company, Inc.), which was used as a curing agent, were stirred by using a disper. Then, after its viscosity was adjusted by 20.0 pts·mass of toluene, ultrasound defoaming was performed. As a result, a thermally conductive resin composition containing easily deformable aggregates in 65 vol % was obtained.

By using the obtained thermally conductive resin composition, a thermally conductive member (H1-14) that includes a thermally conductive layer having a thickness of 110 μm and has a thermal conductivity of 2.8 (W/m·K) was obtained in a manner similar to that for Example 1-103. Further, a thermally conductive member (I1-14) that includes a thermally conductive layer having a thickness of 100 μm and has a thermal conductivity of 6.5 (W/m·K) was obtained in a similar manner.

Example 1-115

Firstly, 37.1 pts·mass of easily deformable aggregates (D1-11) obtained in Example 1-11 (average particle diameter 100 μm), 31.5 pts·mass of a 25% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 70 vol % was obtained.

By using the obtained thermally conductive resin composition, a thermally conductive member (H1-15) that includes a thermally conductive layer having a thickness of 130 μm and has a thermal conductivity of 2.7 (W/m·K) was obtained in a manner similar to that for Example 1-103. Further, a thermally conductive member (I1-15) that includes a thermally conductive layer having a thickness of 120 μm and has a thermal conductivity of 6 (W/m·K) was obtained in a similar manner.

Example 1-116

Firstly, 37.1 pts·mass of easily deformable aggregates (D1-12) obtained in Example 1-12 (average particle diameter 50 μm), 31.5 pts·mass of a 25% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H1-16) that includes a thermally conductive layer having a thickness of 50 μm and has a thermal conductivity of 3 (W/m·K) was obtained. Further, a release-treated sheet was placed over the obtained thermally conductive member (H1-16), and then the laminated body was pressed under a pressure of 2 MPa at 150° C. for one hour. As a result, a thermally conductive member (I1-16) that includes a thermally conductive layer having a thickness of 45 μm and has a thermal conductivity of 9 (W/m·K) was obtained.

Example 1-117

The thermally conductive resin composition obtained in Example 1-116 was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H1-17) that includes a thermally conductive layer having a thickness of 100 μm and has a thermal conductivity of 2.4 (W/m·K) was obtained. Further, a release-treated sheet was placed over the obtained thermally conductive member (H1-17), and then the laminated body was pressed under a pressure of 2 MPa at 150° C. for one hour. As a result, a thermally conductive member (I1-17) that includes a thermally conductive layer having a thickness of 90 μm and has a thermal conductivity of 6.5 (W/m·K) was obtained.

Example 1-118

The thermally conductive resin composition obtained in Example 1-116 was applied to a release-treated sheet (moldrelease-treated polyethylene terephthalate film having a thickness of 75 μm) by using a comma coater and then the coated release-treated sheet was heated and dried at 100° C. for two minutes. As a result, a thermally conductive member (H1-18) that includes a thermally conductive layer having a thickness of 300 μm and has a thermal conductivity of 1.8 (W/m·K) was obtained. Further, a release-treated sheet was placed over the obtained thermally conductive member (H1-18), and then the laminated body was pressed under a pressure of 2 MPa at 150° C. for one hour. As a result, a thermally conductive member (I1-18) that includes a thermally conductive layer having a thickness of 290 μm and has a thermal conductivity of 2.5 (W/m·K) was obtained.

Example 1-119

Firstly, 56.5 pts·mass of easily deformable aggregates (D1-5) obtained in Example 1-5 (average particle diameter 15 μm) and 43.5 pts·mass of a polystyrene resin PSJ Polystyrene 679 (manufactured by PS Japan Corporation), which was used as a thermoplastic resin, were stirred and mixed. Then, the resultant substance was melted and kneaded at 200° C. by using a twin-screw extruder. Then, after producing a thermally conductive resin composition containing easily deformable aggregates in 25 vol %, a highly thermally conductive member (I1-19) that includes a thermally conductive layer having a thickness of 1 mm and has a thermal conductivity of 10 (W/m·K) was molded by using an injection molding machine (IS-100F manufactured by Toshiba Machine Co., Ltd.).

Example 1-120

Firstly, 94.0 pts·mass of easily deformable aggregates (D1-7) obtained in Example 1-7 (average particle diameter 20 μm) and 6.0 pts·mass of ethylene-methacrylic acid copolymer were mixed and the mixture was put into a mold. After degasing it, a load of 3 MPa was applied and the mixture was thereby pressed and compacted at 150° C. for one hour. As a result, a highly thermally conductive member (I1-20) that includes a thermally conductive layer having a thickness of 500 μm, contains easily deformable aggregates in 80 vol %, and has a thermal conductivity of 6 (W/m·K) was obtained.

Example 1-121

Firstly, 72.0 pts·mass of easily deformable aggregates (D1-9) obtained in Example 1-9 (average particle diameter 20 μm) and 28.0 pts·mass of a high-density polyethylene resin Hizox 2100J (manufactured by Sumitomo Mitsui Polyolefin Co., Ltd.) were mixed, and the mixture was heated and mixed by using a mixing/kneading machine. After the resultant substance was cooled and pulverized, the pulverized substance was extruded by an extrusion machine. As a result, a highly thermally conductive member (I1-21), which was in the form of pellets, was obtained and the obtained thermally conductive member (I1-21) contained easily deformable aggregates in 40 vol % and had a thermal conductivity of 3.5 (W/m·k).

Comparative Example 1-101

Firstly, 36.0 pts·mass of a spherical aluminum oxide powder having an average primary particle diameter of 1 μm (AO-502 manufactured by Admatechs Co., Ltd.), 36.0 pts·mass of a 25% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.) were stirred by using a disper. The bisphenol A-type epoxy resin Epicoat 1001 was used as a curing agent. Then, after its viscosity was adjusted by 5.7 pts·mass of isopropyl alcohol and 22.7 pts·mass of toluene, ultrasound defoaming was performed. As a result, a resin composition containing an aluminum oxide in 50 vol % was obtained.

The obtained resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H'1-1) that includes a thermally conductive layer having a thickness of 50 μm and has a thermal conductivity of 0.5 (W/m·K) was obtained. Further, a release-treated sheet was placed over the obtained thermally conductive member (H'1-1), and then the laminated body was pressed under a pressure of 2 MPa at 150° C. for one hour. As a result, a sheet having a thickness of 45 μm was obtained. This sheet has a low thermal conductivity of 0.8 (W/m·K).

Comparative Example 1-102

Firstly, 36.0 pts·mass of a spherical aluminum oxide powder having an average primary particle diameter of 20 μm (CB-P20 manufactured by Showa Denko K.K.), 36.0 pts·mass of a 25% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of isopropyl alcohol and 22.7 pts·mass of toluene, ultrasound defoaming was performed. As a result, a resin composition containing an aluminum oxide in 50 vol % was obtained.

By using the obtained resin composition, a thermally conductive member (H'1-2) that includes a thermally conductive layer having a thickness of 50 μm and has a thermal conductivity of 0.4 (W/m·K) was obtained in a manner similar to that for Comparative Example 1-101. Further, a thermally conductive member (I'1-2) having a thickness of 45 μm and a thermal conductivity of 0.7 (W/m·K) was obtained in a similar manner.

Comparative Example 1-103

Firstly, 36.0 pts·mass of a generated substance (D'1-13) manufactured in Comparative Example 1-13 (in which no aggregates were formed), 36.0 pts·mass of a 25% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of isopropyl alcohol and 22.7 pts·mass of toluene, ultrasound defoaming was performed. As a result, a resin composition containing non-aggregates in 50 vol % was obtained.

By using the obtained resin composition, a thermally conductive member (H'1-3) that includes a thermally conductive layer having a thickness of 60 μm and has a thermal conductivity of 0.4 (W/m·K) was obtained in a manner similar to that for Comparative Example 1-101. Further, a thermally conductive member (I'1-3) having a thickness of 50 μm and a thermal conductivity of 0.7 (W/m·K) was obtained in a similar manner.

Comparative Example 1-104

Firstly, 36.0 pts·mass of a generated substance (D'1-14) manufactured in Comparative Example 1-14 (in which no aggregates were formed), 36.0 pts·mass of a 25% toluene/ 2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of isopropyl alcohol and 22.7 pts·mass of toluene, ultrasound defoaming was performed. As a result, a resin composition containing non-aggregates in 50 vol % was obtained.

By using the obtained resin composition, a thermally conductive member (H'1-4) that includes a thermally conductive layer having a thickness of 50 μm and has a thermal conductivity of 0.5 (W/m·K) was obtained in a manner similar to that for Comparative Example 1-101. Further, a thermally conductive member (I'1-4) having a thickness of 45 μm and a thermal conductivity of 0.8 (W/m·K) was obtained in a similar manner.

Comparative Example 1-105

Firstly, 38.3 pts·mass of aggregates (D'1-15) obtained in Comparative Example 1-15 (average particle diameter 20 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing aggregates in 60 vol % was obtained.

By using the obtained resin composition, a thermally conductive member (H'1-5) that includes a thermally conductive layer having a thickness of 60 μm and has a thermal conductivity of 0.1 (W/m·K) was obtained in a manner similar to that for Comparative Example 1-101. Further, a thermally conductive member (I'1-5) having a thickness of 50 μm and a thermal conductivity of 0.3 (W/m·K) was obtained in a similar manner.

Comparative Example 1-106

Firstly, 38.3 pts·mass of aggregates (D'1-16) obtained in Comparative Example 1-16 (average particle diameter 15 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing aggregates in 60 vol % was obtained.

By using the obtained resin composition, a thermally conductive member (H'1-6) that includes a thermally conductive layer having a thickness of 60 μm and has a thermal conductivity of 0.2 (W/m·K) was obtained in a manner similar to that for Comparative Example 1-101. Further, a thermally conductive member (I'1-6) having a thickness of 50 μm and a thermal conductivity of 0.4 (W/m·K) was obtained in a similar manner. A lot of cracks caused by crushes of particles were observed in this sheet.

Comparative Example 1-107

Firstly, 38.3 pts·mass of aggregates (D'1-17) obtained in Comparative Example 1-17 (average particle diameter 15 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing aggregates in 60 vol % was obtained.

By using the obtained resin composition, a thermally conductive member (H'1-7) that includes a thermally conductive layer having a thickness of 60 μm and has a thermal conductivity of 0.3 (W/m·K) was obtained in a manner similar to that for Comparative Example 1-101. Further, a thermally conductive member (I'1-7) having a thickness of 50 μm and a thermal conductivity of 0.5 (W/m·K) was obtained in a similar manner.

Comparative Example 1-108

Firstly, 38.3 pts·mass of a generated substance (D'1-18) manufactured in Comparative Example 1-18 (in which no aggregates were formed), 27.0 pts·mass of a 25% toluene solution of a carboxyl group-containing denatured ester resin (E-2) obtained in Resin Synthesis Example 2, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing non-aggregates in 60 vol % was obtained.

By using the obtained resin composition, a thermally conductive member (H'1-8) that includes a thermally conductive layer having a thickness of 60 μm and has a thermal conductivity of 0.7 (W/m·K) was obtained in a manner similar to that for Comparative Example 1-101. Further, a thermally conductive member (I'1-8) having a thickness of 50 μm and a thermal conductivity of 0.9 (W/m·K) was obtained in a similar manner.

Comparative Example 1-109

Firstly, 38.3 pts·mass of aggregates (D'1-19) obtained in Comparative Example 1-19 (average particle diameter 30 in), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing aggregates in 60 vol % was obtained.

By using the obtained resin composition, a thermally conductive member (H'1-9) that includes a thermally conductive layer having a thickness of 60 μm and has a thermal conductivity of 0.1 (W/m·K) was obtained in a manner similar to that for Comparative Example 1-101. Further, a thermally conductive member (I'1-9) having a thickness of 50 μm and a thermal conductivity of 0.3 (W/m·K) was obtained in a similar manner.

Comparative Example 1-110

Firstly, 38.3 pts·mass of a generated substance (D'1-20) manufactured in Comparative Example 1-20 (in which no aggregates were formed), 27.0 pts·mass of a 25% toluene solution of a carboxyl group-containing denatured ester resin (E-2) obtained in Resin Synthesis Example 2, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing non-aggregates in 60 vol % was obtained.

By using the obtained resin composition, a thermally conductive member (H'1-10) that includes a thermally conductive layer having a thickness of 60 μm and has a thermal conductivity of 0.7 (W/m·K) was obtained in a manner similar to that for Comparative Example 1-101. Further, a thermally conductive member (I'1-10) having a thickness of 50 μm and a thermal conductivity of 0.9 (W/m·K) was obtained in a similar manner.

Comparative Example 1-111

Firstly, 14.4 pts·mass of aggregates (D1-1) obtained in Example 1 (average particle diameter 10 μm), 82.6 pts·mass of a 25% toluene solution of a carboxyl group-containing denatured ester resin (E-2) obtained in Resin Synthesis Example 2, and 8.3 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 6.6 pts·mass of MEK, ultrasound defoaming was performed. As a result, a resin composition containing aggregates in 15 vol % was obtained.

By using the obtained resin composition, a thermally conductive member (H'1-11) that includes a thermally conductive layer having a thickness of 40 μm and has a thermal conductivity of 0.1 (W/m·K) was obtained in a manner similar to that for Comparative Example 1-101. Further, a thermally conductive member (I'1-11) having a thickness of 35 μm and a thermal conductivity of 0.3 (W/m·K) was obtained in a similar manner.

Comparative Example 1-112

Firstly, 44.0 pts·mass of aggregates (D1-1) obtained in Example 1 (average particle diameter 10 μm), 4.0 pts·mass of a 25% toluene solution of a carboxyl group-containing denatured ester resin (E-2) obtained in Resin Synthesis Example 2, and 0.4 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 52.1 pts·mass of MEK, ultrasound defoaming was performed. As a result, a resin composition containing aggregates in 92 vol % was obtained.

The obtained resin was used to manufacture a sheet-like thermally-conductive member in a manner similar to that for Comparative Example 1-101. However, no film was formed.

Comparative Example 1-113

Firstly, 38.3 pts·mass of easily deformable aggregates (D1-10) obtained in Example 1-10 (average particle diameter 20 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of isopropyl alcohol and 28.0 pts·mass of toluene, ultrasound defoaming was performed. As a result, a resin composition containing aggregates in 60 vol % was obtained.

By using the obtained resin composition, a thermally conductive member (H'1-13) that includes a thermally conductive layer having a thickness of 40 μm and has a thermal conductivity of 0.5 (W/m·K) was obtained in a manner similar to that for Comparative Example 1-101. Further, a thermally conductive member (I'1-13) having a thickness of 35 μm and a thermal conductivity of 0.8 (W/m·K) was obtained in a similar manner.

Tables 1-5 to 1-8 show the key manufacturing conditions and the evaluation results of Examples 1-101 to 1-118 and Comparative Examples 1-101 to 1-113.

The solvents (F) in the tables indicate only the substances that were added as a solvent.

In the tables, data of average particle diameters/film thicknesses in the thermally conductive layers of the thermally conductive members (H) are also shown.

As shown in Tables 1-5 to 1-8, a thermally conductive resin composition (G) according to the present invention can provide a thermally conductive member (I) having an excellent thermal conductivity. As can be seen from Comparative Examples 1-101 to 1-110, resin compositions that do not include any easily deformable aggregates (D) in the thermally conductive resin compositions (G) cannot achieve a satisfactory thermal conductivity. As can be seen from Comparative Example 1-111, when the amount of the easily deformable aggregates (D) in the composition is insufficient, a satisfactory thermal conductivity may not be achieved. As can be seen from Comparative Example 1-112, when the amount of the easily deformable aggregates (D) in the composition is too large, no film may be formed. As can be seen from Comparative Example 1-113, when the aggregates are disintegrated during the resin composition manufacturing process, a satisfactory thermal conductivity cannot be achieved.

Example 2-1

Alumina particles ("AO-502" manufactured by Admatechs Co., Ltd., average primary particle diameter: about 1 μm, average roundness: 0.99): 100 pts·mass, a 4 mass % aqueous solution of poly(ethylene imine) having an Mw of 1,800: 125 pts·mass (solid content: 5 pts·mass), and ion-exchanged water: 25 pts·mass were stirred at 1,000 rpm for one hour by using a disper to obtain a slurry thereof.

This slurry was sprayed and dried under a 125° C. atmosphere by using ("B-290" manufactured by Nihon-Buchi K.K.). As a result, easily deformable aggregates (D2-1) having an average particle diameter of about 10 μm for which the average compressive force required for a 10% compressive deformation rate was about 0.4 mN and the maintaining rate of the average particle diameter after a shaking test was 95% were obtained.

Example 2-2

Easily deformable aggregates (D2-2) having an average particle diameter of about 15 μm for which the average compressive force required for a 10% compressive deformation rate was about 0.3 mN and the maintaining rate of the average particle diameter after a shaking test was 92% were obtained in a manner similar to that for Example 2-1 except that alumina particles ("CB-P02" manufactured by Showa Denko K.K., average primary particle diameter: about 2 μm, average roundness: 0.98): 100 pts·mass, a 4 mass % aqueous solution of poly(allylamine) having an Mw of 5,000: 50 pts·mass (solid content: 2 pts·mass), and ion-exchanged water: 100 pts·mass were used.

Example 2-3

Easily deformable aggregates (D2-3) having an average particle diameter of about 40 μm for which the average compressive force required for a 10% compressive deformation rate was about 3.2 mN and the maintaining rate of the average particle diameter after a shaking test was 90% were obtained in a manner similar to that for Example 2-1 except that alumina particles ("AO-509" manufactured by Admatechs Co., Ltd., average primary particle diameter: about 10 μm, average roundness: 0.99): 100 pts., a 4 mass % aqueous solution of poly(diallylamine) hydrochloride having an Mw of 50,000: 12.5 pts·mass (solid content: 0.5 pts·mass), and ion-exchanged water: 137.5 pts·mass were used.

Example 2-4

Easily deformable aggregates (D2-4) having an average particle diameter of about 15 μm for which the average compressive force required for a 10% compressive deformation rate was about 2 mN and the maintaining rate of the average particle diameter after a shaking test was 96% were obtained in a manner similar to that for Example 2-1 except that an aluminum nitride ("H-grade" manufactured by Tokuyama Corporation, average primary particle diameter: about 1 μm, average roundness: 0.97): 100 pts·mass, a 4 mass % aqueous solution of poly(N-isopropyl acrylamide) having an Mw of 10,000: 50 pts·mass (solid content: 2 pts·mass), and ion-exchanged water: 100 pts·mass were used.

Example 2-5

Easily deformable aggregates (D2-5) having an average particle diameter of about 30 μm for which the average compressive force required for a 10% compressive deformation rate was about 1 mN and the maintaining rate of the average particle diameter after a shaking test was 92% were obtained in a manner similar to that for Example 2-1 except that alumina particles ("CB-P05" manufactured by Showa Denko K.K., average primary particle diameter: about 5 μm, average roundness: 0.99): 100 pts·mass, a 20 mass % aqueous solution of poly(vinyl pyrrolidone) having an Mw of 5,000: 25 pts·mass (solid content: 10 pts·mass), and ion-exchanged water: 125 pts·mass were used.

Example 2-6

Easily deformable aggregates (D2-6) having an average particle diameter of about 20 μm for which the average compressive force required for a 10% compressive deformation rate was about 0.5 mN and the maintaining rate of the average particle diameter after a shaking test was 93% were obtained in a manner similar to that for Example 2-1 except that: a 20 mass % toluene solution of a polyurethane resin (Vylon UR-1400 manufactured by Toyobo Co., Ltd.): 10 pts·mass (solid content: 2 pts·mass) was used instead of the 4 mass % aqueous solution of poly(ethylene imine) used in Example 2-1; 140 pts·mass of toluene was used instead of the ion-exchanged water; and the temperature of the splaying and drying process was changed from 125° C. to 140° C.

Example 2-7

After a slurry was obtained in a manner similar to that for Example 2-1, the obtained slurry was dried while being stirred by using a high-speed mixer ("LFS-2" manufactured by Earthtechnica Co., Ltd.) and the moisture was thereby removed. As a result, easily deformable aggregates (D2-7) having an average particle diameter of about 100 μm for which the average compressive force required for a 10% compressive deformation rate was about 3 mN and the maintaining rate of the average particle diameter after a shaking test was 98% were obtained.

Comparative Example 2-1

To obtain easily deformable aggregates, processes similar to those for Example 2-2 were carried out by using the 4 mass % aqueous solution of poly(allylamine) having an Mw of 5,000 for the alumina particles except that alumina particles ("CB-A20S" manufactured by Showa Denko K.K., average primary particle diameter: about 20 μm, average roundness: 0.98, average compressive force required for a 10% compressive deformation rate: about 220 mN) were used instead of the alumina particles "CB-P02" used in Example 2-2. However, they were easily disintegrated and a generated substance (D'2-1), which did not have a form of aggregates, was obtained.

Comparative Example 2-2

To obtain easily deformable aggregates, processes similar to those for Example 2-1 were carried out except that the poly(ethylene imine) having an Mw of 1,800 used in Example 2-1 was not used and the amount of the ion-exchanged water was 150 pts·mass. However, they were easily disintegrated and a generated substance (D'2-2), which did not have a form of aggregates, was obtained.

Comparative Example 2-3

Easily deformable aggregates (D'2-3) having an average particle diameter of about 20 μm for which the average compressive force required for a 10% compressive deformation rate was about 0.8 mN and the maintaining rate of the average particle diameter after a shaking test was 12% were obtained in a manner similar to that for Example 2-1 except that the amount of the 4 mass % aqueous solution of poly(ethylene imine) having an Mw of 1,800 used in Example 2-1 was 1,250 pts·mass (solid content: 50 pts·mass) and the amount of the ion-exchanged water was 50 pts·mass.

Comparative Example 2-4

A slurry was obtained in a manner similar to that for Comparative Example 2-3 except that a silane coupling agent ("KBM-04" manufactured by Shin-Etsu Chemical Co., Ltd.) and tetramethoxy silane (10 mass % solution): 20 pts·mass (solid content: 2 pts·mass) were used instead of the 4 mass % aqueous solution of poly(ethylene imine) used in Comparative Example 2-3, and the amount of the ion-exchanged water was 130 pts·mass. Then, this slurry was sprayed, dried, and cured under a 125° C. atmosphere. As a result, easily deformable aggregates (D'2-4) having an average particle diameter of about 15 μm for which the average compressive force required for a 10% compressive deformation rate was about 42 mN and the maintaining rate of the average particle diameter after a shaking test was 75% were obtained.

Comparative Example 2-5

A slurry was obtained in a manner similar to that for Comparative Example 2-4. Then, after spraying and drying this slurry under a 125° C. atmosphere, the resultant substance was sintered at 2,100° C., which was equal to or higher than the melting point of alumina. As a result, easily deformable aggregates (D'2-5) having an average particle diameter of about 15 μm for which the average compressive force required for a 10% compressive deformation rate was about 200 mN and the maintaining rate of the average particle diameter after a shaking test was 98% were obtained.

Comparative Example 2-6

To obtain easily deformable aggregates, processes similar to those for Example 2-1 were carried out except that 100 pts·mass of alumina particles ("AL-33" manufactured by Sumitomo Chemical Co., Ltd., average primary particle diameter: about 12 μm, average roundness: 0.9), 2 pts·mass of an epoxy resin composition ("Epicoat 1010" manufactured by Japan Epoxy Resins Co., Ltd.), and toluene: 148 pts·mass were used. However, they were easily disintegrated and a generated substance (D'2-6), which did not have a form of aggregates, was obtained.

Tables 2-1 and 2-2 show the key manufacturing conditions and the evaluation results of Examples 2-1 to 2-7 and Comparative Examples 2-1 to 2-6.

As shown in Tables 2-1 and 2-2, the average primary particle diameter of the thermally conductive particles (A) is preferably equal to or less than 10 μm and the use of an organic binding agent (B) containing a nitrogen atom is preferred in order to generate aggregates. No aggregates could be formed in Comparative Examples 2-1, 2-2 and 2-6. As can be seen from Comparative Example 2-3, when the amount of the organic binding agent (B) is too large, the aggregates are further agglomerated during the shaking process and they are denatured due to the impacts. As can be seen from Comparative Examples 2-4 and 2-5, when the thermally conductive particles (A) are strongly bound with each other by using, for example, a silane coupling agent as the organic binding agent and/or performing the sintering at a temperature equal to or higher than the melting point of alumina, the easy deformability becomes poor.

Example 2-8

Firstly, 37.1 pts·mass of easily deformable aggregates (D2-1) obtained in Example 2-1 (average particle diameter 10 μm), 31.5 pts·mass of a 30% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H2-1) including a thermally conductive layer having a thickness of 50 μm was obtained. Its thermal conductivity was 3 (W/m·K). This thermally conductive member (H2-1) was pressed under a pressure of 2 MPa at 150° C. for one hour. As a result, a thermally conductive adhesive sheet including a thermally conductive member (I2-1) that includes a thermally conductive layer having a thickness of 45 μm and has a thermal conductivity of 6.6 (W/m·K) was obtained.

Separately, the release-treated sheet was removed from the thermally conductive member (H2-1) and the thermally conductive layer was thereby isolated. This isolated thermally conductive layer was sandwiched between a copper foil having a thickness of 40 μm and an aluminum plate having a thickness of 250 μm and the sandwiched body was pressed under a pressure of 2 MPa at 150° C. for one hour. The adhesive force of the obtained sheet was 18 N/cm.

Example 2-9

Firstly, 37.1 pts·mass of easily deformable aggregates (D2-2) obtained in Example 2-2 (average particle diameter 15 μm), 31.5 pts·mass of a 30% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 70 vol % was obtained.

By using the obtained thermally conductive resin composition, a thermally conductive member (H2-2) that includes a thermally conductive layer having a thickness of 65 μm and has a thermal conductivity of 3.0 (W/m·K) was obtained in a manner similar to that for Example 2-8. Further, by performing a pressing process in a manner similar to that for Example 2-8, a thermally conductive member (I2-2) that includes a thermally conductive layer having a thickness of 60 μm and has a thermal conductivity of 5.8 (W/m·K) and an adhesive force of 20 N/cm was obtained.

Example 2-10

Firstly, 32.4 pts·mass of easily deformable aggregates (D2-3) obtained in Example 2-3 (average particle diameter 40 μm), 50.4 pts·mass of a 30% toluene/2-propanol solution of a polyurethane polyurea resin (E-1) obtained in Resin Synthesis Example 1, and 5.0 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 40 vol % was obtained.

By using the obtained thermally conductive resin composition, a thermally conductive member (H2-3) that includes a thermally conductive layer having a thickness of 60 μm and has a thermal conductivity of 2.5 (W/m·K) was obtained in a manner similar to that for Example 2-8. Further, by performing a pressing process in a manner similar to that for Example 2-8, a thermally conductive member (I2-3) that includes a thermally conductive layer having a thickness of 55 μm and has a thermal conductivity of 5.5 (W/m·K) and an adhesive force of 22 N/cm was obtained.

Example 2-11

Firstly, 36.0 pts·mass of easily deformable aggregates (D2-4) obtained in Example 2-4 (average particle diameter 15 μm), 36.0 pts·mass of a 35% toluene solution of a carboxyl group-containing denatured ester resin (E-2) obtained in Resin Synthesis Example 2, and 1 pts·mass of Chemitight PZ (manufactured by Nippon Shokubai Co., Ltd.), which was used as a thermally-curing assistant agent, were mixed and stirred by using a disper. Then, after its viscosity was adjusted by 5.8 pts·mass of 2-propanol and 23.2 pts·mass of toluene, ultrasound defoaming was performed. As a result, a thermally conductive resin composition containing easily deformable aggregates in 50 vol % was obtained.

By using the obtained thermally conductive resin composition, a thermally conductive member (H2-4) that includes a thermally conductive layer having a thickness of 50 μm and has a thermal conductivity of 4.5 (W/m·K) was obtained in a manner similar to that for Example 2-8. Further, by performing a pressing process in a manner similar to that for Example 2-8, a thermally conductive member (I2-4) that includes a thermally conductive layer having a thickness of 44 μm and has a thermal conductivity of 8.3 (W/m·K) and an adhesive force of 15 N/cm was obtained.

Example 2-12

Firstly, 22.8 pts·mass of easily deformable aggregates (D2-5) obtained in Example 2-5 (average particle diameter 30 μm), 68.8 pts·mass of a 25% ethyl acetate solution of an acrylic resin (E-3) obtained in Resin Synthesis Example 3, and 1.72 pts·mass of Chemitight PZ (manufactured by Nippon Shokubai Co., Ltd.), which was used as a thermally-curing assistant agent, were mixed and stirred by using a disper. Then, after its viscosity was adjusted by 11.0 pts·mass of methyl ethyl ketone (MEK), ultrasound defoaming was performed. As a result, a thermally conductive resin composition containing easily deformable aggregates in 25 vol % was obtained.

By using the obtained thermally conductive resin composition, a thermally conductive member (H2-5) that includes a thermally conductive layer having a thickness of 50 μm and has a thermal conductivity of 1.8 (W/m·K) was obtained in a manner similar to that for Example 2-8. Further, by performing a pressing process in a manner similar to that for Example 2-8, a thermally conductive member (I2-5) that includes a thermally conductive layer having a thickness of 45 μm and has a thermal conductivity of 3.1 (W/m·K) and an adhesive force of 16 N/cm was obtained.

Example 2-13

Firstly, 38.3 pts·mass of easily deformable aggregates (D2-6) obtained in Example 2-6 (average particle diameter 20 μm) and 13.8 pts·mass of an aqueous emulsion resin (Polysol AX-590 manufactured by Showa Denko K.K., solid content 49%) were mixed and stirred by using a disper. Then, after its viscosity was adjusted by 48.0 pts·mass of water, ultrasound defoaming was performed. As a result, a thermally conductive resin composition containing easily deformable aggregates in 60 vol % was obtained.

By using the obtained thermally conductive resin composition, a thermally conductive member (H2-6) that includes a thermally conductive layer having a thickness of 50 μm and has a thermal conductivity of 1.8 (W/m·K) was obtained in a manner similar to that for Example 2-8. Further, by performing a pressing process in a manner similar to that for Example 2-8, a thermally conductive member (I2-6) that includes a thermally conductive layer having a thickness of 45 μm and has a thermal conductivity of 3.1 (W/m·K) and an adhesive force of 18 N/cm was obtained.

Example 2-14

Firstly, 61.6 pts·mass of easily deformable aggregates (D2-7) obtained in Example 2-7 (average particle diameter 100 μm), 18.7 pts·mass of a polyester urethane resin Vylon UR6100 (manufactured by Toyobo Co., Ltd.), and 0.08 pts·mass of an epoxy-based curing agent Tetrad-X (manufactured by Mitsubishi Gas Chemical Company, Inc.), which was used as a curing agent, were stirred by using a disper. Then, after its viscosity was adjusted by 20.0 pts·mass of toluene, ultrasound defoaming was performed. As a result, a thermally conductive resin composition containing easily deformable aggregates in 65 vol % was obtained.

By using the obtained thermally conductive resin composition, a thermally conductive member (H2-7) that includes a thermally conductive layer having a thickness of 110 μm and has a thermal conductivity of 2.8 (W/m·K) was obtained in a manner similar to that for Example 2-8. Further, by performing a pressing process in a manner similar to that for Example 2-8, a thermally conductive member (I2-7) that includes a thermally conductive layer having a thickness of 100 μm and has a thermal conductivity of 6.5 (W/m·K) and an adhesive force of 16 N/cm was obtained.

Comparative Example 2-7

Firstly, 36.0 pts·mass of a spherical aluminum oxide powder having an average primary particle diameter of 1 μm (AO-502 manufactured by Admatechs Co., Ltd.), 36.0 pts·mass of a 30% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

The obtained resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H'2-1) that includes a thermally conductive layer having a thickness of 50 μm and has a thermal conductivity of 0.5 (W/m·K) was obtained. Further, a release-treated sheet was placed over the obtained thermally conductive member (H'2-1), and then the laminated body was pressed under a pressure of 2 MPa at 150° C. for one hour. As a result, a thermally conductive member (I'2-1) having a thickness of 45 pun was obtained. This sheet has a low thermal conductivity of 0.8 (W/m·K).

Separately, the release-treated sheet was removed from the thermally conductive member (H'2-1) and the thermally conductive layer was thereby isolated. This isolated thermally conductive layer was sandwiched between a copper foil having a thickness of 40 μm and an aluminum plate having a thickness of 250 μm and the sandwiched body was pressed under a pressure of 2 MPa at 150° C. for one hour. The adhesive force of the obtained sample was 16 N/cm.

Comparative Example 2-8

Firstly, 36.0 pts·mass of a spherical aluminum oxide powder having an average primary particle diameter of 20 μm (CB-A20S manufactured by Showa Denko K.K.), 36.0 pts·mass of a 30% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

By using the obtained resin composition, a thermally conductive member (H'2-2) that includes a thermally conductive layer having a thickness of 50 μm and has a thermal conductivity of 0.4 (W/m·K) was obtained in a manner similar to that for Comparative Example 2-7. Further, by performing a pressing process in a manner similar to that for Comparative Example 2-7, a thermally conductive member (I'2-2) having a thickness of 45 μm, a thermal conductivity of 0.7 (W/m·K), and an adhesive force of 15 N/cm was obtained.

Comparative Example 2-9

Firstly, 38.3 pts·mass of aggregates (D'2-3) obtained in Comparative Example 2-3 (average particle diameter 20 μm), 27.0 pts·mass of a 30% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'2-3) that includes a thermally conductive layer having a thickness of 60 μm and has a thermal conductivity of 0.3 (W/m·K) was obtained in a manner similar to that for Comparative Example 2-7. Further, by performing a pressing process in a manner similar to that for Comparative Example 2-7, a thermally conductive member (I'2-3) having a thickness of 50 μm, a thermal conductivity of 0.4 (W/m·K), and an adhesive force of 15 N/cm was obtained.

Comparative Example 2-10

Firstly, 38.3 pts·mass of aggregates (D2-4) obtained in Comparative Example 2-4 (average particle diameter 15 μm), 27.0 pts·mass of a 30% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'2-4) that includes a thermally conductive layer having a thickness of 60 μm and has a thermal conductivity of 0.2 (W/m·K) was obtained in a manner similar to that for Comparative Example 2-7. Further, by performing a pressing process in a manner similar to that for Comparative Example 2-7, a thermally conductive member (I'2-4) having a thickness of 50 μm, a thermal conductivity of 0.4 (W/m·K), and an adhesive force of 2 N/cm was obtained.

A lot of cracks caused by crushes of particles were observed in this sheet.

Comparative Example 2-11

Firstly, 38.3 pts·mass of aggregates (D12-5) manufactured in Comparative Example 2-5 (average particle diameter 15 μm), 27.0 pts·mass of a 35% toluene solution of a carboxyl group-containing denatured ester resin (E-2) obtained in Resin Synthesis Example 2, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing non-aggregates in 60 vol % was obtained.

By using the obtained resin composition, a thermally conductive member (H2-5) that includes a thermally conductive layer having a thickness of 60 μm and has a thermal conductivity of 0.7 (W/m·K) was obtained in a manner similar to that for Comparative Example 2-7. Further, by performing a pressing process in a manner similar to that for Comparative Example 2-7, a thermally conductive member (I'2-5) having a thickness of 50 μm, a thermal conductivity of 0.9 (W/m·K), and an adhesive force of 1 N/cm was obtained.

A lot of cracks caused by crushes of particles were observed in this sheet.

Table 2-3 shows the key manufacturing conditions and the evaluation results of Examples 2-8 to 2-14 and Comparative Examples 2-7 to 2-11.

The solvents (F) in the table indicate only the substances that were added as a solvent.

As shown in Table 2-3, by carrying out a pressing process, a thermally conductive resin composition (G) including easily deformable aggregates (D) according to the present invention can provide a thermally conductive member (I) having an excellent thermal conductivity. As can be seen from Comparative Examples 2-7 to 2-11, resin compositions that do not include any easily deformable aggregates (D) in the thermally conductive resin compositions (G) cannot achieve a satisfactory thermal conductivity. As can be seen from Comparative Example 2-8, when the aggregates are disintegrated during the resin composition manufacturing process, a high thermal conductivity cannot be achieved because the resin content is large and there are not sufficient thermal conduction paths. As can be seen from Comparative Examples 2-10 and 2-11, when an organic binding agent containing no nitrogen atom is used, a satisfactory adhesive force cannot be obtained.

Example 3-1

Alumina particles ("AO-502" manufactured by Admatechs Co., Ltd., average primary particle diameter: about 1 μm, average roundness: 0.99): 100 pts·mass, a 4 mass % aqueous solution of carboxymethyl cellulose ("CMC Daicel 1240" manufactured by Daicel Finechem Ltd.): 125 pts·mass (solid content: 5 pts·mass), and ion-exchanged water: 25 pts·mass were stirred at 1,000 rpm for one hour by using a disper to obtain a slurry thereof.

This slurry was sprayed and dried under a 125° C. atmosphere by using ("B-290" manufactured by Nihon-Buchi K.K.). As a result, easily deformable aggregates (D3-1) having an average particle diameter of about 10 μm for which the average compressive force required for a 10% compressive deformation rate was about 3.2 mN and the maintaining rate of the average particle diameter after a shaking test was 98% were obtained.

Example 3-2

Easily deformable aggregates (D3-2) having an average particle diameter of about 15 μm for which the average compressive force required for a 10% compressive deformation rate was about 0.3 mN and the maintaining rate of the average particle diameter after a shaking test was 93% were obtained in a manner similar to that for Example 3-1 except that alumina particles ("CB-P02" manufactured by Showa Denko K.K., average primary particle diameter: about 2 μm, average roundness: 0.98): 100 pts·mass, a 4 mass % aqueous solution of poly(allylamine) having an Mw of 5,000: 50 pts·mass (solid content: 2 pts·mass), and ion-exchanged water: 100 pts·mass were used.

Example 3-3

Easily deformable aggregates (D3-3) having an average particle diameter of about 40 μm for which the average compressive force required for a 10% compressive deformation rate was about 1 mN and the maintaining rate of the average particle diameter after a shaking test was 92% were obtained in a manner similar to that for Example 3-1 except that alumina particles ("AO-509" manufactured by Admatechs Co., Ltd., average primary particle diameter: about 10 man, average roundness: 0.99): 100 pts., a 4 mass % aqueous solution of polivinyl alcohol ("Gohsenol NL-05" manufactured by Nippon Synthetic Chemical Industry Co., Ltd.): 12.5 pts·mass (solid content: 0.5 pts·mass), and ion-exchanged water: 137.5 pts·mass were used.

Example 3-4

Easily deformable aggregates (D3-4) having an average particle diameter of about 15 μm for which the average compressive force required for a 10% compressive deformation rate was about 0.7 mN and the maintaining rate of the average particle diameter after a shaking test was 92% were obtained in a manner similar to that for Example 3-1 except that an aluminum nitride ("H-grade" manufactured by Tokuyama Corporation, average primary particle diameter: about 1 μm, average roundness: 0.97): 100 pts·mass, a 4 mass % aqueous solution of denatured polivinyl alcohol containing an acetoacetyl group ("Gohsefimer Z-100" manufactured by Nippon Synthetic Chemical Industry Co., Ltd.): 50 pts·mass (solid content: 2 pts·mass), and ion-exchanged water: 100 pts·mass were used.

Example 3-5

Easily deformable aggregates (D3-5) having an average particle diameter of about 30 μm for which the average compressive force required for a 10% compressive deformation rate was about 2 mN and the maintaining rate of the average particle diameter after a shaking test was 95% were obtained in a manner similar to that for Example 3-1 except that alumina particles ("CB-P05" manufactured by Showa Denko K.K., average primary particle diameter about 5 μm, average roundness: 0.99): 100 pts·mass, a 40 mass % aqueous solution of polyacrylic acid having an Mw of 25,000: 12.5 pts·mass (solid content: 10 pts·mass), and ion-exchanged water: 137.5 pts·mass were used.

Example 3-6

Easily deformable aggregates (D3-6) having an average particle diameter of about 20 μm for which the average compressive force required for a 10% compressive deformation rate was about 0.4 mN and the maintaining rate of the average particle diameter after a shaking test was 93% were obtained in a manner similar to that for Example 3-1 except that: 2 pts·mass of an epoxy resin composition ("Epicoat 1010" manufactured by Japan Epoxy Resins Co., Ltd.) was used instead of the 4 mass % aqueous solution of carboxymethyl cellulose used in Example 3-1; toluene: 148 pts·mass was used; and the temperature of the splaying and drying process was changed from 125° C. to 140° C.

Example 3-7

After a slurry was obtained in a manner similar to that for Example 3-1, the obtained slurry was dried while being stirred by using a high-speed mixer ("LFS-2" manufactured by Earthtechnica Co., Ltd.) and the moisture was thereby removed. As a result, easily deformable aggregates (D3-7) having an average particle diameter of about 100 μm for which the average compressive force required for a 10% compressive deformation rate was about 3 mN and the maintaining rate of the average particle diameter after a shaking test was 90% were obtained.

Comparative Example 3-1

To obtain easily deformable aggregates, processes similar to those for Example 3-2 were carried out by using the aforementioned 4 mass % aqueous solution of carboxymethyl cellulose for the alumina particles except that alumina particles ("CB-A20S" manufactured by Showa Denko K.K., average primary particle diameter: about 20 μm, average roundness: 0.98, average compressive force required for a 10% compressive deformation rate: about 220 mN) were used instead of the alumina particles "CB-P02". However, they were easily disintegrated and a generated substance (D'3-1), which did not have a form of aggregates, was obtained.

Comparative Example 3-2

To obtain easily deformable aggregates, processes similar to those for Example 3-1 were carried out except that the carboxymethyl cellulose was not used and the amount of the ion-exchanged water was 150 pts·mass. However, they were easily disintegrated and a generated substance (D'3-2), which did not have a form of aggregates, was obtained.

Comparative Example 3-3

Easily deformable aggregates (D'3-3) having an average particle diameter of about 20 μm for which the average compressive force required for a 10% compressive deformation rate was about 0.8 mN and the maintaining rate of the average particle diameter after a shaking test was 12% were obtained in a manner similar to that for Example 3-1 except that the amount of the aforementioned 4 mass % aqueous solution of carboxymethyl cellulose was 1,250 pts·mass (solid content: 50 pts·mass) and the amount of the ion-exchanged water was 50 pts·mass.

Comparative Example 3-4

A slurry was obtained in a manner similar to that for Example 3-1 except that a silane coupling agent ("KBM-04" manufactured by Shin-Etsu Chemical Co., Ltd.) and tetramethoxy silane (10 mass % solution): 20 pts·mass (solid content: 2 pts·mass) were used instead of the 4 mass % aqueous solution of carboxymethyl cellulose, and the amount of the ion-exchanged water was 130 pts·mass. Then, this slurry was sprayed, dried, and cured under a 125° C. atmosphere. As a result, easily deformable aggregates (D'3-4) having an average particle diameter of about 15 m for which the average compressive force required for a 10% compressive deformation rate was about 42 mN and the maintaining rate of the average particle diameter after a shaking test was 75% were obtained.

Comparative Example 3-5

A slurry was obtained in a manner similar to that for Comparative Example 3-4. Then, after spraying and drying this slurry under a 125° C. atmosphere, the resultant substance was sintered at 2,100° C., which was equal to or higher than the melting point of alumina. As a result, easily deformable aggregates (D'3-5) having an average particle diameter of about 15 μm for which the average compressive force required for a 10% compressive deformation rate was about 200 mN and the maintaining rate of the average particle diameter after a shaking test was 98% were obtained.

Comparative Example 3-6

To obtain easily deformable aggregates, processes similar to those for Example 3-1 were carried out except that 100 pts·mass of alumina particles ("AL-33" manufactured by Sumitomo Chemical Co., Ltd., average primary particle diameter: about 12 μm, average roundness: 0.9) and a 20 mass % toluene solution of a polyurethane resin (Vylon UR-1400 manufactured by Toyobo Co., Ltd.): 10 pts·mass (solid content: 2 pts·mass) were used, and 140 pts·mass of toluene was used instead of the ion-exchanged water. However, they were easily disintegrated and a generated substance (D'3-6), which did not have a form of aggregates, was obtained.

Tables 3-1 and 3-2 show the key manufacturing conditions and the evaluation results of Examples 3-1 to 3-7 and Comparative Examples 3-1 to 3-6.

As shown in Tables 3-1 and 3-2, the average primary particle diameter of the thermally conductive particles (A) is preferably equal to or less than 10 pan and the use of an organic binding agent (B) containing a reactive functional group is preferred in order to generate aggregates. No aggregates could be formed in Comparative Examples 3-1, 3-2 and 3-6. As can be seen from Comparative Example 3-3, when the amount of the organic binding agent (B) is too large, the aggregates are further agglomerated during the shaking process and they are denatured due to the impacts. As can be seen from Comparative Examples 3-4 and 3-5, when the thermally conductive particles (A) are strongly bound with each other by using, for example, a silane coupling agent as the organic binding agent, heating and curing the easily deformable aggregates (D) before deforming them, and/or performing the sintering at a temperature equal to or higher than the melting point of alumina, the easy deformability becomes poor.

Example 3-8

Firstly, 37.1 pts·mass of easily deformable aggregates (D3-1) obtained in Example 3-1 (average particle diameter 10 m), 31.5 pts·mass of a 30% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H3-1) including a thermally conductive layer having a thickness of 50 μm was obtained. Its thermal conductivity was 3 (W/m·K). This thermally conductive member (H3-1) was pressed under a pressure of 2 MPa at 150° C. for one hour. As a result, a thermally conductive member (I3-1) that includes a thermally conductive layer having a thickness of 45 μm and has a thermal conductivity of 7 (W/m·K) was obtained.

Separately, the release-treated sheet was removed from the thermally conductive member (H3-1) and the thermally conductive layer was thereby isolated. This isolated thermally conductive layer was sandwiched between a copper foil having a thickness of 40 μm and an aluminum plate having a thickness of 250 μm and the sandwiched body was pressed under a pressure of 2 MPa at 150° C. for one hour. The obtained sheet had an excellent heat resistance.

Example 3-9

Firstly, 37.1 pts·mass of easily deformable aggregates (D3-2) obtained in Example 3-2 (average particle diameter 15 μm), 31.5 pts·mass of a 30% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 70 vol % was obtained.

By using the obtained thermally conductive resin composition, a thermally conductive member (H3-2) that includes a thermally conductive layer having a thickness of 65 μm and has a thermal conductivity of 2.8 (W/m·K) was obtained in a manner similar to that for Example 3-8. Further, a thermally conductive member (I3-2) that includes a thermally conductive layer having a thickness of 60 μm and has a thermal conductivity of 5.5 (W/m·K) and an excellent heat resistance was obtained in a similar manner.

Example 3-10

Firstly, 32.4 pts·mass of easily deformable aggregates (D3-3) obtained in Example 3-3 (average particle diameter 40 μm), 36.0 pts·mass of a 35% toluene solution of a carboxyl group-containing denatured ester resin (E-2) obtained in Resin Synthesis Example 2, and 2.5 pts·mass of Chemitight PZ (manufactured by Nippon Shokubai Co., Ltd.), which was used as a curing agent, were mixed and stirred by using a disper. Then, after its viscosity was adjusted by 9.3 pts·mass of 2-propanol and 37.0 pts·mass of toluene, ultrasound defoaming was performed. As a result, a thermally conductive resin composition containing easily deformable aggregates in 40 vol % was obtained.

By using the obtained thermally conductive resin composition, a thermally conductive member (H3-3) that includes a thermally conductive layer having a thickness of 60 μm and has a thermal conductivity of 2.5 (W/m·K) was obtained in a manner similar to that for Example 3-8. Further, a thermally conductive member (I3-3) that includes a thermally conductive layer having a thickness of 55 μm and has a thermal conductivity of 3.5 (W/m·K) and an excellent heat resistance was obtained in a similar manner.

Example 3-11

Firstly, 36.0 pts·mass of easily deformable aggregates (D3-4) obtained in Example 3-4 (average particle diameter 15 μm), 50.4 pts·mass of a 25% ethyl acetate solution of an acrylic resin (E-3) obtained in Resin Synthesis Example 3, and 1 pts·mass of Chemitight PZ (manufactured by Nippon Shokubai Co., Ltd.), which was used as a thermally-curing assistant agent, were mixed and stirred by using a disper. Then, after its viscosity was adjusted by 29.0 pts·mass of methyl ethyl ketone (MEK), ultrasound defoaming was performed. As a result, a thermally conductive resin composition containing easily deformable aggregates in 50 vol % was obtained.

By using the obtained thermally conductive resin composition, a thermally conductive member (H3-4) that includes a thermally conductive layer having a thickness of 50 μm and has a thermal conductivity of 6 (W/m·K) was obtained in a manner similar to that for Example 3-8. Further, a thermally conductive member (I3-4) that includes a thermally conductive layer having a thickness of 44 μm and has a thermal conductivity of 10 (W/m·K) and an excellent heat resistance was obtained in a similar manner.

Example 3-12

Firstly, 22.8 pts·mass of easily deformable aggregates (D3-5) obtained in Example 3-5 (average particle diameter 30 μm), 66.8 pts·mass of a 25% toluene solution of an epoxy resin (YX-4000H manufactured by Yuka Shell Epoxy Co., Ltd.), and 1.72 pts·mass of Chemitight PZ (manufactured by Nippon Shokubai Co., Ltd.), which was used as a thermally-curing assistant agent, were mixed and stirred by using a disper. Then, after its viscosity was adjusted by 11.0 pts·mass of toluene, ultrasound defoaming was performed. As a result, a thermally conductive resin composition containing easily deformable aggregates in 25 vol % was obtained.

By using the obtained thermally conductive resin composition, a thermally conductive member (H3-5) that includes a thermally conductive layer having a thickness of 50 μm and has a thermal conductivity of 2.3 (W/m·K) was obtained in a manner similar to that for Example 3-8. Further, a thermally conductive member (I3-5) that includes a thermally conductive layer having a thickness of 45 μm and has a thermal conductivity of 3 (W/m·K) and an excellent heat resistance was obtained in a similar manner.

Example 3-13

Firstly, 38.3 pts·mass of easily deformable aggregates (D3-6) obtained in Example 3-6 (average particle diameter 20 μm) and 13.8 pts·mass of an aqueous emulsion resin (Polysol AX-590 manufactured by Showa Denko K.K., solid content 49%) were mixed and stirred by using a disper. Then, after its viscosity was adjusted by 48.0 pts·mass of water, ultrasound defoaming was performed. As a result, a thermally conductive resin composition containing easily deformable aggregates in 60 vol % was obtained.

By using the obtained thermally conductive resin composition, a thermally conductive member (H3-6) that includes a thermally conductive layer having a thickness of 50 μm and has a thermal conductivity of 2 (W/m·K) was obtained in a manner similar to that for Example 3-8. Further, a thermally conductive member (I3-6) that includes a thermally conductive layer having a thickness of 45 μm and has a thermal conductivity of 4.2 and an excellent heat resistance was obtained in a similar manner.

Example 3-14

Firstly, 61.6 pts·mass of easily deformable aggregates (D3-7) obtained in Example 3-7 (average particle diameter 100 μm), 18.7 pts·mass of a polyester urethane resin Vylon UR6100 (manufactured by Toyobo Co., Ltd.), and 0.08 pts·mass of an epoxy-based curing agent Tetrad-X (manufactured by Mitsubishi Gas Chemical Company, Inc.), which was used as a curing agent, were stirred by using a disper. Then, after its viscosity was adjusted by 20.0 pts·mass of toluene, ultrasound defoaming was performed. As a result, a thermally conductive resin composition containing easily deformable aggregates in 65 vol % was obtained.

By using the obtained thermally conductive resin composition, a thermally conductive member (H3-7) that includes a thermally conductive layer having a thickness of 110 μm and has a thermal conductivity of 2.7 (W/m·K) was obtained in a manner similar to that for Example 3-8. Further, a thermally conductive member (I3-7) that includes a thermally conductive layer having a thickness of 100 μm and has a thermal conductivity of 5 (W/m·K) and an excellent heat resistance was obtained in a similar manner.

Comparative Example 3-7

Firstly, 36.0 pts·mass of a spherical aluminum oxide powder having an average primary particle diameter of 1 μm (AO-502 manufactured by Admatechs Co., Ltd.), 36.0 pts·mass of a 25% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

The obtained resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H'3-1) that includes a thermally conductive layer having a thickness of 50 μm and has a thermal conductivity of 0.5 (W/m·K) was obtained. Further, a release-treated sheet was placed over the obtained thermally conductive member (H'3-1), and then the laminated body was pressed under a pressure of 2 MPa at 150° C. for one hour. As a result, a thermally conductive member (I'3-1) having a thickness of 45 μm was obtained. This sheet has a low thermal conductivity of 0.8 (W/m·K).

Separately, the release-treated sheet was removed from the thermally conductive member (H'3-1) and the thermally conductive layer was thereby isolated. This isolated thermally conductive layer was sandwiched between a copper foil having a thickness of 40 μm and an aluminum plate having a thickness of 250 μm and the sandwiched body was pressed under a pressure of 2 MPa at 150° C. for one hour. Exfoliation was observed in the obtained sample during the heat resistance test.

Comparative Example 3-8

Firstly, 36.0 pts·mass of a spherical aluminum oxide powder having an average primary particle diameter of 20 μm (CB-A20S manufactured by Showa Denko K.K.), 36.0 pts·mass of a 25% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

By using the obtained resin composition, a thermally conductive member (H'3-2) that includes a thermally conductive layer having a thickness of 50 μm and has a thermal conductivity of 0.4 (W/m·K) was obtained in a manner similar to that for Comparative Example 3-7. Further, a thermally conductive member (I'3-2) having a thickness of 45 μm and a thermal conductivity of 0.7 (W/m·K), in which some extent of forming was observed in the heat resistance test, was obtained in a similar manner.

Comparative Example 3-9

Firstly, 38.3 pts·mass of aggregates (D'3-3) obtained in Comparative Example 3-3 (average particle diameter 20 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'3-3) that includes a thermally conductive layer having a thickness of 60 μm and has a thermal conductivity of 0.3 (W/m·K) was obtained in a manner similar to that for Comparative Example 3-7. Further, a thermally conductive member (I'3-3) having a thickness of 50 μm, a thermal conductivity of 0.4 (W/m·K), and an excellent heat resistance was obtained in a similar manner.

Comparative Example 3-10

Firstly, 38.3 pts·mass of aggregates (D'3-4) obtained in Comparative Example 3-4 (average particle diameter 15 μm), 27.0 pts·mass of a 25% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'3-4) that includes a thermally conductive layer having a thickness of 60 μm and has a thermal conductivity of 0.2 (W/m·K) was obtained in a manner similar to that for Comparative Example 3-7. Further, a thermally conductive member (I'3-4) having a thickness of 50 μm and a thermal conductivity of 0.4 (W/m·K), in which exfoliation was observed in the heat resistance test, was obtained in a similar manner. A lot of cracks caused by crushes of particles were observed in this sheet.

Comparative Example 3-11

Firstly, 38.3 pts·mass of aggregates (D'3-5) manufactured in Comparative Example 3-5, 27.0 pts·mass of a 35% toluene solution of a carboxyl group-containing denatured ester resin (E-2) obtained in Resin Synthesis Example 2, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing non-aggregates in 60 vol % was obtained.

By using the obtained resin composition, a thermally conductive member (H'3-5) that includes a thermally conductive layer having a thickness of 60 μm and has a thermal conductivity of 0.7 (W/m·K) was obtained in a manner similar to that for Comparative Example 3-7. Further, a thermally conductive member (I'3-5) having a thickness of 50 μm and a thermal conductivity of 0.9 (W/m·K), in which exfoliation was observed in the heat resistance test, was obtained in a similar manner. A lot of cracks caused by crushes of particles were observed in this sheet.

Tables 3-3 and 3-4 show the key manufacturing conditions and the evaluation results of Examples 3-8 to 3-14 and Comparative Examples 3-7 to 3-11.

The solvents (F) in the tables indicate only the substances that were added as a solvent.

As shown in Tables 3-3 and 3-4, a thermally conductive resin composition (G) according to the present invention can provide a thermally conductive member (I) having an excellent thermal conductivity. As can be seen from Comparative Examples 3-7 and 3-8, resin compositions that do not include any easily deformable aggregates (D) in the thermally conductive resin compositions (G) cannot achieve satisfactory thermal conductivity. As can be seen from Comparative Example 3-9, when the aggregates are disintegrated during the resin composition manufacturing process, a high thermal conductivity cannot be achieved because the resin content is large and there are not sufficient thermal conduction paths. As can be seen from Comparative Example 3-10, when an organic binding agent (B) including no reactive functional group is used, a satisfactory heat resistance may not be obtained.

Fiber Synthesis Example 1: Silver Nano-Wire

A solution obtained by dissolving 5 pts·mass of polyvinyl pyrrolidone having an Mw of 40,000 in 300 ml of ethylene glycol was heated at 130° C. for 10 minutes under a nitrogen atmosphere. Then, after 1.5 ml of an ethylene glycol solution of sodium chloride having a concentration of 100 mM and an ethylene glycol solution of Iron(II) acetylacetonate having a concentration of 2.2 mM were added, the mixed solution was heated at 130° C. for five minutes. Further, after 1.25 ml of a concentrated nitric acid solution was added, the solution was heated at 130° C. for two hours.

Next, reprecipitation was performed for the obtained solution three times by using isopropanol. As a result, an isopropanol solution (P1) having a silver content of 3.0 mg/ml in which silver nano-wires having an average fiber diameter 60 nm and an average length 20 μm (aspect ratio 333) were dispersed was obtained.

Fiber Synthesis Example 2: Silver Nano-Wire

In 100 ml of ethylene glycol heated to 160° C., 10 ml of an ethylene glycol solution of silver nitrate having a concentration of 0.15 mM was slowly added over 10 seconds. After 10 minutes had elapsed, the resultant solution was heated to 170° C. Then, each of 200 ml of an ethylene glycol solution of silver nitrate having a concentration of 100 mM and 200 ml of an ethylene glycol solution of polyvinyl pyrrolidone (Mw 40,000) having a concentration of 600 mM was slowly added over 210 minutes. Then, the solution was heated at 170° C. for three hours.

Next, reprecipitation was performed for the obtained solution three times by using isopropanol. As a result, an isopropanol solution (P2) having a silver content of 3.0 mg/ml in which silver nano-wires having an average fiber diameter 500 nm and an average length 10 μm (aspect ratio 20) were dispersed was obtained.

Fiber Synthesis Example 3: Copper Nano-Wire

Firstly, 10 ml of a copper acetate solution obtained by dissolving 0.2 pts·mass of copper acetate in 10 ml of distilled water was prepared. Further, as a metal ion reducing agent, 100 ml of a sodium borohydride solution obtained by mixing sodium borohydride and distilled water so that the concentration becomes 5.0 mol/l was prepared. Then, 0.5 g of polyvinyl pyrrolidone (PVP), which was a water-soluble polymer, was added in the sodium borohydride solution and dissolved therein by stirring the solution.

Next, this reducing solution was bubbled with a mixed gas that was adjusted in advance so that the ratio between nitrogen and oxygen became 3:1 for about 60 minutes. Then, after the temperature of the reducing solution was adjusted to 20° C., 10 ml of the above-described copper acetate solution was dropped into the reducing solution. This mixed solution was thoroughly stirred for about 60 minutes while keeping the temperature of the mixed solution at 20° C. The generated black reaction liquid was recovered as an aqueous solution (P3) having a copper content of 1.8 mg/ml in which copper nano-wires having an average fiber diameter 12 μm and an average length 100 μm (aspect ratio 8.3) were dispersed.

Fiber Synthesis Example 4: Metal-Coated Polymer Nano-Fiber

Firstly, 70 pts·mass of polymer nano-fibers was manufactured by using a copolymer of acryl nitrile/glycidyl methacrylate for which the compounding ratio was 35/65 (Mw=40,000) by an electro spinning method. Further, after the polymer nano-fibers were mixed with 200 mL of hydrazinium hydroxide in a flask having a volume of 2,500 mL, the mixture was stirred for one night. Then, after the resultant substance was washed with 5,000 mL of methanol six times, the washed substance was dried at 50° C. for 24 hours in a vacuum.

Then, 70 pts·mass of the polymer nano-fibers modified with hydrazine was submerged in a mixed liquid of 50 mL of a 0.1M $AgNO_3$ solution, 5 mL of a 1M KOH solution, and 10 mL of a concentrated $NH_3$ solution contained in an airtight glass bottle. By doing so, the polymer nano-fibers were coated with silver. Further, after the silver-coated polymer nano-fibers were washed with 5,000 mL of methanol six times, the washed silver-coated polymer nano-fibers were dried at 50° C. for 24 hours in a vacuum. As a result, polymer nano-fibers (P4) coated with silver having an average fiber diameter 100 nm and an average length 15 μm (aspect ratio 150) were obtained.

Example 4-1

Alumina particles ("AO-502" manufactured by Admatechs Co., Ltd., average primary particle diameter: about 1 μm, average roundness: 0.99): 100 pts·mass, a 4 mass % aqueous solution of polyvinyl alcohol ("Gohsenol NL-05" manufactured by Nippon Synthetic Chemical Industry Co., Ltd.): 125 pts·mass (solid content: 5 pts·mass), a thermally conductive fiber (P1) solution: 33.3 pts·mass (solid content:

0.1 pts·mass), and ion-exchanged water: 41.7 pts·mass were stirred at 1,000 rpm for one hour by using a disper to obtain a slurry thereof.

This slurry was sprayed and dried under a 125° C. atmosphere by using ("B-290" manufactured by Nihon-Buchi K.K.). As a result, easily deformable aggregates (D4-1) having an average particle diameter of about 10 μm for which the average compressive force required for a 10% compressive deformation rate was about 0.7 mN and the maintaining rate of the average particle diameter after a shaking test was 96% were obtained.

Example 4-2

Easily deformable aggregates (D4-2) having an average particle diameter of about 20 μm for which the average compressive force required for a 10% compressive deformation rate was about 0.6 mN and the maintaining rate of the average particle diameter after a shaking test was 94% were obtained in a manner similar to that for Example 4-1 except that alumina particles ("CB-P02" manufactured by Showa Denko K.K., average primary particle diameter: about 2 μm, average roundness: 0.98): 100 pts·mass, a 4 mass % aqueous solution of polyvinyl alcohol ("Gohsenol NL-05" manufactured by Nippon Synthetic Chemical Industry Co., Ltd.): 50 pts·mass (solid content: 2 pts·mass), a thermally conductive fiber (P1) solution: 66.6 pts·mass (solid content: 0.2 pts·mass), and ion-exchanged water: 83.4 pts·mass were used.

Example 4-3

Easily deformable aggregates (D4-3) having an average particle diameter of about 45 μm for which the average compressive force required for a 10% compressive deformation rate was about 0.5 mN and the maintaining rate of the average particle diameter after a shaking test was 93% were obtained in a manner similar to that for Example 4-1 except that alumina particles ("AO-509" manufactured by Admatechs Co., Ltd., average primary particle diameter: about 10 μm, average roundness: 0.99): 100 pts., a 4 mass % aqueous solution of poly(allylamine) having an Mw of 5,000: 12.5 pts·mass (solid content: 0.5 pts·mass), a thermally conductive fiber (P2) solution: 333 pts·mass (solid content: 1.0 pts·mass), and ion-exchanged water: 4.5 pts·mass were used.

Example 4-4

Easily deformable aggregates (D4-4) having an average particle diameter of about 15 μm for which the average compressive force required for a 10% compressive deformation rate was about 2 mN and the maintaining rate of the average particle diameter after a shaking test was 92% were obtained in a manner similar to that for Example 4-1 except that an aluminum nitride ("H-grade" manufactured by Tokuyama Corporation, average primary particle diameter: about 1 μm, average roundness: 0.97): 100 pts·mass, a 4 mass % aqueous solution of poly(N-isopropyl acrylamide) having an Mw of 10,000: 50 pts·mass (solid content: 2 pts·mass), a thermally conductive fiber (P2) solution: 66.7 pts·mass (solid content: 0.2 pts·mass), and ion-exchanged water: 83.3 pts·mass were used.

Example 4-5

Easily deformable aggregates (D4-5) having an average particle diameter of about 30 μm for which the average compressive force required for a 10% compressive deformation rate was about 1 mN and the maintaining rate of the average particle diameter after a shaking test was 92% were obtained in a manner similar to that for Example 4-1 except that alumina particles ("CB-P05" manufactured by Showa Denko K.K., average primary particle diameter: about 5 μm, average roundness: 0.99): 100 pts·mass, a 20 mass % aqueous solution of poly(vinyl pyrrolidone) having an Mw of 5,000: 25 pts·mass (solid content: 10 pts·mass), a thermally conductive fiber (P3) solution: 222.2 pts·mass (solid content: 0.4 pts·mass), and ion-exchanged water: 2.8 pts·mass were used.

Example 4-6

Alumina particles ("AO-502" manufactured by Admatechs Co., Ltd., average primary particle diameter: about 1 μm, average roundness: 0.99): 100 pts·mass, a 20 mass % toluene solution of a polyurethane resin (Vylon UR-1400 manufactured by Toyobo Co., Ltd.): 10 pts·mass (solid content: 2 pts·mass), thermally conductive fibers (P4): 2 pts·mass (solid content: 2 pts·mass), and toluene: 178 pts·mass were stirred at 1,000 rpm for one hour by using a disper to obtain a slurry thereof.

This slurry was sprayed under a 140° C. atmosphere by using a mini-spray drier ("B-290" manufactured by Nihon-Buchi K.K.) and dried. As a result, easily deformable aggregates (D4-6) having an average particle diameter of about 20 μm for which the average compressive force required for a 10% compressive deformation rate was about 0.5 mN and the maintaining rate of the average particle diameter after a shaking test was 93% were obtained.

Example 4-7

An aluminum nitride ("H-grade" manufactured by Tokuyama Corporation, average primary particle diameter: about 1 μm, average roundness: 0.97): 100 pts·mass, a 4 mass % aqueous solution of poly(N-isopropyl acrylamide) having an Mw of 10,000: 50 pts·mass (solid content: 2 pts·mass), thermally conductive fibers (P4): 40 pts·mass (solid content: 40 pts·mass), and water: 210 pts·mass were stirred at 1,000 rpm for one hour by using a disper to obtain a slurry thereof.

This slurry was sprayed under a 140° C. atmosphere by using a mini-spray drier ("B-290" manufactured by Nihon-Buchi K.K.) and dried. As a result, easily deformable aggregates (D4-7) having an average particle diameter of about 40 μm for which the average compressive force required for a 10% compressive deformation rate was about 3.0 mN and the maintaining rate of the average particle diameter after a shaking test was 94% were obtained.

Comparative Example 4-1

To obtain easily deformable aggregates, processes similar to those for Example 4-2 were carried out except that alumina particles ("CB-A20S" manufactured by Showa Denko K.K., average primary particle diameter: about 20 pin, average roundness: 0.98, average compressive force required for a 10% compressive deformation rate: about 220 mN) were used instead of the alumina particles "CB-P02" used in Example 4-2. However, they were easily disintegrated and a generated substance (D'4-1), which did not have a form of aggregates, was obtained.

Comparative Example 4-2

To obtain easily deformable aggregates, processes similar to those for Example 4-2 were carried out except that the poly(vinyl alcohol) used in Example 4-2 was not used and the amount of the ion-exchanged water was 133.4 pts·mass. However, they were easily disintegrated and a generated substance (D'4-2), which did not have a form of aggregates, was obtained.

Comparative Example 4-3

Easily deformable aggregates (D'4-3) having an average particle diameter of about 20 μm for which the average compressive force required for a 10% compressive deformation rate was about 1.0 mN and the maintaining rate of the average particle diameter after a shaking test was 15% were obtained in a manner similar to that for Example 4-3 except that the amount of the 4 mass % aqueous solution of poly(allylamine) used in Example 4-3 was 1,250 pts·mass (solid content: 50 pts·mass) and the amount of the ion-exchanged water was 50 pts·mass.

Comparative Example 4-4

A slurry was obtained in a manner similar to that for Comparative Example 4-3 except that a silane coupling agent ("KBM-04" manufactured by Shin-Etsu Chemical Co., Ltd.) and tetramethoxy silane (10 mass % solution): 20 pts·mass (solid content: 2 pts·mass) were used instead of the 4 mass % aqueous solution of poly(allylamine), and the amount of the ion-exchanged water was 130 pts·mass. Then, this slurry was sprayed, dried, and cured under a 125° C. atmosphere. As a result, easily deformable aggregates (D'4-4) having an average particle diameter of about 25 μm for which the average compressive force required for a 10%0/ compressive deformation rate was about 60 mN and the maintaining rate of the average particle diameter after a shaking test was 78% were obtained.

Comparative Example 4-5

A slurry was obtained in a manner similar to that for Comparative Example 4-4. Then, after spraying and drying this slurry under a 125° C. atmosphere, the dried substance was sintered at 2,100° C., which was equal to or higher than the melting point of alumina. As a result, easily deformable aggregates (D'4-5) having an average particle diameter of about 23 μm for which the average compressive force required for a 10% compressive deformation rate was about 176 mN and the maintaining rate of the average particle diameter after a shaking test was 96% were obtained.

Comparative Example 4-6

To obtain easily deformable aggregates, processes similar to those for Example 4-1 were carried out except that 100 pts·mass of alumina particles ("AL-33" manufactured by Sumitomo Chemical Co., Ltd., average primary particle diameter: about 12 μm, average roundness: 0.9), 2 pts·mass of an epoxy resin composition ("Epicoat 1010" manufactured by Japan Epoxy Resins Co., Ltd.), thermally conductive fibers (P4): 5 pts·mass (solid content: 5 pts·mass), and toluene: 145 pts·mass were used. However, they were easily disintegrated and a generated substance (D'4-6), which did not have a form of aggregates, was obtained.

Tables 4-1 and 4-2 show the key manufacturing conditions and the evaluation results of Examples 4-1 to 4-7 and Comparative Examples 4-1 to 4-6.

As shown in Tables 4-1 and 4-2, the average primary particle diameter of the thermally conductive particles (A) is preferably equal to or less than 10 μm and the use of both the organic binding agent (B) and the thermally conductive fibers (P) is preferred in order to generate aggregates. No aggregates could be formed in Comparative Examples 4-1, 4-2 and 4-6. As can be seen from Comparative Example 4-3, when the amount of the organic binding agent (B) is too large, the aggregates are further agglomerated during the shaking process and they are denatured due to the impacts. As can be seen from Comparative Examples 4-4 and 4-5, when the thermally conductive particles (A) are strongly bound with each other by using, for example, a silane coupling agent as the organic binding agent and/or performing the sintering at a temperature equal to or higher than the melting point of alumina, the easy deformability becomes poor. In Comparative Example 4-7, the amount of thermally conductive fibers that are not contained in the aggregates is larger, making the aggregates prone to be disintegrated.

Example 4-8

Firstly, 37.1 pts·mass of easily deformable aggregates (D4-1) obtained in Example 4-1 (average particle diameter 10 μm), 31.5 pts·mass of a 30% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H4-1) including a thermally conductive layer having a thickness of 50 μm was obtained. Its thermal conductivity was 3.5 (W/m·K). This thermally conductive member (H4-1) was pressed under a pressure of 2 MPa at 150° C. for one hour. As a result, a thermally conductive member (I4-1) (thermally conductive adhesive sheet) that includes a thermally conductive layer having a thickness of 45 μm and has a thermal conductivity of 6.7 (W/m·K) was obtained.

Example 4-9

Firstly, 37.1 pts·mass of easily deformable aggregates (D4-2) obtained in Example 4-2 (average particle diameter 20 μm), 31.5 pts·mass of a 30% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 70 vol % was obtained.

By using the obtained thermally conductive resin composition, a thermally conductive member (H4-2) that includes a thermally conductive layer having a thickness of 65 μm and has a thermal conductivity of 3.2 (W/m·K) was obtained in a manner similar to that for Example 4-8. Further, by performing a pressing process in a manner similar to that for Example 4-8, a thermally conductive member (I4-2) that includes a thermally conductive layer having a thickness of 60 μm and has a thermal conductivity of 6.0 (W/m·K) was obtained.

Example 4-10

Firstly, 32.4 pts·mass of easily deformable aggregates (D4-3) obtained in Example 4-3 (average particle diameter 45 μm), 50.4 pts·mass of a 30% toluene/2-propanol solution of a polyurethane polyurea resin (E-1) obtained in Resin Synthesis Example 1, and 5.0 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of 2-propanol and 25.8 pts·mass of toluene, ultrasound defoaming was performed. As a result, a thermally conductive resin composition containing easily deformable aggregates in 40 vol % was obtained.

By using the obtained thermally conductive resin composition, a thermally conductive member (H4-3) that includes a thermally conductive layer having a thickness of 60 μm and has a thermal conductivity of 4.0 (W/m·K) was obtained in a manner similar to that for Example 4-8. Further, by performing a pressing process in a manner similar to that for Example 4-8, a thermally conductive member (I4-3) that includes a thermally conductive layer having a thickness of 55 μm and has a thermal conductivity of 7.2 (W/m·K) was obtained.

Example 4-11

Firstly, 36.0 pts·mass of easily deformable aggregates (D4-4) obtained in Example 4-4 (average particle diameter 15 μm), 36.0 pts·mass of a 35% toluene solution of a carboxyl group-containing denatured ester resin (E-2) obtained in Resin Synthesis Example 2, and 1 pts·mass of Chemitight PZ (manufactured by Nippon Shokubai Co., Ltd.), which was used as a thermally-curing assistant agent, were mixed and stirred by using a disper. Then, after its viscosity was adjusted by 5.8 pts·mass of 2-propanol and 23.2 pts·mass of toluene, ultrasound defoaming was performed. As a result, a thermally conductive resin composition containing easily deformable aggregates in 50 vol % was obtained.

By using the obtained thermally conductive resin composition, a thermally conductive member (H4-4) that includes a thermally conductive layer having a thickness of 50 μm and has a thermal conductivity of 4.7 (W/m·K) was obtained in a manner similar to that for Example 4-8. Further, by performing a pressing process in a manner similar to that for Example 4-8, a thermally conductive member (I4-4) that includes a thermally conductive layer having a thickness of 44 μm and has a thermal conductivity of 8.3 (W/m·K) was obtained.

Example 4-12

Firstly, 22.8 pts·mass of easily deformable aggregates (D4-5) obtained in Example 4-5 (average particle diameter 30 μm), 17.0 pts·mass of a 25% ethyl acetate solution of an acrylic resin (E-3) obtained in Resin Synthesis Example 3, and 1.72 pts·mass of Chemitight PZ (manufactured by Nippon Shokubai Co., Ltd.), which was used as a thermally-curing assistant agent, were mixed and stirred by using a disper. Then, after its viscosity was adjusted by 11.0 pts·mass of methyl ethyl ketone (MEK), ultrasound defoaming was performed. As a result, a thermally conductive resin composition containing easily deformable aggregates in 50 vol % was obtained.

By using the obtained thermally conductive resin composition, a thermally conductive member (H4-5) that includes a thermally conductive layer having a thickness of 50 μm and has a thermal conductivity of 2.0 (W/m·K) was obtained in a manner similar to that for Example 4-8. Further, by performing a pressing process in a manner similar to that for Example 4-8, a thermally conductive member (I4-5) that includes a thermally conductive layer having a thickness of 45 μm and has a thermal conductivity of 3.1 (W/m·K) was obtained.

Example 4-13

Firstly, 38.3 pts·mass of easily deformable aggregates (D4-6) obtained in Example 4-6 (average particle diameter 20 μm) and 13.8 pts·mass of an aqueous emulsion resin (Polysol AX-590 manufactured by Showa Denko K.K., solid content 49%) were mixed and stirred by using a disper. Then, after its viscosity was adjusted by 48.0 pts·mass of water, ultrasound defoaming was performed. As a result, a thermally conductive resin composition containing easily deformable aggregates in 60 vol % was obtained.

By using the obtained thermally conductive resin composition, a thermally conductive member (H14-6) that includes a thermally conductive layer having a thickness of 50 μm and has a thermal conductivity of 1.8 (W/m·K) was obtained in a manner similar to that for Example 4-8. Further, by performing a pressing process in a manner similar to that for Example 4-8, a thermally conductive member (I4-6) that includes a thermally conductive layer having a thickness of 45 μm and has a thermal conductivity of 3.0 (W/m·K) was obtained.

Example 4-14

Firstly, 22.8 pts·mass of easily deformable aggregates (D4-7) obtained in Example 4-7 (average particle diameter 40 μm), 18.0 pts·mass of a 25% ethyl acetate solution of an acrylic resin (E-3) obtained in Resin Synthesis Example 3, and 1.72 pts·mass of Chemitight PZ (manufactured by Nippon Shokubai Co., Ltd.), which was used as a thermally-curing assistant agent, were mixed and stirred by using a disper. Then, after its viscosity was adjusted by 11.0 pts·mass of methyl ethyl ketone (MEK), ultrasound defoaming was performed. As a result, a thermally conductive resin composition containing easily deformable aggregates in 55 vol % was obtained.

By using the obtained thermally conductive resin composition, a thermally conductive member (H4-7) that includes a thermally conductive layer having a thickness of 45 μm and has a thermal conductivity of 5.4 (W/m·K) was obtained in a manner similar to that for Example 4-8. Further, by performing a pressing process in a manner similar to that for Example 4-8, a thermally conductive member (I4-7) that includes a thermally conductive layer having a thickness of 40 μm and has a thermal conductivity of 6.3 (W/m·K) was obtained.

Comparative Example 4-7

Firstly, 36.0 pts·mass of a spherical aluminum oxide powder having an average primary particle diameter of 1 μm (AO-502 manufactured by Admatechs Co., Ltd.), 36.0 pts·mass of a 30% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

The obtained resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H'4-1) that includes a thermally conductive layer having a thickness of 50 μm and has a thermal conductivity of 0.5 (W/m·K) was obtained. Further, a release-treated sheet was placed over the obtained thermally conductive member (H'4-1), and then the laminated body was pressed under a pressure of 2 MPa at 150° C. for one hour. As a result, a thermally conductive member (I'4-1) having a thickness of 45 μm and a thermal conductivity of 0.8 (W/m·K) was obtained.

Comparative Example 4-8

Firstly, 36.0 pts·mass of a spherical aluminum oxide powder having an average primary particle diameter of 20 μm (CB-A20S manufactured by Showa Denko K.K.), 36.0 pts·mass of a 30% toluene/2-propanol solution of a polyurethane polyurea resin (E-1) obtained in Resin Synthesis Example 1, and 3.6 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 5.7 pts·mass of 2-propanol and 22.7 pts·mass of toluene, ultrasound defoaming was performed. As a result, a resin composition containing an aluminum oxide in 50 vol % was obtained.

By using the obtained resin composition, a thermally conductive member (H'4-2) that includes a thermally conductive layer having a thickness of 50 μm and has a thermal conductivity of 0.4 (W/m·K) was obtained in a manner similar to that for Comparative Example 4-7. Further, by performing a pressing process in a manner similar to that for Comparative Example 4-7, a thermally conductive member (I'4-2) having a thickness of 45 μm and a thermal conductivity of 0.7 (W/m·K) was obtained.

Comparative Example 4-9

Firstly, 38.3 pts·mass of aggregates (D'4-3) obtained in Comparative Example 4-3 (average particle diameter 20 μm), 27.0 pts·mass of a 30% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'4-3) that includes a thermally conductive layer having a thickness of 60 μm and has a thermal conductivity of 0.5 (W/m·K) was obtained in a manner similar to that for Comparative Example 4-7. Further, by performing a pressing process in a manner similar to that for Comparative Example 4-7, a thermally conductive member (I'4-3) having a thickness of 50 μm and a thermal conductivity of 0.7 (W/m·K) was obtained.

Comparative Example 4-10

Firstly, 38.3 pts·mass of aggregates (D'4-4) obtained in Comparative Example 4-4 (average particle diameter 25 μm), 27.0 pts·mass of a 30% toluene/2-propanol solution of a polyurethane polyurea resin (E-1) obtained in Resin Synthesis Example 1, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing aggregates in 60 vol % was obtained.

By using the obtained resin composition, a thermally conductive member (H'4-4) that includes a thermally conductive layer having a thickness of 60 μm and has a thermal conductivity of 0.4 (W/m·K) was obtained in a manner similar to that for Comparative Example 4-7. Further, by performing a pressing process in a manner similar to that for Comparative Example 4-7, a thermally conductive member (I'4-4) having a thickness of 50 μm and a thermal conductivity of 0.5 (W/m·K) was obtained.

A lot of cracks caused by crushes of particles were observed in this sheet.

Comparative Example 4-11

Firstly, 38.3 pts·mass of aggregates (D'4-5) manufactured in Comparative Example 4-5 (average particle diameter 23 μm), 27.0 pts·mass of a 35% toluene solution of a carboxyl group-containing denatured ester resin (E-2) obtained in Resin Synthesis Example 2, and 2.7 pts·mass of a 50% MEK solution of a bisphenol A-type epoxy resin Epicoat 1001 (manufactured by Japan Epoxy Resins Co., Ltd.), which was used as a curing agent, were stirred by using a disper. Then, after its viscosity was adjusted by 7.0 pts·mass of 2-propanol and 28.0 pts·mass of toluene, ultrasound defoaming was performed. As a result, a resin composition containing non-aggregates in 60 vol % was obtained.

By using the obtained resin composition, a thermally conductive member (H'4-5) that includes a thermally conductive layer having a thickness of 60 μm and has a thermal conductivity of 0.7 (W/m·K) was obtained in a manner similar to that for Comparative Example 4-7. Further, by performing a pressing process in a manner similar to that for Comparative Example 4-7, a thermally conductive member (I'4-5) having a thickness of 50 μm and a thermal conductivity of 1.0 (W/m·K) was obtained.

A lot of cracks caused by crushes of particles were observed in this sheet.

Table 4-3 shows the key manufacturing conditions and the evaluation results of Examples 4-8 to 4-14 and Comparative Examples 4-7 to 4-11.

The solvents (F) in the table indicate only the substances that were added as a solvent.

As shown in Table 4-3, by carrying out a pressing process, a thermally conductive resin composition (G) including easily deformable aggregates (D) according to the present invention can provide a thermally conductive member (I) having an excellent thermal conductivity. As can be seen from Comparative Examples 4-7, 4-8, 4-10 and 4-11, resin compositions that do not include any easily deformable aggregates (D) in the thermally conductive resin compositions (G) cannot achieve a satisfactory thermal conductivity. As can be seen from Comparative Example 4-9, when the aggregates are disintegrated during the resin composition manufacturing process, a high thermal conductivity cannot be achieved because the resin content is large and there are not sufficient thermal conduction paths.

Example 5-1

Firstly, 100 pts·mass of alumina particles ("AO-502" manufactured by Admatechs Co., Ltd., average primary particle diameter: about 1 μm, average roundness: 0.99), a 4 mass % aqueous solution of polyvinyl alcohol ("Gohsenol NL-05" manufactured by Nippon Synthetic Chemical Industry Co., Ltd.): 125 pts·mass (solid content: 5 pts·mass), a carbon nano-tube dispersion substance ("LB200" manufactured by Cnano Technology Limited, average fiber diameter: 11 nm, average fiber length: 10 μm): 100 pts·mass (solid content: 5 pts·mass), and ion-exchanged water: 25 pts·mass were dispersed for one hour by using an ultrasound homogenizer to obtain a slurry thereof.

This slurry was sprayed and dried under a 125° C. atmosphere by using ("B-290" manufactured by Nihon-Buchi K.K.). As a result, easily deformable aggregates (D5-1) having an average particle diameter of about 10 μm for which the average compressive force required for a 10% compressive deformation rate was about 0.7 mN and the maintaining rate of the average particle diameter after a shaking test was 98% were obtained.

Example 5-2

Easily deformable aggregates (D5-2) having an average particle diameter of about 20 μm for which the average compressive force required for a 10% compressive deformation rate was about 0.6 mN and the maintaining rate of the average particle diameter after a shaking test was 94% were obtained in a manner similar to that for Example 5-1 except that 100 pts·mass of alumina particles ("CB-P02" manufactured by Showa Denko K.K., average primary particle diameter, about 2 μm, average roundness: 0.98), the aforementioned 4 mass % aqueous solution of polyvinyl alcohol: 50 pts·mass (solid content: 2 pts·mass), a carbon nano-tube dispersion substance ("LB200" manufactured by Cnano Technology Limited): 40 pts·mass (solid content: 2 pts·mass), and ion-exchanged water: 100 pts·mass were used.

Example 5-3

Easily deformable aggregates (D5-3) having an average particle diameter of about 50 μm for which the average compressive force required for a 10% compressive deformation rate was about 4.1 mN and the maintaining rate of the average particle diameter after a shaking test was 91% were obtained in a manner similar to that for Example 5-1 except that 100 pts. of alumina particles ("AO-509" manufactured by Admatechs Co., Ltd., average primary particle diameter: about 10 μm, average roundness: 0.99), a 40 mass % aqueous solution of a dispersing agent ("BYK-190" manufactured by BYK Japan K.K.): 1.25 pts·mass (solid content: 0.5 pts·mass), a carbon nano-tube dispersion substance ("LB200" manufactured by Cnano Technology Limited): 10 pts·mass (solid content: 0.5 pts·mass), and ion-exchanged water: 137.5 pts·mass were used.

Example 5-4

Easily deformable aggregates (D5-4) having an average particle diameter of about 30 μm for which the average compressive force required for a 10% compressive deformation rate was about 1.1 mN and the maintaining rate of the average particle diameter after a shaking test was 96% were obtained in a manner similar to that for Example 5-1 except that 70 pts·mass of alumina particles ("AO-502" manufactured by Admatechs Co., Ltd., average primary particle diameter: about 1 μm, average roundness: 0.99), 30 pts·mass of alumina particles ("AO-509" manufactured by Admatechs Co., Ltd., average primary particle diameter: about 10 μm, average roundness: 0.99), the aforementioned 4 mass % aqueous solution of polyvinyl alcohol: 50 pts·mass (solid content: 2 pts·mass), a carbon nano-tube dispersion substance ("LB200" manufactured by Cnano Technology Limited): 40 pts·mass (solid content: 2 pts·mass), and ion-exchanged water: 100 pts·mass were used.

Example 5-5

Easily deformable aggregates (D5-5) having an average particle diameter of about 15 μm for which the average compressive force required for a 10% compressive deformation rate was about 1.1 mN and the maintaining rate of the average particle diameter after a shaking test was 98% were obtained in a manner similar to that for Example 5-1 except that 100 pts·mass of an aluminum nitride ("H-grade" manufactured by Tokuyama Corporation, average primary particle diameter: about 1 μm, average roundness: 0.97), the aforementioned 4 mass % aqueous solution of polyvinyl alcohol: 50 pts·mass (solid content: 2 pts·mass), a carbon nano-tube dispersion substance ("LB200" manufactured by Cnano Technology Limited): 100 pts·mass (solid content: 5 pts·mass), and ion-exchanged water: 100 pts·mass were used.

Example 5-6

Easily deformable aggregates (D5-6) having an average particle diameter of about 40 μm for which the average compressive force required for a 10% compressive deformation rate was about 2.1 mN and the maintaining rate of the average particle diameter after a shaking test was 93% were obtained in a manner similar to that for Example 5-1 except that 100 pts·mass of alumina particles ("CB-P05" manufactured by Showa Denko K.K., average primary particle diameter: about 5 μm, average roundness: 0.99), a 20 mass % an aqueous solution of polyvinyl pyrrolidone ("K-85W" manufactured by Nippon Shokubai Co., Ltd.): 25 pts·mass (solid content: 10 pts·mass), a carbon nano-tube dispersion substance ("LB200" manufactured by Cnano Technology Limited): 100 pts·mass (solid content: 5 pts·mass), and ion-exchanged water: 125 pts·mass were used.

Example 5-7

Easily deformable aggregates (D5-7) having an average particle diameter of about 20 μm for which the average compressive force required for a 10% compressive deformation rate was about 0.8 mN and the maintaining rate of the average particle diameter after a shaking test was 99% were obtained in a manner similar to that for Example 5-1 except that the amount of the aforementioned 4 mass % aqueous solution of polyvinyl alcohol was 750 pts·mass (solid content: 30 pts·mass) and the amount of the ion-exchanged water was 150.

Example 5-8

Easily deformable aggregates (D5-8) having an average particle diameter of about 5 μm for which the average compressive force required for a 10% compressive deformation rate was about 0.3 mN and the maintaining rate of the average particle diameter after a shaking test was 99% were obtained in a manner similar to that for Example 5-1 except that 100 pts·mass of alumina particles ("ASFP-20" manufactured by Denki Kagaku Kogyo K.K., average primary particle diameter: about 0.3 μm, average roundness: 0.99), the aforementioned 4 mass % aqueous solution of polyvinyl alcohol: 50 pts·mass (solid content: 2 pts·mass), XG Sciences, Inc. (scale-like graphene powder M-grade, average aspect ratio: 3,000, average thickness: 3 nm): 1 pts·mass, and ion-exchanged water: 100 pts·mass were used.

Example 5-9

Easily deformable aggregates (D5-9) having an average particle diameter of about 20 μm for which the average compressive force required for a 10% compressive deformation rate was about 0.8 mN and the maintaining rate of the average particle diameter after a shaking test was 94% were obtained in a manner similar to that for Example 5-1 except that 100 pts·mass of alumina particles ("AO-502" manufactured by Admatechs Co., Ltd., average primary particle diameter: about 1 μm, average roundness: 0.99), a 20 mass % toluene solution of a polyester resin (Vylon 200 manufactured by Toyobo Co., Ltd.): 10 pts·mass (solid content: 2 pts·mass), 3 pts·mass of carbon nano-tubes ("AMC" manufactured by Ube Industries, Ltd., average fiber diameter: 11 nm, average fiber length: 2 μm), and toluene: 200 pts·mass were used, and the temperature of the splaying and drying process was changed from 125° C. to 140° C.

Tables 5-1 and 5-2 show the key manufacturing conditions and the evaluation results of Examples 5-1 to 5-9.

As shown in Tables 5-1 and 5-2, the average primary particle diameter of the thermally conductive particles (A) needs to be equal to or less than 10 μm and the use of the organic binding agent (B) is necessary in order to generate aggregates.

Example 5-101

Firstly, 37.1 pts·mass of easily deformable aggregates (D5-1) obtained in Example 5-1 (average particle diameter 10 μm), 31.5 pts·mass of a 25% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 50 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. As a result, a thermally conductive member (H5-1) including a thermally conductive layer having a thickness of 50 μm was obtained. Its thermal conductivity was 5 (W/m·K).

Example 5-102

A release-treated sheet was placed over the thermally conductive layer of the thermally conductive member (H5-1) obtained in Example 5-101, and then the laminated body was pressed under a pressure of 2 MPa at 150° C. for one hour. As a result, a thermally conductive member (I5-2) that includes a thermally conductive layer having a thickness of 45 μm, contains easily deformable aggregates (D5-1) in 50 vol %, and has a thermal conductivity of 8.5 (W/m·K) was obtained.

Example 5-103

Firstly, 37.1 pts·mass of easily deformable aggregates (D5-2) obtained in Example 5-2 (average particle diameter 20 μm), 31.5 pts·mass of a 25% toluene/2-propanol solution of a polyurethane polyurea resin (E-1) obtained in Resin Synthesis Example 1, and 3.15 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 70 vol % was obtained.

The obtained thermally conductive resin composition was applied to a release-treated sheet (mold-release-treated polyethylene terephthalate film having a thickness of 75 μm) by using a comma coater and then the coated release-treated sheet was heated and dried at 100° C. for two minutes. Then, another release-treated sheet was placed over the thermally conductive layer of the coated release-treated sheet, and then the laminated body was pressed under a pressure of 2 MPa at 150° C. for one hour. As a result, a thermally conductive member (I5-3) that includes a thermally conductive layer having a thickness of 60 μm and has a thermal conductivity of 11 (W/m·K) was obtained.

Example 5-104

Firstly, 32.4 pts·mass of easily deformable aggregates (D5-3) obtained in Example 5-3 (average particle diameter 50 μm), 50.4 pts·mass of a 25% toluene/2-propanol solution of a polyurethane polyurea resin (E-1) obtained in Resin Synthesis Example 1, and 5.0 pts·mass of a 50% MEK solution of Epicoat 1031S (manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates in 40 vol % was obtained.

By using the obtained thermally conductive resin composition, a thermally conductive member (I5-4) that includes a thermally conductive layer having a thickness of 60 μm and has a thermal conductivity of 7 (W/m·K) was obtained in a manner similar to that for Example 5-103.

Example 5-105

Firstly, 36.0 pts·mass of easily deformable aggregates (D5-4) obtained in Example 5-4 (average particle diameter 30 μm), 36.0 pts·mass of a 25% toluene solution of a carboxyl group-containing denatured ester resin (E-2) obtained in Resin Synthesis Example 2, and 1 pts·mass of Chemitight PZ (manufactured by Nippon Shokubai Co., Ltd.) were mixed and stirred by using a disper. Chemitight PZ was used as a thermally-curing assistant agent. Then, after its viscosity was adjusted by 5.8 pts·mass of isopropyl alcohol and 23.2 pts·mass of toluene, ultrasound defoaming was performed. As a result, a thermally conductive resin composition containing easily deformable aggregates in 50 vol % was obtained.

By using the obtained thermally conductive resin composition, a thermally conductive member (I5-5) that includes a thermally conductive layer having a thickness of 45 μm and has a thermal conductivity of 8.5 (W/m·K) was obtained in a manner similar to that for Example 5-103.

Example 5-106

Firstly, 36.0 pts·mass of easily deformable aggregates (D5-8) obtained in Example 5-8 (average particle diameter 5 μm), 36.0 pts·mass of a 25% toluene/2-propanol solution of a polyurethane polyurea resin (E-1) obtained in Resin Synthesis Example 1, and 3.15 pts·mass of a 50% MEK solution of a bisphenol A-type epoxy resin ("Epicoat 1001" manufactured by Japan Epoxy Resins Co., Ltd.), which was used as a curing agent, were stirred by using a disper. Then, after its viscosity was adjusted by 6.5 pts·mass of isopropyl alcohol and 25.8 pts·mass of toluene, ultrasound defoaming was performed. As a result, a thermally conductive resin composition containing easily deformable aggregates of unusually-formed aggregates in 50 vol % was obtained.

By using the obtained thermally conductive resin composition, a thermally conductive member (I5-6) that includes a thermally conductive layer having a thickness of 40 μm and has a thermal conductivity of 7 (W/m*K) was obtained in a manner similar to that for Example 5-103.

Example 5-107

Firstly, 7.4 pts·mass of easily deformable aggregates (D5-1) obtained in Example 5-1 (average particle diameter 10 μm), 29.7 pts·mass of spherical alumina having an average primary particle diameter of 20 μm (CB-P20 manufactured by Showa Denko K.K.), 31.5 pts·mass of a 25% toluene solution of a carboxyl group-containing denatured ester resin (E-2) obtained in Resin Synthesis Example 2, and 3.2 pts·mass of a 50% MEK solution of a bisphenol A-type epoxy resin ("Epicoat 1001" manufactured by Japan Epoxy Resins Co., Ltd.), which was used as a curing agent, were stirred by using a disper. Then, after its viscosity was adjusted by 0.4 pts·mass of isopropyl alcohol and 1.6 pts·mass of toluene, ultrasound defoaming was performed. As a result, a thermally conductive resin composition containing easily deformable aggregates in 55 vol % was obtained.

By using the obtained thermally conductive resin composition, a thermally conductive member (I5-7) that includes a thermally conductive layer having a thickness of 40 μm and has a thermal conductivity of 8.5 (W/m·K) was obtained in a manner similar to that for Example 5-103.

Example 5-108

Firstly, 19.2 pts·mass of easily deformable aggregates (D5-2) obtained in Example 5-2 (average particle diameter 20 μm), 19.2 pts·mass of spherical alumina having an average primary particle diameter of 10 μm ("AO-509" manufactured by Admatechs Co., Ltd.), 26.1 pts·mass of a 25% toluene/2-propanol solution of a polyurethane polyurea resin (E-1) obtained in Resin Synthesis Example 1, and 2.6 pts·mass of Chemitight PZ (manufactured by Nippon Shokubai Co., Ltd.), which was used as a thermally-curing assistant agent, were stirred by using a disper. Then, after its viscosity was adjusted by 3.3 pts·mass of isopropyl alcohol and 13.2 pts·mass of toluene, ultrasound defoaming was performed. As a result, a thermally conductive resin composition containing easily deformable aggregates in 60 vol % was obtained.

By using the obtained thermally conductive resin composition, a thermally conductive member (I5-8) that includes a thermally conductive layer having a thickness of 40 μm and has a thermal conductivity of 8.5 (W/m·K) was obtained in a manner similar to that for Example 5-103.

Example 5-109

Firstly, 34.0 pts·mass of easily deformable aggregates (D5-2) obtained in Example 5-2 (average particle diameter 20 μm), 64.0 pts·mass of a 25% ethyl acetate solution of an acrylic resin (E-3) obtained in Resin Synthesis Example 3, and 0.8 pts·mass of an epoxy-based curing agent Tetrad-X (manufactured by Mitsubishi Gas Chemical Company, Inc.), which was used as a curing agent, were stirred by using a disper. Then, after its viscosity was adjusted by 2.8 pts·mass of toluene, ultrasound defoaming was performed. As a result, a thermally conductive resin composition containing easily deformable aggregates in 35 vol % was obtained.

The obtained thermally conductive composition was uniformly applied on a release-treated polyester film and dried thereon, and a pressure-sensitive adhesive layer was thereby provided. Next, another release-treated polyester film was laminated on the pressure-sensitive adhesive layer side of the original release-treated polyester film. As a result, a thermally conductive member (H5-9) that includes a thermally conductive layer having a thickness of 50 μm and has a thermal conductivity of 4 (W/m·K) was obtained.

Example 5-110

Firstly, 56.5 pts·mass of easily deformable aggregates (D5-5) obtained in Example 5-5 (average particle diameter 15 μm) and 43.5 pts·mass of a polystyrene resin PSJ Polystyrene 679 (manufactured by PS Japan Corporation), which was used as a thermoplastic resin, were stirred and mixed. Then, the mixture was melted and kneaded at 200° C. by using a twin-screw extruder. As a result, a thermally conductive resin composition containing easily deformable aggregates in 25 vol % was obtained.

By using the obtained thermally conductive resin composition, a thermally conductive member (I5-10) having a thickness of 1 mm and a thermal conductivity of 12 (W/m·K) was molded by using an injection molding machine (IS-100F manufactured by Toshiba Machine Co., Ltd.).

Example 5-111

Firstly, 61.6 pts·mass of easily deformable aggregates (D5-6) obtained in Example 5-6 (average particle diameter 40 μm), 18.7 pts·mass of a polyester urethane resin Vylon UR6100 (manufactured by Toyobo Co., Ltd.), and 0.08 pts·mass of an epoxy-based curing agent Tetrad-X (manufactured by Mitsubishi Gas Chemical Company, Inc.), which was used as a curing agent, were stirred by using a disper. Then, after its viscosity was adjusted by 20.0 pts·mass of toluene, ultrasound defoaming was performed. As a result, a thermally conductive resin composition containing easily deformable aggregates in 65 vol % was obtained.

By using the obtained thermally conductive resin composition, a thermally conductive member (I5-11) that includes a thermally conductive layer having a thickness of 100 μm and has a thermal conductivity of 8.5 (W/m·K) was obtained in a manner similar to that for Example 5-103.

Example 5-112

Firstly, 94.0 pts·mass of easily deformable aggregates (D5-7) obtained in Example 5-7 (average particle diameter 20 Gun) and 6.0 pts·mass of ethylene-methacrylic acid copolymer were mixed and the mixture was put into a mold. After degasing it, a load of 3 MPa was applied and the mixture was thereby pressed and compacted at 150° C. for one hour. As a result, a thermally conductive member (I5-12) that includes a thermally conductive layer having a thickness of 500 μm, contains easily deformable aggregates in 80 vol %, and has a thermal conductivity of 8 (W/m·K) was obtained.

Example 5-113

Firstly, 72.0 pts·mass of easily deformable aggregates (D5-9) obtained in Example 5-9 (average particle diameter 20 μm) and 28.0 pts·mass of a high density polyethylene resin Hizox 2100J (manufactured by Sumitomo Mitsui Polyolefin Co., Ltd.) were mixed, and then the mixture was heated and mixed by using a mixing/kneading machine. After the resultant substance was cooled and pulverized, the pulverized substance was extruded by an extrusion machine. As a result, a thermally conductive member (I5-13), which was in the form of pellets, was obtained and the obtained thermally conductive member (I5-13) contained easily deformable aggregates in 40 vol % and had a thermal conductivity of 7 (W/m·k).

Table 5-3 shows the key manufacturing conditions and the evaluation results of Examples 5-101 to 5-113.

The solvents (F) in the table indicate only the substances that were added as a solvent.

As shown in Table 5-3, easily deformable aggregates (D) according to the present invention have an excellent thermal conductivity.

Example 6-1

Firstly, 100 pts·mass of a boron nitride ("NX-1" manufactured by Momentive Performance Materials Japan Limited Liability Co., scale-like particles, primary particle diameter: 0.7 μm), a 4 mass % aqueous solution of polyvinyl alcohol ("Gohsenol NL-05" manufactured by Nippon Synthetic Chemical Industry Co., Ltd.): 25 pts·mass (solid content: 1 pts·mass), and ion-exchanged water: 25 pts·mass were stirred at 1,000 rpm for one hour by using a disper to obtain a slurry thereof.

This slurry was sprayed and dried under a 125° C. atmosphere by using ("B-290" manufactured by Nihon-Buchi K.K.). As a result, easily deformable aggregates (D6-1) having an average particle diameter of about 15 μm for which the average compressive force required for a 10% compressive deformation rate was about 3.5 mN and the maintaining rate of the average particle diameter after a shaking test was 85% were obtained.

Tables 6-1 and 6-2 show the key manufacturing conditions and the evaluation results of Example 6-1.

As shown in Tables 6-1 and 6-2, the average primary particle diameter of the thermally conductive particles (A) needs to be equal to or less than 10 μm and the use of the organic binding agent (B) is necessary in order to generate aggregates.

Example 6-101

Firstly, 31.5 pts·mass of easily deformable aggregates (D6-1) obtained in Example 6-1 (average particle diameter 15 nm), 54.0 pts·mass of a toluene/2-propanol solution of a polyurethane polyurea resin (E-1) obtained in Resin Synthesis Example 1, and 5.4 pts·mass of a 50% MEK solution of a bisphenol A-type epoxy resin ("Epicoat 1001" manufactured by Japan Epoxy Resins Co., Ltd.) were stirred by using a disper. Then, after its viscosity was adjusted by 3.1 pts·mass of isopropyl alcohol and 12.6 pts·mass of toluene, ultrasound defoaming was performed. As a result, a thermally conductive resin composition containing easily deformable aggregates in 50 vol % was obtained.

By using the obtained thermally conductive resin composition, a thermally conductive member (I6-1) that includes a thermally conductive layer having a thickness of 50 μm and has a thermal conductivity of 3.5 (W/m·K) was obtained in a manner similar to that for Example 1-103.

Table 6-3 shows the key manufacturing conditions and the evaluation results of Example 6-101.

The solvents (F) in the table indicate only the substances that were added as a solvent.

As shown in Table 6-3, a thermally conductive member (I) using easily deformable aggregates (D) according to the present invention has an excellent thermal conductivity.

The average compressive force of this example in which scale-like BN particles were used as the thermally conductive particles (A) was larger than those of Examples 1-1, 1-2 and 1-5, which were carried out under the same conditions except that spherical alumina particles were used in these examples. Further, it was found out that the aggregates of this example tended to be disintegrated more easily. Accordingly, spherical particles are preferred as the thermally conductive particles (A). However, BN is better than alumina in terms of the thermal conductivity. Therefore, the thermal conductivity of the obtained thermally conductive member (I6-1) was excellent. Non-spherical particles may be also used, provided that they have a high thermal conductivity.

TABLE 1-1

| | | Mixed compositions | | | | | |
|---|---|---|---|---|---|---|---|
| | | Thermally conductive particles (A) | | | Organic binding agent (B) | | |
| | | | Average primary particle diameter (μm) | Roundness | | Amount of (B) based on 100 pts mass of (A) (pts. mass) | Solvent (C) |
| Example 1-1 | D1-1 | AO-502 (alumina) | 1 | 0.99 | NL-05 | 5 | $H_2O$ |
| Example 1-2 | D1-2 | CB-P02 (alumina) | 2 | 0.98 | NL-05 | 2 | $H_2O$ |
| Example 1-3 | D1-3 | AO-509 (alumina) | 10 | 0.99 | NL-05 | 0.5 | $H_2O$ |
| Example 1-4 | D1-4 | AO-502/AO-509 (alumina) | 1/10 (*1) | 0.99 | NL-05 | 2 | $H_2O$ |
| Example 1-5 | D1-5 | H-grade (aluminium nitride) | 1 | 0.97 | NL-05 | 2 | $H_2O$ |
| Example 1-6 | D1-6 | CB-P05 (alumina) | 5 | 0.99 | K-85W | 10 | $H_2O$ |
| Example 1-7 | D1-7 | AO-502 (alumina) | 1 | 0.99 | NL-05 | 30 | $H_2O$ |
| Example 1-8 | D1-8 | ASFP-20 (alumina) | 0.3 | 0.99 | NL-05 | 2 | $H_2O$ |
| Example 1-9 | D1-9 | CB-P02 (alumina) | 2 | 0.98 | Vylon 200 | 2 | Tol |
| Example 1-10 | D1-10 | CB-P02 (alumina) | 2 | 0.98 | Vylon UR-1400 | 2 | Tol |
| Example 1-11 | D1-11 | CB-P02 (alumina) | 2 | 0.98 | NL-05 | 2 | $H_2O$ |
| Example 1-12 | D1-12 | CB-P02 (alumina) | 2 | 0.98 | NL-05 | 1 | $H_2O$ |

(*1): AO-502: 1 μm, AO-509: 10 μm

TABLE 1-2

| | | Properties | | |
|---|---|---|---|---|
| | | Average particle diameter (μm) | Average compressive force (mN) | Tolerance against disintegration (Maintaining rate of average particle diameter after shaking test (%)) |
| Example 1-1 | D1-1 | 10 | 0.6 | 97 |
| Example 1-2 | D1-2 | 20 | 0.5 | 93 |
| Example 1-3 | D1-3 | 50 | 4 | 90 |
| Example 1-4 | D1-4 | 30 | 1 | 95 |
| Example 1-5 | D1-5 | 15 | 1 | 97 |
| Example 1-6 | D1-6 | 40 | 2 | 92 |
| Example 1-7 | D1-7 | 20 | 0.7 | 98 |
| Example 1-8 | D1-8 | 5 | 0.2 | 98 |
| Example 1-9 | D1-9 | 20 | 0.7 | 93 |
| Example 1-10 | D1-10 | 20 | 0.5 | 93 |
| Example 1-11 | D1-11 | 100 | 4 | 97 |
| Example 1-12 | D1-12 | 50 | 0.4 | 92 |

TABLE 1-3

| | | Mixed compositions | | | | | |
|---|---|---|---|---|---|---|---|
| | | Thermally conductive particles (A) | | | Organic binding agent (B) | | |
| | | | Average primary particle diameter (μm) | Roundness | | Amount of (B) based on 100 pts. mass of (A) (pts. mass) | Solvent (C) |
| Comparative Ex. 1-13 | D'1-13 | CB-A20S (alumina) | 20 | 0.98 | NL-05 | 2 | $H_2O$ |
| Comparative Ex. 1-14 | D'1-14 | AO-502 (alumina) | 1 | 0.99 | — | 0 | $H_2O$ |
| Comparative Ex. 1-15 | D'1-15 | AO-502 (alumina) | 1 | 0.99 | NL-05 | 50 | $H_2O$ |
| Comparative Ex. 1-16 | D'1-16 | AO-502 (alumina) | 1 | 0.99 | KBM-04 | 2 | $H_2O$ |
| Comparative Ex. 1-17 | D'1-17 | AO-502 (alumina) | 1 | 0.99 | KBM-04 | 2 | $H_2O$ |
| Comparative Ex. 1-18 | D'1-18 | AO-509 (alumina) | 10 | 0.99 | NL-05 | 0.5 | $H_2O$ |
| Comparative Ex. 1-19 | D'1-19 | Seraph 05025 (plate-like alumina) | 5/0.2 (*2) | 0.5 | NL-05 | 2 | $H_2O$ |

TABLE 1-3-continued

| | | Mixed compositions | | | | |
|---|---|---|---|---|---|---|
| | | Thermally conductive particles (A) | | Organic binding agent (B) | | |
| | | Average primary particle diameter (μm) | Roundness | | Amount of (B) based on 100 pts. mass of (A) (pts. mass) | Solvent (C) |
| Comparative Ex. 1-20 | D'1-20 | AL-33 (alumina) 12 | 0.9 | Epicoat 1010 | 2 | Tol |

(*2): Width is 5 μm. Thickness is 0.2 μm (Measured by transmission electron microscope (TEM)).

TABLE 1-4

| | | Properties | | |
|---|---|---|---|---|
| | | Average particle diameter (μm) | Average compressive force (mN) | Tolerance against disintegration (Maintaining rate of average particle diameter after shaking test (%)) |
| Comparative Ex. 1-13 | D'1-13 | No aggregates could be formed. | | — |
| Comparative Ex. 1-14 | D'1-14 | No aggregates could be formed. | | — |
| Comparative Ex. 1-15 | D'1-15 | 20 | 0.8 | 97 |
| Comparative Ex. 1-16 | D'1-16 | 15 | 42 | 75 |
| Comparative Ex. 1-17 | D'1-17 | 15 | 200 | 98 |
| Comparative Ex. 1-18 | D'1-18 | No aggregates could be formed. | | — |
| Comparative Ex. 1-19 | D'1-19 | 30 | 15 | 50 |
| Comparative Ex. 1-20 | D'1-20 | No aggregates could be formed. | | — |

TABLE 1-5

| | | Thermally conductive resin composite (G) | | | |
|---|---|---|---|---|---|
| | Aggregates (D) | Content (vol %) | Other particles | Binder resin (E) | Solvent (F) |
| Example 1-101 | D1-1 | 50 | — | E-1 | Tol/IPA |
| Example 1-102 | D1-1 | 50 | — | E-1 | Tol/IPA |
| Example 1-103 | D1-2 | 70 | — | E-1 | Tol/IPA |
| Example 1-104 | D1-3 | 40 | — | E-1 | Tol/IPA |
| Example 1-105 | D1-4 | 50 | — | E-2 | Tol/IPA |
| Example 1-106 | D1-6 | 25 | — | E-2 | MEK |
| Example 1-107 | D1-7 | 80 | — | E-2 | Tol/IPA |
| Example 1-108 | D1-8 | 50 | — | E-1 | Tol/IPA |
| Example 1-109 | D1-9 | 60 | — | Polysol AX-590 | water |
| Example 1-110 | D1-10 | 50 | — | Polysol AD-11 | water |
| Example 1-111 | D1-1 | 55 | CB-P20 | E-2 | Tol/IPA |
| Example 1-112 | D1-2 | 60 | AO-509 | E-1 | Tol/IPA |
| Example 1-113 | D1-2 | 35 | — | E-3 | Tol |
| Example 1-114 | D1-6 | 65 | — | Vylon UR6100 | Tol |
| Example 1-116 | D1-11 | 70 | — | E-1 | Tol/IPA |
| Example 1-116 | D1-12 | 50 | — | E-1 | Tol/IPA |
| Example 1-117 | D1-12 | 50 | — | E-1 | Tol/IPA |
| Example 1-118 | D1-12 | 50 | — | E-1 | Tol/IPA |
| Example 1-119 | D1-5 | 25 | — | PSJ Polystyrene 679 | — |
| Example 1-120 | D1-7 | 80 | — | ethylene-methacrylic acid copolymer | — |
| Example 1-121 | D1-9 | 40 | — | Hizox 2100J | — |

TABLE 1-6

| | Thermally conductive member (H) | | Thermally conductive member (I) | |
|---|---|---|---|---|
| | Particle diameter/ Film thickness (%) | Thermal conductivity (W/mK) | Pressurization | Thermal conductivity (W/mK) |
| Example 1-101 | 20 | 3 | Not applied | — |
| Example 1-102 | 20 | 3 | Applied | 6.5 |
| Example 1-103 | 31 | 3 | Applied | 10 |
| Example 1-104 | 77 | 2.5 | Applied | 5.5 |
| Example 1-105 | 60 | 2.8 | Applied | 7 |
| Example 1-106 | 30 | 0.9 | Applied | 1.5 |
| Example 1-107 | 40 | 3 | Applied | 12 |
| Example 1-108 | 11 | 2.3 | Applied | 5 |
| Example 1-109 | 40 | 1.2 | Applied | 2.9 |
| Example 1-110 | 40 | 1 | Applied | 2.5 |
| Example 1-111 | 22 | 2.8 | Applied | 6.5 |
| Example 1-112 | 44 | 2.9 | Applied | 7.5 |
| Example 1-113 | 40 | 2 | Not applied | — |
| Example 1-114 | 36 | 2.8 | Applied | 6.5 |
| Example 1-115 | 77 | 2.7 | Applied | 6 |
| Example 1-116 | 100 | 3 | Applied | 9 |
| Example 1-117 | 50 | 2.4 | Applied | 6.5 |
| Example 1-118 | 17 | 1.8 | Applied | 2.5 |
| Example 1-119 | | — | Applied | 10 |
| Example 1-120 | | — | Applied | 6 |
| Example 1-121 | | — | Applied | 3.5 |

TABLE 1-7

| | Thermally conductive resin composite (G) | | | | | |
|---|---|---|---|---|---|---|
| | Aggregates (D) | | | | Binder | |
| | | | Content (vol %) | Other particles (E) | resin | Solvent (F) |
| Comparative Ex. 1-101 | Non-aggregates | AO-502 | 50 | — | E-1 | Tol/IPA |
| Comparative Ex. 1-102 | Non-aggregates | CB-P20 | 50 | — | E-1 | Tol/IPA |
| Comparative Ex. 1-103 | | D'1-13 | 50 | — | E-1 | Tol/IPA |
| Comparative Ex. 1-104 | | D'1-14 | 50 | — | E-1 | Tol/IPA |
| Comparative Ex. 1-105 | | D'1-15 | 60 | — | E-1 | Tol/IPA |
| Comparative Ex. 1-106 | | D'1-16 | 60 | — | E-1 | Tol/IPA |
| Comparative Ex. 1-107 | | D'1-17 | 60 | — | E-1 | Tol/IPA |
| Comparative Ex. 1-108 | | D'1-18 | 60 | — | E-2 | Tol/IPA |
| Comparative Ex. 1-109 | | D'1-19 | 60 | — | E-1 | Tol/IPA |
| Comparative Ex. 1-110 | | D'1-20 | 60 | — | E-2 | Tol/IPA |
| Comparative Ex. 1-111 | | D1-1 | 15 | — | E-2 | MEK |
| Comparative Ex. 1-112 | | D1-1 | 92 | — | E-2 | MEK |
| Comparative Ex. 1-113 | | D1-10 | 60 | — | E-1 | Tol/IPA |

TABLE 1-8

| | Thermally conductive member (H) | | Thermally conductive member (I) | |
|---|---|---|---|---|
| | Particle diameter/Film thickness (%) | Thermal conductivity (W/mK) | Pressurization | Thermal conductivity (W/mK) |
| Comparative Ex. 1-101 | — | 0.5 | Applied | 0.8 |
| Comparative Ex. 1-102 | — | 0.4 | Applied | 0.7 |
| Comparative Ex. 1-103 | — | 0.4 | Applied | 0.7 |
| Comparative Ex. 1-104 | — | 0.5 | Applied | 0.8 |
| Comparative Ex. 1-105 | — | 0.1 | Applied | 0.3 |
| Comparative Ex. 1-106 | — | 0.2 | Applied | 0.4 |
| Comparative Ex. 1-107 | — | 0.3 | Applied | 0.5 |
| Comparative Ex. 1-108 | — | 0.7 | Applied | 0.9 |
| Comparative Ex. 1-109 | — | 0.1 | Applied | 0.3 |
| Comparative Ex. 1-110 | — | 0.7 | Applied | 0.9 |
| Comparative Ex. 1-111 | — | 0.1 | Applied | 0.3 |
| Comparative Ex. 1-112 | — | — | — | — |
| Comparative Ex. 1-113 | — | 0.5 | Applied | 0.8 |

TABLE 2-1

| | | Mixed compositions | | | | | |
|---|---|---|---|---|---|---|---|
| | | Thermally conductive particles (A) | | | Organic binding agent (B) | | |
| | | | Average primary particle diameter (μm) | Roundness | | Solid content of (B) based on 100 pts. mass of (A) (pts. mass) | Solvent (C) |
| Example 2-1 | D2-1 | AO-502 (alumina) | 1 | 0.99 | poly (ethylene imine) | 5 | H₂O |
| Example 2-2 | D2-2 | CB-P02 (alumina) | 2 | 0.98 | poly (allylamine) | 2 | H₂O |
| Example 2-3 | D2-3 | AO-509 (alumina) | 10 | 0.99 | poly (diallylamine) hydrocloride | 0.5 | H₂O |
| Example 2-4 | D2-4 | H-grade (aluminium nitride) | 1 | 0.97 | poly (N-isopropyl acrylamide) | 2 | H₂O |
| Example 2-5 | D2-5 | CB-P05 (alumina) | 5 | 0.99 | poly (vinyl pyrrolidone) | 10 | H₂O |
| Example 2-6 | D2-6 | AO-502 (alumina) | 1 | 0.99 | polyurethane resin | 2 | Tol |
| Example 2-7 | D2-7 | AO-502 (alumina) | 1 | 0.99 | poly (ethylene imine) | 5 | H₂O |
| Comparative Ex. 2-1 | D'2-1 | CB-A20S (alumina) | 20 | 0.98 | poly (allylamine) | 2 | H₂O |
| Comparative Ex. 2-2 | D'2-2 | AO-502 (alumina) | 1 | 0.99 | — | 0 | H₂O |
| Comparative Ex. 2-3 | D'2-3 | AO-502 (alumina) | 1 | 0.99 | poly (ethylene imine) | 50 | H₂O |
| Comparative Ex. 2-4 | D'2-4 | AO-502 (alumina) | 1 | 0.99 | silane coupling agent | 2 | H₂O |
| Comparative Ex. 2-5 | D'2-5 | AO-502 (alumina) | 1 | 0.99 | silane coupling agent | 2 | H₂O |
| Comparative Ex. 2-6 | D'2-6 | AL-33 (alumina) | 12 | 0.9 | epoxy resin | 2 | Tol |

TABLE 2-2

| | | Properties | | |
|---|---|---|---|---|
| | | Average particle diameter (μm) | Average compressive force (mN) | Tolerance against disintegration (Maintaining rate of average particle diameter after shaking test (%)) |
| Example 2-1 | D2-1 | 10 | 0.4 | 95 |
| Example 2-2 | D2-2 | 15 | 0.3 | 92 |
| Example 2-3 | D2-3 | 40 | 3.2 | 90 |
| Example 2-4 | D2-4 | 15 | 2 | 96 |
| Example 2-5 | D2-5 | 30 | 1 | 92 |
| Example 2-6 | D2-6 | 20 | 0.5 | 93 |
| Example 2-7 | D2-7 | 100 | 3 | 98 |
| Comparative Ex. 2-1 | D'2-1 | No aggregates could be formed. | | — |
| Comparative Ex. 2-2 | D'2-2 | No aggregates could be formed. | | — |
| Comparative Ex. 2-3 | D'2-3 | 20 | 0.8 | 12 |
| Comparative Ex. 2-4 | D'2-4 | 15 | 42 | 75 |
| Comparative Ex. 2-5 | D'2-5 | 15 | 200 | 98 |
| Comparative Ex. 2-6 | D'2-6 | No aggregates could be formed. | | — |

TABLE 2-3

| | Thermally conductive resin composite (G) | | | | Thermally conductive member (H) | Thermally conductive member (I) | |
|---|---|---|---|---|---|---|---|
| | Aggregates (D) | | Binder | | Thermal conductivity (W/mK) | Thermal conductivity (W/mK) | Adhesiveness (N/cm) |
| | | Content (vol %) | resin (E) | Solvent (F) | | | |
| Example 2-8 | D2-1 | 50 | E-1 | Tol/IPA | 3 | 6.6 | 18 |
| Example 2-9 | D2-2 | 70 | E-1 | Tol/IPA | 3 | 5.8 | 20 |
| Example 2-10 | D2-3 | 40 | E-1 | Tol/IPA | 2.5 | 5.5 | 22 |
| Example 2-11 | D2-4 | 50 | E-2 | Tol/IPA | 4.5 | 8.3 | 15 |
| Example 2-12 | D2-5 | 25 | E-3 | MEK | 1.8 | 3.1 | 16 |
| Example 2-13 | D2-6 | 60 | Polysol AX-590 | water | 1.8 | 3.1 | 18 |

TABLE 2-3-continued

| | Thermally conductive resin composite (G) | | | | Thermally conductive member (H) | Thermally conductive member (I) | |
| --- | --- | --- | --- | --- | --- | --- | --- |
| | Aggregates (D) | | Binder | | Thermal | Thermal | |
| | | Content (vol %) | resin (E) | Solvent (F) | conductivity (W/mK) | conductivity (W/mK) | Adhesiveness (N/cm) |
| Example 2-14 | D2-7 | 65 | Vylon UR6100 | Tol | 2.8 | 6.5 | 16 |
| Comparative Ex. 2-7 | Non-aggregates AO-502 | 50 | E-1 | Tol/IPA | 0.5 | 0.8 | 15 |
| Comparative Ex. 2-8 | Non-aggregates CB-A20S | 50 | E-1 | Tol/IPA | 0.4 | 0.7 | 15 |
| Comparative Ex. 2-9 | D'2-3 | 60 | E-1 | Tol/IPA | 0.3 | 0.4 | 15 |
| Comparative Ex. 2-10 | D'2-4 | 60 | E-1 | Tol/IPA | 0.2 | 0.4 | 2 |
| Comparative Ex. 2-11 | D'2-5 | 60 | E-2 | Tol/IPA | 0.7 | 0.9 | 1 |

TABLE 3-1

| | | Mixed compositions | | | | |
| --- | --- | --- | --- | --- | --- | --- |
| | | Thermally conductive particles (A) | | | Organic binding agent (B) | |
| | | | Average primary particle diameter (μm) | Roundness | Solid content of (B) based on 100 pts. mass of (A) (pts. mass) | Solvent (C) |
| Example 3-1 | D3-1 | AO-502 (alumina) | 1 | 0.99 | CMC Daicel 1240 | 5 | $H_2O$ |
| Example 3-2 | D3-2 | CB-P02 | 2 | 0.98 | poly (allylamine) | 2 | $H_2O$ |
| Example 3-3 | D3-3 | AO-509 (alumina) | 10 | 0.99 | NL-05 | 0.5 | $H_2O$ |
| Example 3-4 | D3-4 | H-grade (aluminium nitride) | 1 | 0.97 | Z-100 | 2 | $H_2O$ |
| Example 3-5 | D3-5 | CB-P05 (alumina) | 5 | 0.99 | polyacrylic acid | 10 | $H_2O$ |
| Example 3-6 | D3-6 | AO-502 (alumina) | 1 | 0.99 | Epicoat 1010 | 2 | Tol |
| Example 3-7 | D3-7 | AO-502 (alumina) | 1 | 0.99 | CMC Daicel 1240 | 5 | $H_2O$ |
| Comparative Ex. 3-1 | D'3-1 | CB-A20S (alumina) | 20 | 0.98 | CMC Daicel 1240 | 2 | $H_2O$ |
| Comparative Ex. 3-2 | D'3-2 | AO-502 (alumina) | 1 | 0.99 | — | 0 | $H_2O$ |
| Comparative Ex. 3-3 | D'3-3 | AO-502 (alumina) | 1 | 0.99 | CMC Daicel 1240 | 50 | $H_2O$ |
| Comparative Ex. 3-4 | D'3-4 | AO-502 (alumina) | 1 | 0.99 | KBM-04 | 2 | $H_2O$ |
| Comparative Ex. 3-5 | D'3-5 | AO-502 (alumina) | 1 | 0.99 | KBM-04 | 2 | $H_2O$ |
| Comparative Ex. 3-6 | D'3-6 | AL-33 (alumina) | 12 | 0.9 | Vylon UR-1400 | 2 | Tol |

TABLE 3-2

| | | Properties | | |
| --- | --- | --- | --- | --- |
| | | Average particle diameter (μm) | Average compressive force (mN) | Tolerance against disintegration (Maintaining rate of average particle diameter after shaking test (%)) |
| Example 3-1 | D3-1 | 10 | 3.2 | 98 |
| Example 3-2 | D3-2 | 15 | 0.3 | 93 |
| Example 3-3 | D3-3 | 40 | 1 | 92 |
| Example 3-4 | D3-4 | 15 | 0.7 | 92 |
| Example 3-5 | D3-5 | 30 | 2 | 95 |
| Example 3-6 | D3-6 | 20 | 0.4 | 93 |
| Example 3-7 | D3-7 | 100 | 3 | 90 |
| Comparative Ex. 3-1 | D'3-1 | No aggregates could be formed. | | — |

TABLE 3-2-continued

| | | Properties | | |
|---|---|---|---|---|
| | | Average particle diameter (μm) | Average compressive force (mN) | Tolerance against disintegration (Maintaining rate of average particle diameter after shaking test (%)) |
| Comparative Ex. 3-2 | D'3-2 | No aggregates could be formed. | | — |
| Comparative Ex. 3-3 | D'3-3 | 20 | 0.8 | 12 |
| Comparative Ex. 3-4 | D'3-4 | 15 | 42 | 75 |
| Comparative Ex. 3-5 | D'3-5 | 15 | 200 | 98 |
| Comparative Ex. 3-6 | D'3-6 | No aggregates could be formed. | | — |

TABLE 3-3

| | | Thermally conductive resin composite (G) | | | | |
|---|---|---|---|---|---|---|
| | Aggregates (D) | | | Binder resin (E) | | Solvent |
| | | Functional group of binding agent (B) | Content (vol %) | | Functional group | (F) |
| Example 3-8 | D3-1 | carboxyl group/ hydroxyl group | 50 | E-1 | carboxyl group | Tol/IPA |
| Example 3-9 | D3-2 | amino group | 70 | E-1 | carboxyl group | Tol/IPA |
| Example 3-10 | D3-3 | hydroxyl group | 40 | E-2 | carboxyl group | Tol/IPA |
| Example 3-11 | D3-4 | acetoacetyl group/ hydroxyl group | 50 | E-3 | carboxyl group | MEK |
| Example 3-12 | D3-5 | carboxyl group | 25 | YX-4000H | epoxy group | Tol |
| Example 3-13 | D3-6 | epoxy group | 60 | Polysol AX-590 | acetyl group | water |
| Example 3-14 | D3-7 | carboxyl group/ hydroxyl group | 65 | Vylon UR6100 | hydroxyl group | Tol |
| Comparative Ex. 3-7 | Non-aggregates | AO-502 | 50 | E-1 | carboxyl groupp | Tol/IPA |
| Comparative Ex. 3-8 | Non-aggregates | CB-A20S | 50 | E-1 | carboxyl group | Tol/IPA |
| Comparative Ex. 3-9 | D'3-3 | carboxyl group | 60 | E-1 | carboxyl group | Tol/IPA |
| Comparative Ex. 3-10 | D'3-4 | methoxysilyl group | 60 | E-1 | carboxyl group | Tol/IPA |
| Comparative Ex. 3-11 | D'3-5 | methoxysilyl group | 60 | E-2 | carboxyl group | Tol/IPA |

TABLE 3-4

| | Thermally conductive member (H) | Thermally conductive member (I) | |
|---|---|---|---|
| | Thermal conductivity (W/mK) | Thermal conductivity (W/mK) | Heat resistance |
| Example 3-8 | 3 | 7 | ◯◯ |
| Example 3-9 | 2.8 | 5.5 | ◯◯ |
| Example 3-10 | 2.5 | 3.5 | ◯◯ |
| Example 3-11 | 6 | 10 | ◯◯ |
| Example 3-12 | 2.3 | 3 | ◯◯ |
| Example 3-13 | 2 | 4.2 | ◯◯ |
| Example 3-14 | 2.7 | 5 | ◯◯ |
| Comparative Ex. 3-7 | 0.5 | 0.8 | X |
| Comparative Ex. 3-8 | 0.4 | 0.7 | ◯ |
| Comparative Ex. 3-9 | 0.3 | 0.4 | ◯◯ |
| Comparative Ex. 3-10 | 0.2 | 0.4 | X |
| Comparative Ex. 3-11 | 0.7 | 0.9 | X |

TABLE 4-1

| | | Mixed compositions | | | | | |
|---|---|---|---|---|---|---|---|
| | | Thermally conductive particles (A) | | Organic binding agent (B) | | Thermally conductive fibers (P) | |
| | | Average primary particle diameter (μm) | Roundness | | Solid content of (B) based on 100 pts. mass of (A) (pts. mass) | | Solid content of (P) based on 100 pts. mass of (A) (pts. mass) | Solvent (C) |
| Example 4-1 | D4-1 | AO-502 (alumina) | 1 | 0.99 | poly (vinyl alcohol) | 5 | P1 | 0.1 | H₂O/IPA |
| Example 4-2 | D4-2 | CB-P02 (alumina) | 2 | 0.98 | poly (vinyl alcohol) | 2 | P1 | 0.2 | H₂O/IPA |
| Example 4-3 | D4-3 | AO-509 (alumina) | 10 | 0.99 | poly (allylamine) | 0.5 | P2 | 1 | H₂O/IPA |
| Example 4-4 | D4-4 | H-grade (aluminium nitride) | 1 | 0.97 | poly (N-isopropylacrylamide) | 2 | P2 | 0.2 | H₂O/IPA |
| Example 4-5 | D4-5 | CB-P05 (alumina) | 5 | 0.99 | poly (vinyl pyrrolidone) | 10 | P3 | 0.4 | H₂O |
| Example 4-6 | D4-6 | AO-502 (alumina) | 1 | 0.99 | polyurethane resin | 2 | P4 | 2 | Tol |
| Example 4-7 | D4-7 | H-grade (aluminium nitride) | 1 | 0.97 | poly (N-isopropylacrylamide) | 2 | P4 | 40 | H₂O |
| Comparative Ex. 4-1 | D'4-1 | CB-A20S (alumina) | 20 | 0.98 | poly (vinyl alcohol) | 2 | P1 | 0.2 | H₂O/IPA |
| Comparative Ex. 4-2 | D'4-2 | CB-P02 (alumina) | 2 | 0.98 | — | 0 | P1 | 0.2 | H₂O/IPA |
| Comparative Ex. 4-3 | D'4-3 | AO-509 (alumina) | 10 | 0.99 | poly (allylamine) | 50 | P2 | 1 | H₂O/IPA |
| Comparative Ex. 4-4 | D'4-4 | AO-509 (alumina) | 10 | 0.99 | silane coupling agent | 2 | P2 | 1 | H₂O/IPA |
| Comparative Ex. 4-5 | D'4-5 | AO-509 (alumina) | 10 | 0.99 | silane coupling agent | 2 | P2 | 1 | H₂O/IPA |
| Comparative Ex. 4-6 | D'4-6 | AL-33 (alumina) | 12 | 0.9 | epoxy resin | 2 | P4 | 5 | Tol |

TABLE 4-2

| | | Properties | | |
|---|---|---|---|---|
| | | Average particle diameter (μm) | Average compressive force (mN) | Tolerance against disintegration (Maintaining rate of average particle diameter after shaking test (%)) |
| Example 4-1 | D4-1 | 10 | 0.7 | 96 |
| Example 4-2 | D4-2 | 20 | 0.6 | 94 |
| Example 4-3 | D4-3 | 45 | 0.5 | 93 |
| Example 4-4 | D4-4 | 15 | 2 | 92 |
| Example 4-5 | D4-5 | 30 | 1 | 92 |
| Example 4-6 | D4-6 | 20 | 0.5 | 93 |
| Example 4-7 | D4-7 | 40 | 3 | 94 |
| Comparative Ex. 4-1 | D'4-1 | No aggregates could be formed. | | — |
| Comparative Ex. 4-2 | D'4-2 | No aggregates could be formed. | | — |
| Comparative Ex. 4-3 | D'4-3 | 20 | 1 | 15 |
| Comparative Ex. 4-4 | D'4-4 | 25 | 60 | 78 |
| Comparative Ex. 4-5 | D'4-5 | 23 | 176 | 96 |
| Comparative Ex. 4-6 | D'4-6 | No aggregates could be formed. | | — |

TABLE 4-3

| | Thermally conductive resin composite (G) | | | | Thermally conductive member (H) | Thermally conductive member (I) |
|---|---|---|---|---|---|---|
| | Aggregates (D) | | Binder | | Thermal | Thermal |
| | | Content (vol %) | resin (E) | Solvent (F) | conductivity (W/mK) | conductivity (W/mK) |
| Example 4-8 | D4-1 | 50 | E-1 | Tol/IPA | 3.5 | 6.7 |
| Example 4-9 | D4-2 | 70 | E-1 | Tol/IPA | 3.2 | 6 |
| Example 4-10 | D4-3 | 40 | E-1 | Tol/IPA | 4 | 7.2 |
| Example 4-11 | D4-4 | 50 | E-2 | Tol/IPA | 4.7 | 8.3 |
| Example 4-12 | D4-5 | 50 | E-3 | MEK | 2 | 3.1 |
| Example 4-13 | D4-6 | 60 | Polysol AX-590 | water | 1.8 | 3 |
| Example 4-14 | D4-7 | 55 | E-3 | MEK | 5.4 | 6.3 |
| Comparative Ex. 4-7 | Non-aggregates AO-502 | 50 | E-1 | Tol/IPA | 0.5 | 0.8 |
| Comparative Ex. 4-8 | Non-aggregates CB-A20S | 50 | E-1 | Tol/IPA | 0.4 | 0.7 |
| Comparative Ex. 4-9 | D'4-3 | 60 | E-1 | Tol/IPA | 0.5 | 0.7 |
| Comparative Ex. 4-10 | D'4-4 | 60 | E-1 | Tol/IPA | 0.4 | 0.5 |
| Comparative Ex. 4-11 | D'4-5 | 60 | E-2 | Tol/IPA | 0.7 | 1 |

TABLE 5-1

| | | Mixed compositions | | | | | | |
|---|---|---|---|---|---|---|---|---|
| | | Thermally conductive particles (A) | | | Organic binding agent (B) | | Carbon material | |
| | | | Average primary particle diameter (μm) | Roundness | | Amount of (B) based on 100 pts. mass of (A) (pts. mass) | | Amount of (J) based on 100 pts. mass of (A) (pts. mass) | Solvent (C) |
| Example 5-1 | D5-1 | AO-502 (alumina) | 1 | 0.99 | NL-05 | 5 | LB-200 | 5 | H$_2$O |
| Example 5-2 | D5-2 | CB-P02 (alumina) | 2 | 0.98 | NL-05 | 2 | LB-200 | 2 | H$_2$O |
| Example 5-3 | D5-3 | AO-509 (alumina) | 10 | 0.99 | NL-05 | 0.5 | LB-200 | 0.5 | H$_2$O |
| Example 5-4 | D5-4 | AO-502/ AO-509 (alumina) | 1/10 (*1) | 0.99 | NL-05 | 2 | LB-200 | 2 | H$_2$O |
| Example 5-5 | D5-5 | H-grade (aluminium nitride) | 1 | 0.97 | NL-05 | 2 | LB-200 | 5 | H$_2$O |
| Example 5-6 | D5-6 | CB-P05 (alumina) | 5 | 0.99 | K-85W | 10 | LB-200 | 5 | H$_2$O |
| Example 5-7 | D5-7 | AO-502 (alumina) | 1 | 0.99 | NL-05 | 30 | LB-200 | 5 | H$_2$O |
| Example 5-8 | D5-8 | ASFP-20 (alumina) | 0.3 | 0.99 | NL-05 | 2 | scale-like graphene | 1 | H$_2$O |
| Example 5-9 | D5-9 | AO-502 (alumina) | 1 | 0.99 | Vylon 200 | 2 | AMC | 3 | Tol |

(*1): AO-502: 1 μm, AO-509: 10 μm

TABLE 5-2

| | | Properties | | |
|---|---|---|---|---|
| | | Average particle diameter (μm) | Average compressive force (mN) | Tolerance against disintegration (Maintaining rate of average particle diameter after shaking test (%)) |
| Example 5-1 | D5-1 | 10 | 0.7 | 98 |
| Example 5-2 | D5-2 | 20 | 0.6 | 94 |
| Example 5-3 | D5-3 | 50 | 4.1 | 91 |
| Example 5-4 | D5-4 | 30 | 1.1 | 96 |

TABLE 5-2-continued

| | | Properties | | |
|---|---|---|---|---|
| | | Average particle diameter (μm) | Average compressive force (mN) | Tolerance against disintegration (Maintaining rate of average particle diameter after shaking test (%)) |
| Example 5-5 | D5-5 | 15 | 1.1 | 98 |
| Example 5-6 | D5-6 | 40 | 2.1 | 93 |
| Example 5-7 | D5-7 | 20 | 0.8 | 99 |
| Example 5-8 | D5-8 | 5 | 0.3 | 99 |
| Example 5-9 | D5-9 | 20 | 0.8 | 94 |

TABLE 5-3

| | | Thermally conductive resin composite (G) | | | | | Thermally conductive member (H), (I) | |
|---|---|---|---|---|---|---|---|---|
| | | Aggregates (D) | | Binder | | | | Thermal |
| | | Content (vol %) | Other particles | resin (E) | Solvent (F) | Pressurization | | conductivity (W/mK) |
| Example 5-101 | D5-1 | 50 | — | E-1 | Tol/IPA | Not applied | H5-1 | 5 |
| Example 5-102 | D5-1 | 50 | — | E-1 | Tol/IPA | Applied | I5-2 | 8.5 |
| Example 5-103 | D5-2 | 70 | — | E-1 | Tol/IPA | Applied | I5-3 | 11 |
| Example 5-104 | D5-3 | 40 | — | E-1 | Tol/IPA | Applied | I5-4 | 7 |
| Example 5-105 | D5-4 | 50 | — | E-2 | Tol/IPA | Applied | I5-5 | 8.5 |
| Example 5-106 | D5-8 | 50 | — | E-1 | Tol/IPA | Applied | I5-6 | 7 |
| Example 5-107 | D5-1 | 55 | CB-P20 | E-2 | Tol/IPA | Applied | I5-7 | 8.5 |
| Example 5-108 | D5-2 | 60 | AO-509 | E-1 | Tol/IPA | Applied | I5-8 | 8.5 |
| Example 5-109 | D5-2 | 35 | — | E-3 | Tol | Not applied | H5-9 | 4 |
| Example 5-110 | D5-5 | 25 | — | PSJ Polystyrene 679 | — | Applied | I5-10 | 12 |
| Example 5-111 | D5-6 | 65 | — | Vylon UR6100 | Tol | Applied | I5-11 | 8.5 |
| Example 5-112 | D5-7 | 80 | — | ethylene-methacrylic acid copolymer | — | Applied | I5-12 | 8 |
| Example 5-113 | D5-9 | 40 | — | Hizox 2100J | — | Applied | I5-13 | 7 |

TABLE 6-1

| | | Mixed compositions | | | | |
|---|---|---|---|---|---|---|
| | | Thermally conductive particles (A) | | | Organic binding agent (B) | |
| | | | Average primary particle diameter (μm) | Roundness | Amount of (B) based on 100 pts. mass of (A) (pts. mass) | Solvent (C) |
| Example 6-1 | D6-1 | NX-1 (scale-like boron nitride) | 0.7 | — | NL-05 | 1 | H$_2$O |

TABLE 6-2

| | | Properties | | |
|---|---|---|---|---|
| | | Average particle diameter (μm) | Average compressive force (mN) | Tolerance against disintegration (Maintaining rate of average particle diameter after shaking test (%)) |
| Example 6-1 | D6-1 | 15 | 3.5 | 85 |

TABLE 6-3

| | | Thermally conductive resin composite (G) | | | | | Thermally conductive member (H), (I) | |
|---|---|---|---|---|---|---|---|---|
| | | Aggregates (D) | | Binder | | | | Thermal |
| | | Content (vol %) | Other particles | resin (E) | Solvent (F) | Pressurization | | conductivity (W/mK) |
| Example 6-101 | D6-1 | 50 | — | E-1 | Tol/IPA | Applied | I6-1 | 3.5 |

This application is based upon and claims the benefit of priorities from Japanese patent applications No. 2012-115821, filed on May 21, 2012, No. 2012-146424, filed on Jun. 29, 2012, No. 2012-157086, filed on Jul. 13, 2012, No. 2013-036098, filed on Feb. 26, 2013, and No. 2013-080059, filed on Apr. 8, 2013, the disclosures of which are incorporated herein in their entirety by reference.

INDUSTRIAL APPLICABILITY

Easily deformable aggregates and thermally conductive resin compositions including them according to the present invention can be suitably used for thermally conductive members such as thermally conductive adhesive sheets.

The invention claimed is:

1. A thermally-conductive, electrically-insulating member (H) manufactured by a manufacturing method, the thermally-conductive electrically-insulating member (H) comprising a thermally conductive layer comprising:
   (1) 20 to 90 vol. % of an easily deformable aggregate (D) comprising:
      (i) 100 pts·mass of thermally-conductive, electrically-insulating particles (A) having an average primary particle diameter of 0.1 to 10 μm; and
      (ii) 0.1 to 30 pts·mass of an organic binding agent (B) not including a silane coupling agent,
      wherein the easily deformable aggregate (D) has an average particle diameter of 2 to 100 μm, and an average compressive force required for a 10% compressive deformation rate is 5 mN or lower; and
   (2) 10 to 80 vol. % of a binder resin (E),
   the manufacturing method comprising:
   a step of obtaining a slurry comprising 100 pts·mass of thermally-conductive, electrically-insulating particles (A) having an average primary particle diameter of 0.1 to 10 μm, 0.1 to 30 pts·mass of an organic binding agent (B), and a solvent (C) that dissolves the agent (B);
   a step of removing the solvent (C) from the obtained slurry to obtain an easily deformable aggregate (D);
   a step of preparing a thermally conductive resin composite (G) comprising an easily deformable aggregates (D), a binder resin (E); and a solvent (F) that dissolves the binder resin (E);
   a step of applying the thermally conductive resin composition (G) on a base material and thereby forming a coating; and
   a step of removing the solvent (F) from the coating and thereby forming a thermally conductive layer.

2. The thermally-conductive, electrically-insulating member (H) according to claim 1, wherein a ratio of an average particle diameter of the easily deformable aggregates (D) to a thickness of the thermally conductive layer is equal to or greater than 20%.

3. A thermally-conductive, electrically-insulating member (I) formed by applying a pressure on a thermally-conductive, electrically-insulating member (H) according to claim 1.

4. A thermally conductive adhesive sheet comprising a thermally conductive member (H) according to claim 1, wherein
   the thermally conductive adhesive sheet further comprises a release film disposed on at least one surface thereof.

5. A thermally-conductive adhesive sheet comprising a thermally-conductive, electrically-insulating member (I) according to claim 3, wherein the thermally-conductive adhesive sheet further comprises a release film disposed on at least one surface thereof.

* * * * *